(12) United States Patent
Ayabe et al.

(10) Patent No.: US 7,399,108 B2
(45) Date of Patent: Jul. 15, 2008

(54) LIGHT EMITTING SOURCE AND A LIGHT EMITTING SOURCE ARRAY

(75) Inventors: Takahiro Ayabe, Otsu (JP); Akira Matsui, Joyo (JP); Kenji Homma, Kyoto (JP); Hironobu Kiyomoto, Nara (JP)

(73) Assignee: Omron Corporation, Kyoto (JP)

( * ) Notice: Subject to any disclaimer, the term of this patent is extended or adjusted under 35 U.S.C. 154(b) by 290 days.

(21) Appl. No.: 11/252,518

(22) Filed: Oct. 18, 2005

(65) Prior Publication Data

US 2006/0083023 A1    Apr. 20, 2006

(30) Foreign Application Priority Data

Oct. 19, 2004 (JP) ............................. 2004-304975
Dec. 28, 2004 (JP) ............................. 2004-379520

(51) Int. Cl.
*F21V 7/04* (2006.01)

(52) U.S. Cl. .................. 362/607; 362/612; 362/613
(58) Field of Classification Search ................. 362/800, 362/606, 612, 620, 339, 330, 328, 333, 334
See application file for complete search history.

(56) References Cited

U.S. PATENT DOCUMENTS 7,090,389 B2 *   8/2006   Parker et al. ................. 362/627
7,226,196 B2 *   6/2007   Parker et al. ................. 362/606

2004/0096182 A1   5/2004   Yamashita et al.

FOREIGN PATENT DOCUMENTS

| EP | 1 235 281 A1 | 8/2002 |
|---|---|---|
| EP | 1 427 029 A2 | 6/2004 |
| JP | 2001351424 | 12/2001 |

OTHER PUBLICATIONS

European Search Report for Application No. 05109746.7-1234 dated Jun. 27, 2007, 8 pages.
Patent Abstracts of Japan 2001-351424 dated Dec. 21, 2001, 1 page.
Partial European Search Report—Feb. 6, 2006.

* cited by examiner

*Primary Examiner*—Anabel M Ton
(74) *Attorney, Agent, or Firm*—Osha Liang LLP

(57) ABSTRACT

On the rear surface of a transparent molded unit is provided a reflecting member. In a central part of the molded unit are encapsulated light emitting devices. In the vicinity of the central part of the reflecting member is formed a reflecting area that is angularly inclined to the rear surface as it moves to the outer circumferential direction. A toric channel is provided on a light irradiation surface of the molded unit, and a slope total reflection area is provided in its inner circumferential side. Light emanating from the light emitting devices is reflected at the slope total reflection area, and further reflected at the direct output area. Then, after being further reflected at the reflecting area of the reflecting member, the light is guided to the outer circumferential end of the reflecting member, and is outputted forward from the total reflection area by being reflected at the outer circumferential end of the reflecting member.

22 Claims, 40 Drawing Sheets

Fig. 7
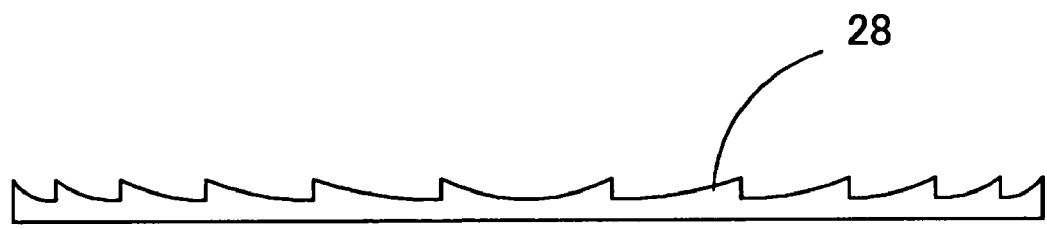
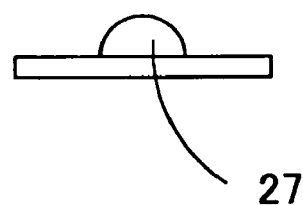

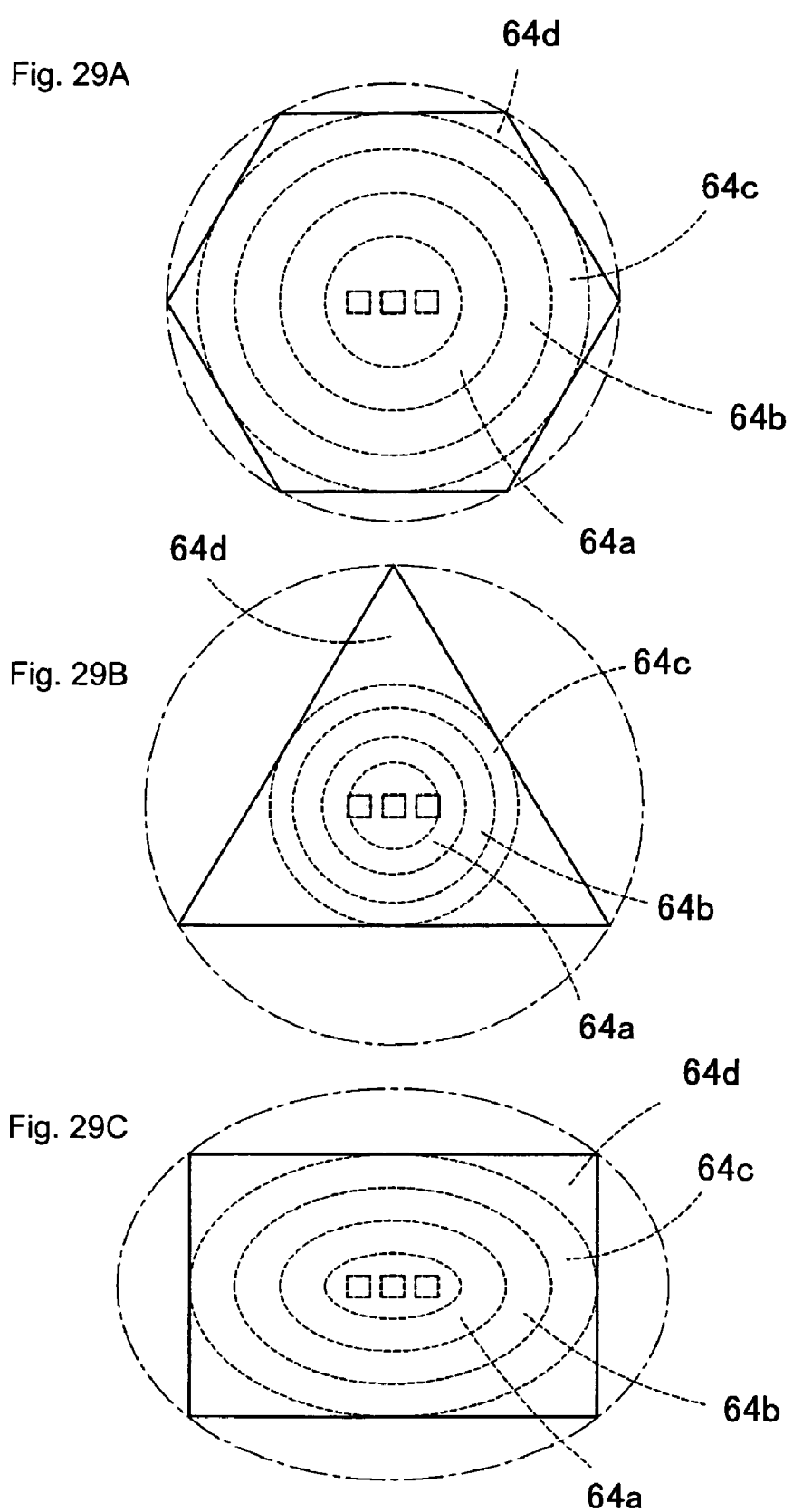

LIGHT EMITTING SOURCE AND A LIGHT EMITTING SOURCE ARRAY

FIELD OF THE INVENTION

The present invention relates to a light emitting source and a light emitting source array. The invention further relates to a lighting system or a liquid crystal display system, etc. that uses a light emitting source array.

DESCRIPTION OF THE RELATED ART

In recent years, as a representative of flat-screen televisions, a liquid crystal display television (LCD television) has gradually come into widespread use. A liquid crystal panel used in LCD televisions generates an image by transmitting or shielding light for every picture element. However, as the liquid crystal panel is not capable of emitting light by itself, it needs to have a backlight (surface light source system). As more of LCD televisions being manufactured are wide-screen type, a backlight for LCD televisions is required to have a large area luminescent surface, and high brightness that is uniform a cross the screen. In the following, we describe a conventional liquid crystal display or a backlight that is use for LCD televisions.

FIRST CONVENTIONAL EXAMPLE

FIG. 1 shows a schematic sectional view illustrating the structure of a conventional liquid crystal display. This liquid crystal display 11 is configured with a backlight 13 positioned on the rear of a liquid crystal panel 12. In the backlight 13, a light diffusing film 15, a prism sheet 16, and a brightness enhancing film 17 are placed on the front face of a plurality of parallel-arranged cold cathode tubes 14, and the sides and back face of the cold cathode tube 14 are covered by a reflective film 18. Thus, this liquid crystal display 11 generates a desired image by spatially modulating incident light, wherein the backlight 13 illuminates a whole area of the liquid crystal panel 12 from behind, and controls respective picture elements of the liquid crystal panel 12 to transmit or shield light.

Since such backlight 13 uses the cold cathode tube 14 as a light source, the backlight can be made thinner. However, there was a disadvantage that when the backlight is used in a color liquid crystal display, three primary colors appear dull, and thus, color reproducibility is poor.

SECOND CONVENTIONAL EXAMPLE

FIG. 2 shows a schematic sectional view illustrating a conventional liquid crystal display 19 of another structure. This liquid crystal display uses cannonball type LEDs, 21R, 21G, and 21B that have luminescent colors of red, green and blue as a light source of the backlight 20. In this backlight 20, LEDS 21R, 21G and 21B of three colors of red, green and blue form one triplet, and a plurality of triplets of LEDs are arranged at appropriate intervals.

In such liquid crystal display 19, not only light of respective colors emitted from respective LEDs 21R, 21G, and 21B are mixed by a space between a surface on which LEDs 21R, 21G and 21B are arranged and the prism sheet 16, and by the light diffusing film 15, but also its light intensity and mixed color are uniformed. The light transmitted through the prism sheet 16 transmits through the brightness enhancing film 17 and illuminates the back face of the liquid crystal panel 12.

With this backlight 20, color reproducibility of the liquid crystal display 19 can be improved since the LEDs 21R, 21G and 21B are used as a light source. In particular, the merit of the good color reproducibility is considered to exhibit superiority of the backlight using LEDs of primaries, when compared with a cold cathode tube or white light LED. Hence, it is expected that backlights with an LCD will be mainstream gradually, as the backlight LCD televisions become high-definition.

At the same time, this backlight 20 suffered from a disadvantage: since three colors are mixed by LEDs 21R, 21G, and 21B of the three colors, the space 24 between the surface on which the LEDs 21R, 21G and 21B are arranged and the prism sheet 16 and for not only mixing the light of three colors but also equalizing the light intensity and the color mixing condition (this space shall be hereinafter referred to an equalizing space) 24 becomes thicker, thus increasing thickness of the backlight 20.

For example, suppose the case in which, as shown in FIG. 3, by using three cannonball type LEDs, 21R, 21G, and 21B that have an angle of beam spread of 40 degrees, light radiated from these LEDs 21R, 21G, and 21B is uniformly mixed in a circular area with a diameter D=30 mm, and uniform light intensity is obtained. In this specification, we shall mean by uniform light intensity that the fluctuations are within ±10%, and we call as a target surface a surface on which we attempt to obtain uniform light irradiation surface (uniform illuminance) (for example, the position that is a back face of the liquid crystal panel 12). In this case, to uniformly mix light of three colors on the target surface 22 and illuminate the target surface 22 with uniform light intensity (illuminance), the equalizing space 24 between the surface on which the LEDs 21R, 21G, and 21B are arranged and the prism sheet 16 needs to be L1=75 mm, and a distance between the prism sheet 16 and the target surface 22 should be L2=21 mm. Thus, if we define a distance from the back face of the reflective film 18 to the target surface 22 as thickness of the backlight, and assume that total thickness of a circuit board and the reflective film 18 is L3=4 mm, then thickness of the backlight 20 will be L1+L2+L3=100 mm.

As the backlight 13 as in the conventional example 1 that uses the cold cathode tube has thickness of approximately 30 mm, thickness of the backlight 20 used in the conventional example 2 will be considerable.

FIG. 4A shows a triplet of LEDs 21R, 21G, and 21B shown in FIG. 3 arranged at intervals of 30 mm, and FIG. 4B shows a distribution of light intensity (illuminance) of the target surface at the time. The target surface 22 shown in solid line in FIG. 4A represents the surface spaced at a position of L1+L2=96 mm from the surface on which the LEDs 21R, 21G, and 21B are arranged. The target surface 23 shown in broken line in FIG. 4A represents the target surface that is brought much closer to the LEDs 21R, 21G, and 21B than the target surface 22 in solid line. In the case of the target surface 22 shown in solid line, light uniformly spreads in the area with the diameter of 30 mm on the target surface 22, as illustrated in FIG. 3. Thus, on the target surface 22, uniformly distributed light intensity can be achieved across the whole area, as shown in solid line in FIG. 4B. Correspondingly, at the position of a target surface 23 as shown in broken line in FIG. 4A, the light intensity widely fluctuates and cannot be uniform, as illustrated by the light intensity distribution in FIG. 4B.

In the backlight 20 as used in the conventional example 2, we would have to increase the number of LEDs 21R, 21G, and 21B to produce increased density of the arrangement as shown in FIGS. 5A and B if we attempted to bring the target surface 23 close to the LEDs 21R, 21G, and 21B and equalize the light intensity on the target surface 23. Then, in this case, there was a problem that a number of LEDs 21R, 21G, and 21B were required, which is not only costly but also increases power consumption. In addition, although it seems that the number of LEDs could be decreased if LEDs of a wider angle of beam spread were used, even use of LEDs with the wider angle of beam spread could hardly decrease the number of LEDs because luminous efficiency was poor.

As such, in the conventional example 2, a backlight that is thinner, could achieve uniform distribution of light intensity and color mixing, and had low power consumption could not be made, and thus any of the above (features) must be given up.

CONVENTIONAL EXAMPLE 3

FIG. 6 shows a schematic cross sectional view illustrating the structure of a conventional backlight of yet another structure. In this backlight 25, a plurality of light emitting sources 27 are incorporated in the board 26, optical elements 28 in the form of Fresnel concave lens as shown in FIG. 7 are arranged in front of the respective light emitting sources 27, and an optical waveguide 29 is positioned in front of these as a whole. Then, the backlight is configured to diffuse light emitted from the LED chips of respective colors within respective light emitting sources 27 with the optical elements 28 by spreading it over the whole area of the optical waveguide 29, and to have the light transmit through the optical waveguide 29, thus emitting onto the liquid crystal panel, etc. the light whose viewing angle is narrowed.

Even in the backlight 25 of such structure, use of LED chips of three primary colors can make color reproducibility better when it is used for a liquid crystal display.

However, even with such backlight 25, uniformly mixing light of respective colors emanating from the light emitting sources 27 would be difficult. Thus, light of respective colors must be uniformly mixed by the space between the optical elements 28 and the optical waveguide 29, and in doing so, sufficient optical path length in the equalizing space should be kept, which considerably increases thickness of the space between the optical element 28 and the optical waveguide 29.

To be specific, in this backlight 25, on the target surface 23 as shown in FIG. 8A that is close to the light emitting source 27, light intensity cannot be uniform as shown in broken line in FIG. 8B. Thus, if we attempted to achieve the uniform light intensity distribution as shown in the solid line in FIG. 8B, the target surface 22 should be sufficiently spaced from the light emitting source 27, as shown by the target surface 22 in solid line in FIG. 8A. Then, in the backlight 25, it had thickness of approximately 70 mm and it was difficult to make it thinner. In addition, in this backlight 25, if we attempted to achieve uniform brightness distribution on the target surface, the number of the light emitting sources 27 would increase.

SUMMARY OF THE INVENTION

As described above, in the conventional backlights, the backlight using LEDs of three colors, namely, red, green, and blue were good in color reproducibility. However, in the backlight using the LEDs of three colors, the equalizing space expanded, which forced us to give up any of thickness, uniformity, and power consumption, and did not allow us to create a backlight that is thinner, and has uniform light intensity distribution and color mixing as well as low power consumption.

One or more embodiments of the present invention lies (lie) in provision of a light emitting source array using light emitting device, such as LED, etc. that has uniform light intensity (illuminance) on an illuminated surface (when a plurality of light emitting devices are included, in particular, color mixing should be uniform), is thinner, and has low power consumption. It further lies in provision of a light emitting source for use in the light emitting source array, a lighting system or a liquid crystal display system that is used in the light emitting source array.

In accordance with one aspect of the present invention, a light emitting source comprises a reflecting member for reflecting light, a light guiding unit arranged on the light reflecting surface of the reflecting member, and a light emitting device for emitting light to the light guiding unit, wherein it is characterized in that the light emitting device is arranged on the optical axis of the reflecting member, the light guiding unit has a light irradiation surface that externally emits light outputted from the light emitting device and light of the light emitting device that is reflected by the reflecting member, wherein a part of the light irradiation surface is formed in such a shape that light emitted from the light emitting device at a predetermined angle from the optical axis is total reflected and oriented in the direction of the reflecting member, and wherein the reflecting member has a backward slope area, in part, that reflects the light total reflected in a part of light irradiation surface of the light guiding unit in the direction progressively away from the optical axis, and orients it to the periphery of the light guiding unit spaced from the optical axis.

In this light emitting source, since light outputted from the light emitting device at a predetermined angle with the optical axis can be total reflected in a part of the light irradiation surface and oriented in the direction of the reflecting member, and this light can be reflected to the direction being progressively away from the backward slope area provided on the reflecting member, and oriented toward the periphery of the light guiding unit away from the optical axis, light outputted at a predetermined output angle from light emitting device can be outputted from the periphery of the light emitting source. Thus, the light emitting source does not darken easily in the periphery of the light emitting source and brightness of the light emitting source can be further equalized. In addition, because brightness distribution of the light emitting source is equalized, the light emitting source can be made thinner. Furthermore, if light emitting devices with luminous colors of red, blue, and green were used as a light emitting source, they would be better in color reproducibility and could uniformly mix colors even though they had decreased thickness when they are used in the liquid crystal display system.

In an embodiment of the present invention, as the backward slope area of the reflecting member is oriented in the peripheral direction, it is angularly inclined to the opposite side to the light irradiation surface of the light guiding unit. Provision of the backward slope surface having such inclination allows the light at predetermined output angle that was total reflected on the part of the light irradiation surface of the light guiding unit to be reflected toward the periphery of the light guiding unit.

An embodiment of the present invention is arranged to guide the light reflected at the backward slope area to the periphery of the reflecting member by total reflecting it at the light irradiation surface of said light guiding unit. In the embodiment, as the light that was reflected at the backward slope area is guided to the periphery of the reflecting member after being total reflected at the light irradiation surface of the light guiding unit, the degree of freedom of the optical path of light will be high and degree of freedom in designing of the reflecting member will be high.

An embodiment of the present invention is arranged to guide the light reflected at the backward slope area directly into the reflecting member. According to such the embodiment, loss of light to be guided to the periphery of the reflecting member could be smaller.

In an embodiment of the present invention, the light emitting device is comprised of more than one light emitting diode having different luminous colors. According to the embodiment, when it is used in a color liquid crystal display system, it can improve color reproducibility of the screen of the liquid crystal display system. In addition, in the present invention, optical path length can be saved within the light guiding unit of the light emitting source, light mixing performance of respective colors outputted from respective light emitting diodes is better, and thickness of the space for equalizing light intensity or color mixing state necessary outside of the light emitting source can be made thinner.

When viewed from a front view, an embodiment of the present invention has a square, rectangular, regular hexagonal or regular triangle outline. With the embodiment, the light emitting sources can be closely arranged, thereby not only producing a light emitting source array of high brightness, but also achieving uniform light emission.

When viewed from a front view, an embodiment of the present invention has a circular or elliptical outline. With the embodiment, a light emitting source array with a space therebetween can be produced, thereby saving power of the light emitting source. In addition, as there is no need of cutting to shape the light emitting sources, manufacturing of the light emitting sources will be facilitated. Furthermore, as there is no corner part in the light emitting sources of such a shape, designing of the light emitting source will be easy.

In accordance with one aspect of the present invention, a light emitting source is characterized in that it comprises a reflecting member for reflecting light, a light guiding unit arranged on the light reflecting surface of the reflecting member, and a light emitting device for emitting light toward the light guiding unit, wherein a light irradiation surface of the light guiding unit has a first region that transmits light emanating from the light emitting device and outputs to the external of the light guiding unit, a second region that orients the light emanating from the light emitting device to the reflecting member by total reflection and transmits the light reflected at the reflecting member and outputs it to the external of the light guiding unit, and a third region whose shape is defined so that it total reflects with the first region the light that made a predetermined angle with the optical axis and was outputted from the light emitting device, orients it to the reflecting member, and outputs the light reflected at the reflecting member to the external of the light guiding unit.

With the light emitting source, the entire light irradiation surface of the light emitting source can be made uniformly luminous, by not only having light from the light emitting device directly outputted from the first region, but also having the light emanating from the light emitting device total reflected at the second region, reflected at the reflecting member, and outputted to the external from the second region. Furthermore, since the light outputted from the light emitting device enters the reflecting member by total reflecting it in the first and third regions and then the light reflected at the reflecting member is outputted to the external, light having a small output angle from the light emitting device and high optical intensity can be outputted. In addition, since the optical path length can be saved in the light guiding unit of the light emitting source, the color mixing performance of respective colors outputted from respective light emitting device will be better when light emitting devices of a plurality of luminous colors are used, and the space for equalizing the light intensity needed in the external of the light emitting source or color mixing state can be smaller.

An embodiment of the present invention is arranged to provide a channel between the first region and the second region on the light irradiation surface of the light guiding unit, form the third region on an inclined side of the inner circumference side of the channel, and total reflect the light outputted from the light emitting device in the third region, then total reflect it in the first region to orient it toward the reflecting member.

An embodiment of the present invention is arranged not only to provide a channel between the first region and the second region on the light irradiation surface of the light guiding unit but also to form a conical depression on the first region, thus forming the third region on the inclined side of the inner circumference side of the channel and on the side of the depression. Then, it total reflects the light outputted from the light emitting source in the third region of the depression, then total reflects it in the first region, and yet total reflects it in the third region of the channel side, so as to guide it to the reflecting member.

An embodiment of the present invention arranges the third region so that the light outputted from the light emitting device at an output angle smaller than a critical angle of the total reflection on the interface of the light guiding unit is total reflected in the third region, and guided to the reflecting member.

In an embodiment of the present invention, the first region protrudes more to the light outputting side than its surrounding are a does, and the peripheral line of the first region is chamfered. With the embodiment, since light outputted from the edge of the first region can be focused on the front, distribution of illuminance on the predetermined target surface can be equalized.

An embodiment of the present invention comprises the first region by curved surfaces. With the embodiment, as light outputted from the entire first region can be focused on the front, distribution of illuminance on the predetermined target surface can be further equalized.

An embodiment of the present invention makes the configuration of the reflecting member so that light outputted from the light irradiation surface after being total reflected at the reflecting member will converge. With the embodiment, as the light outputted from the light emitting source can be focused on the front, distribution of illuminance on the predetermined target surface can be better equalized.

An embodiment of the present invention provides a member for limiting an output angle of light outputted from the light emitting device in the periphery of the light emitting device. With the embodiment, an output angle of light outputted from the light emitting device can be limited, thus preventing light outputted at a large output angle from entering the light emitting source that are adjacently arranged and becoming stray light.

In accordance with one aspect of the present invention, the light emitting source array is characterized in that it is comprised of an arrangement of a plurality of the light emitting devices. With the embodiment, a large light emitting source array of uniform light intensity distribution can be made. Yet, as brightness of respective light emitting devices is equalized, illuminance on a target surface can be equalized even though the target surface is close. Hence, if this light emitting source array is used as a backlight, etc. of a liquid crystal display system, a light emitting source array that has decreased thickness and uniform light intensity distribution can be made. In addition, it can have smaller power consumption than a backlight using cannonball type LEDs. In addition, since respective light emitting sources are modularized as the surface light source in such the light emitting source, no design change to an external optical system such as a diffusing plate, etc. is necessary when size or shape (fitness ratio) is modified, and rearrangement of the light sources should suffice. Thus, it will be a light emitting source array having high degree of freedom in resizing.

In an embodiment of the present invention, as the light emitting sources are closely arranged, brightness of the light emitting source array is high and uniformity of brightness is high.

In an embodiment of the present invention, as the light emitting sources are arranged with a space therebetween, the number of necessary light emitting sources can be smaller, thereby achieving power saving.

In accordance with one aspect of the present invention, in a method of setting optical path length of light to be outputted from the light emitting source comprising a reflecting member for reflecting light, a light guiding unit arranged on the side of the light reflecting surface of the reflecting member, and light emitting devices for outputting light toward the light guiding unit, the method of setting the optical path length of the light outputted from the light emitting source is characterized in that said light emitting devices are arranged on an optical axis of the reflecting member, that a surface of the light guiding unit outputs to the external the light outputted from the light emitting device and the light of the light emitting device reflected at the reflecting member, that a part of the surface of the light guiding unit, after total reflecting the light outputted from the light emitting devices, total reflects it with another part of the surface of the light guiding unit and orients it to the reflecting member, and that shapes of and a positional relationship among the reflecting member, the light guiding unit, and the light emitting device are such defined that the part of the reflecting member reflects the light total reflected by the part of the light irradiation surface to the direction being gradually away from the optical axis and orients it to the periphery of the light guiding unit away from the optical axis.

As we described the light emitting sources of the present invention, with the method of setting optical path, the light emitting sources do not darken easily in the periphery of the light emitting sources, and brightness of the light emitting sources can be further equalized. In addition, as the brightness distribution of the light emitting sources becomes uniform, an equipment with this light emitting source can be made thinner. Furthermore, if more than one element with different luminous colors is used in a light source unit, and when it is used in a liquid crystal display system, color reproducibility can be improved, and color can be mixed uniformly even though thickness is decreased.

In accordance with one aspect of the present invention, in light emitting sources comprising a reflecting member for reflecting light, a light guiding unit arranged on the side of a light reflecting surface of the reflecting member, and light emitting devices for outputting light to the light guiding unit, a method of outputting light to be output from light emitting sources is characterized in that the light emitting devices are arranged on an optimal axis of the reflecting member, that a part of the light guiding unit outputs light outputted from the light emitting device to the external, while after another part of the surface of the light guiding unit total reflects the light outputted from the light emitting device, a still further part of the surface of the light guiding unit total reflects it and orients it toward the reflecting member, that the part of the reflecting member reflects the light total reflected by the light irradiation surface of the light guiding unit to the direction being gradually away from the optical axis, and orients it to the periphery of the light guiding unit away from the optical axis, and that shapes of and a positional relationship among the reflecting member, the light guiding unit and the light emitting devices are such defined that the another part of the reflecting plate further reflects the light reflected by the another part of the optical waveguide so as to output it to the external from the surface of the optical waveguide.

With this method of outputting light, as we described in details the light emitting sources of the invention, the light emitting sources do not darken easily, and brightness of the light emitting sources can be further equalized. In addition, as brightness distribution of the light emitting sources is equalized, the light emitting sources can be made thinner. Furthermore, if the light emitting devices of red, blue and green are used as light emitting sources, and when they are used in a liquid crystal display system, color reproducibility can be better and colors can be mixed uniformly in spite of decreased thickness.

In accordance with one aspect of the present invention, an illumination system comprises a light emitting source array in which a plurality of light emitting sources of the present invention are arranged, and a power supply unit that supplies electricity to the light emitting source array. With these light emitting sources, the light emitting sources do not darken easily in the periphery of the light emitting sources, which can then be made thinner, and thus an illumination system that has uniform brightness and decreased thickness can be manufactured.

In accordance with one aspect of the present invention, a liquid crystal display system according to the present invention is characterized in that it comprises a light emitting source array in which a plurality of light emitting sources of the present invention are arranged, and a liquid crystal display panel placed opposite to the light emitting source array. With this liquid crystal display system, corners of respective pixels do not become dark easily, display of the liquid crystal display panel can be crisp, and the liquid crystal display system can be made thinner. Furthermore, color reproducibility can be improved in the color display liquid crystal display system.

The components of the present invention that we have described above can be combined as arbitrarily as possible.

BRIEF DESCRIPTION OF THE DRAWINGS

FIG. 7 shows a sectional view illustrating structure of a light source used in the backlight shown in FIG. 6.

FIGS. 29A, B and C show the light emitting sources of different shapes.

DESCRIPTION OF THE PREFERRED EMBODIMENTS

Figure 1:
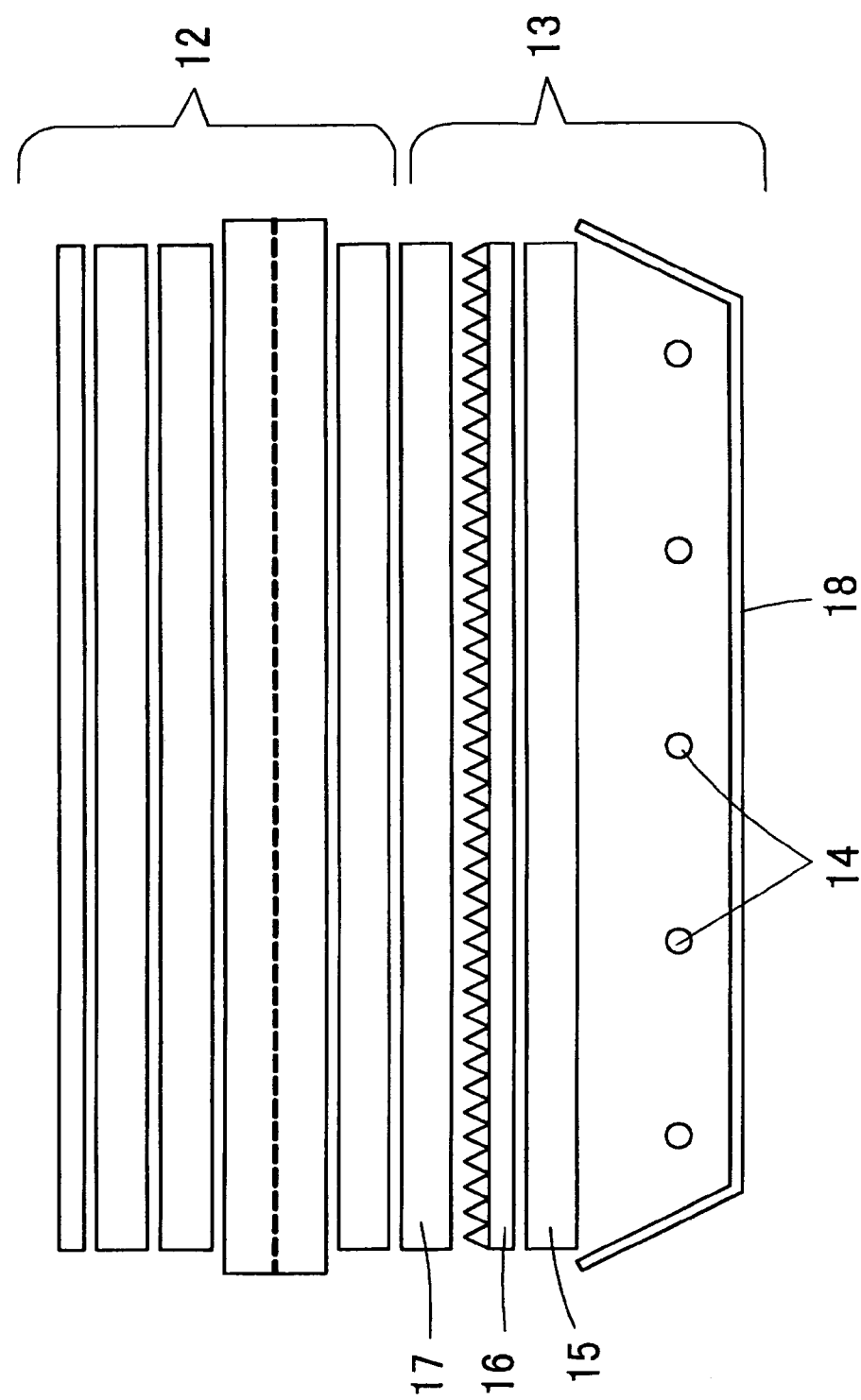
FIG. 1 shows a schematic sectional view illustrating the structure of a liquid crystal display according to the conventional example 1.
Figure 2:
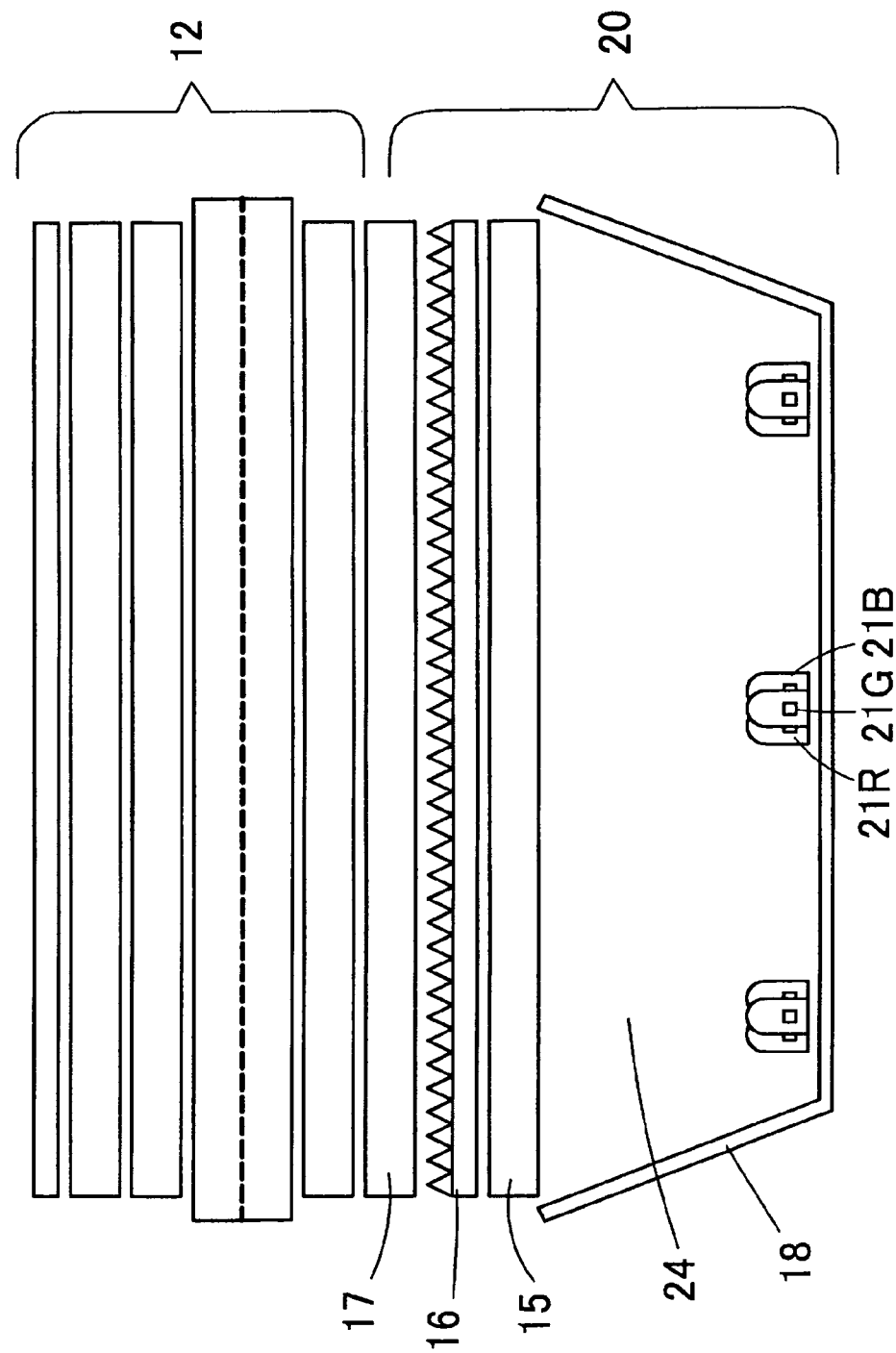
FIG. 2 shows a schematic sectional view illustrating the structure of a liquid crystal display according to the conventional example 2.
Figure 3:
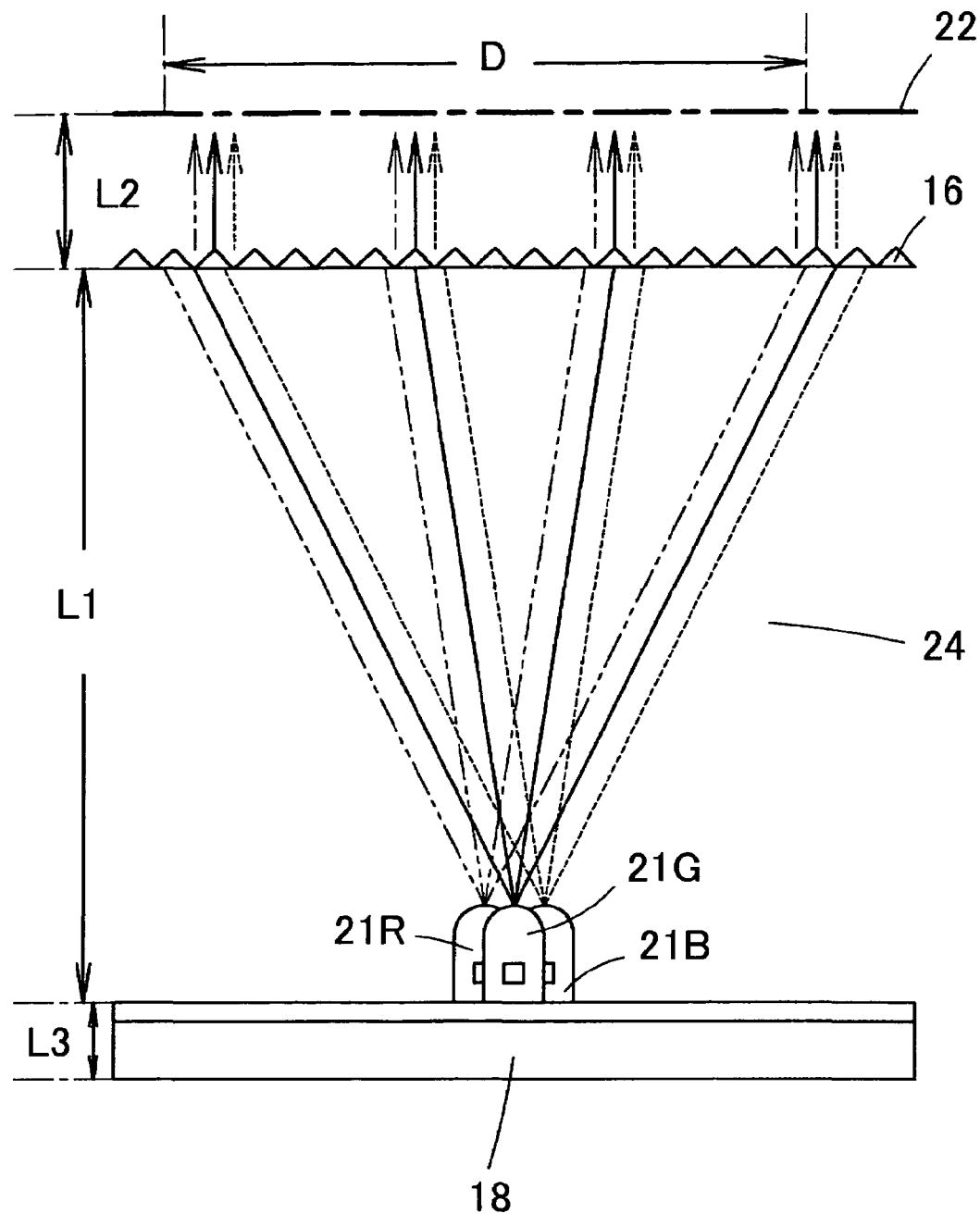
FIG. 3 shows the arrangement of when light is irradiated uniformly into a circular area with a diameter of 30 mm, by using cannonball type LEDs having an angle of beam spread of 40 degrees.
Figure 4:
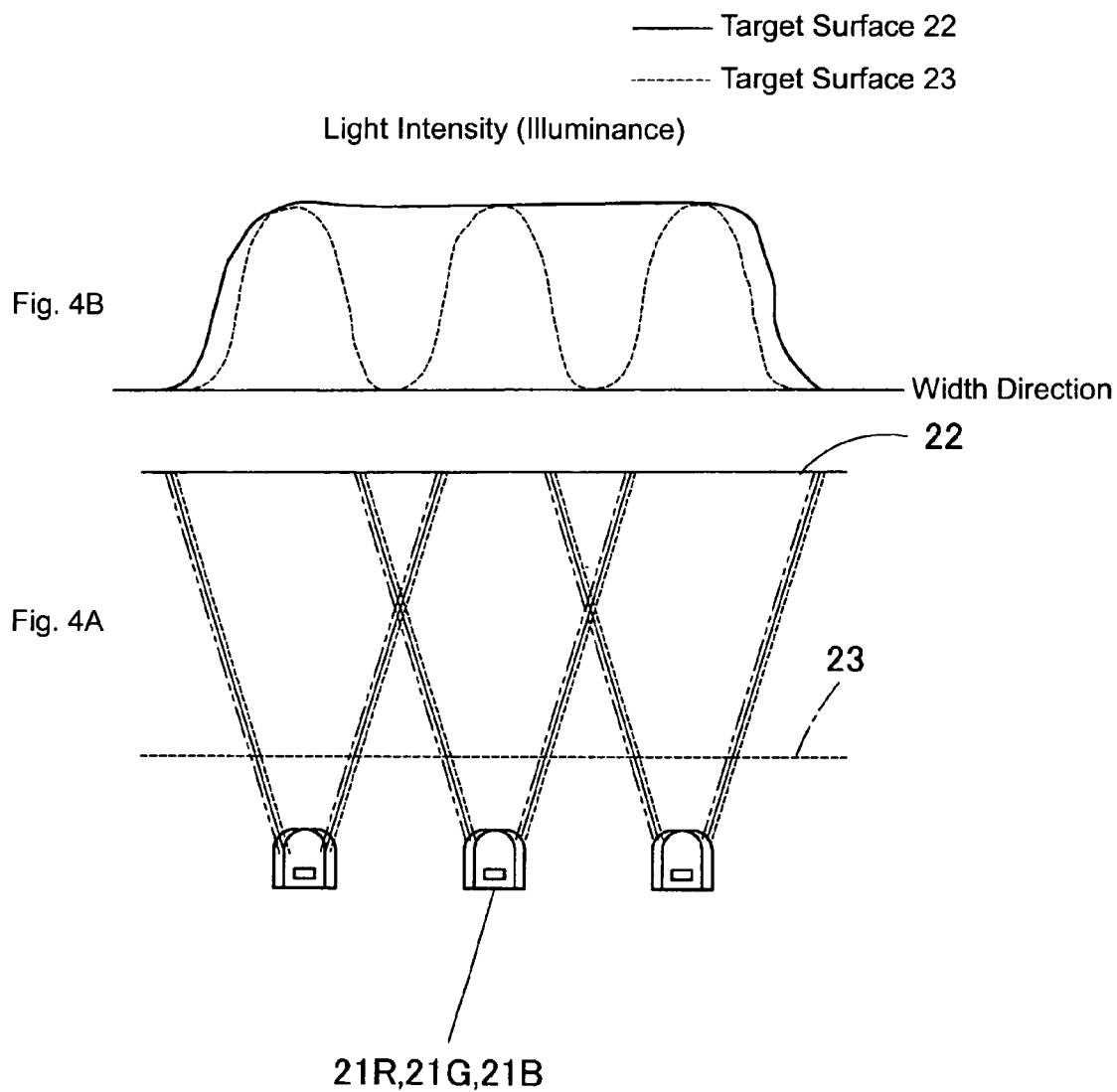
FIG. 4A shows a target surface sufficiently away from LED and a target surface close to LED in the case of the conventional example 2.
FIG. 4B shows distribution of light intensity on the 2 target surfaces as shown in FIG. 4A.
Figure 5:
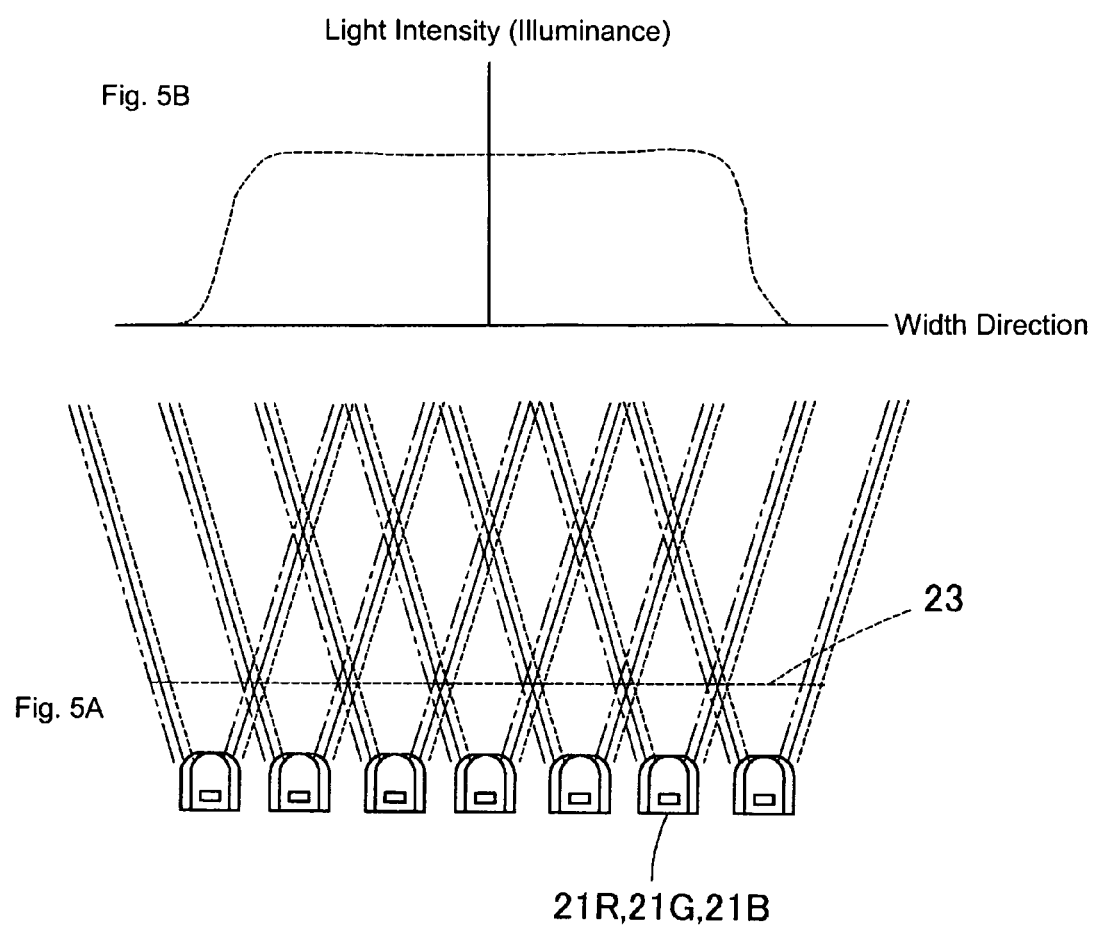
FIG. 5A and FIG. 5B show how dense the LEDs for obtaining uniform light intensity on the target surface close to LED are arranged.
Figure 6:
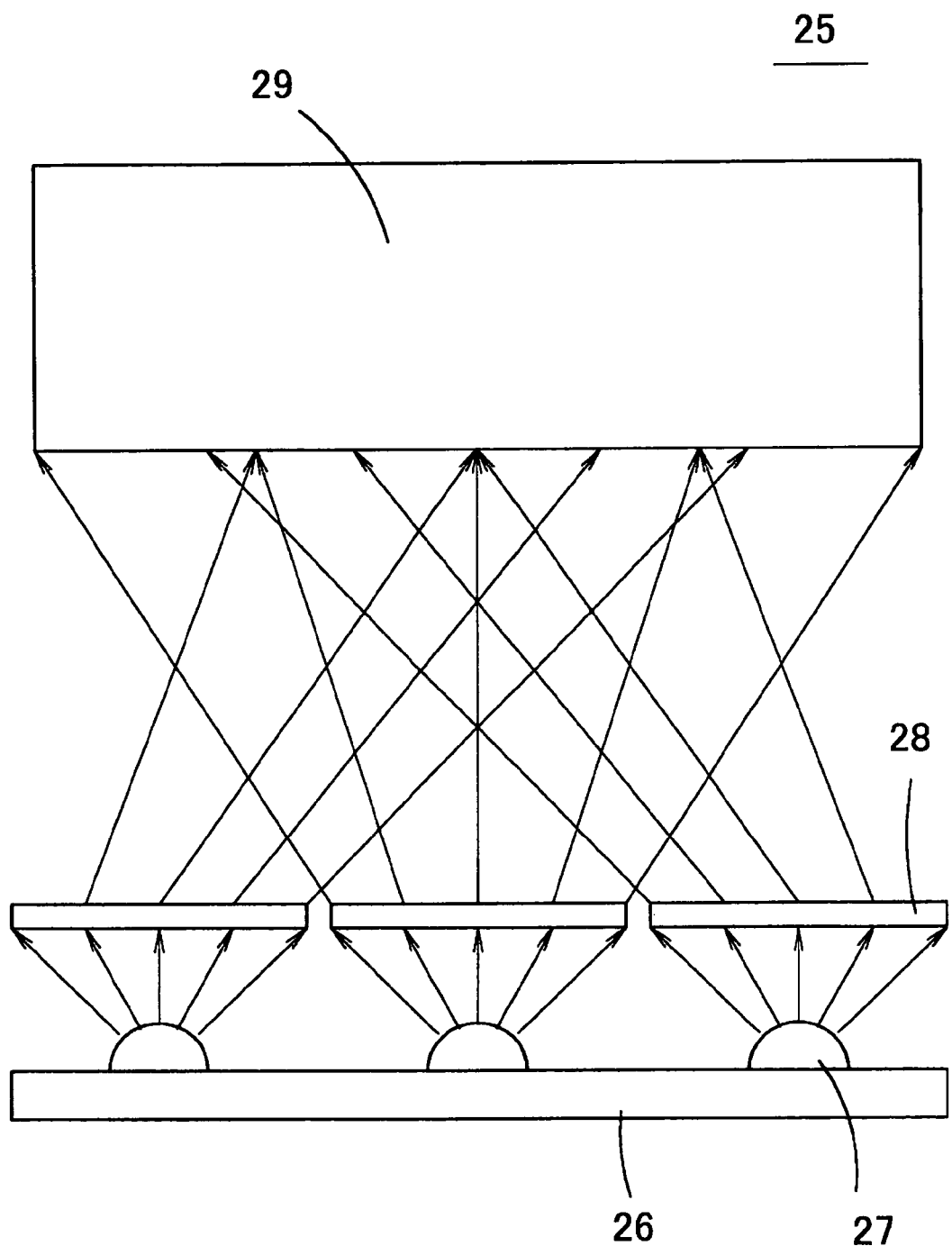
FIG. 6 shows a schematic sectional view showing a backlight according to the conventional example 3.
Figure 8B:
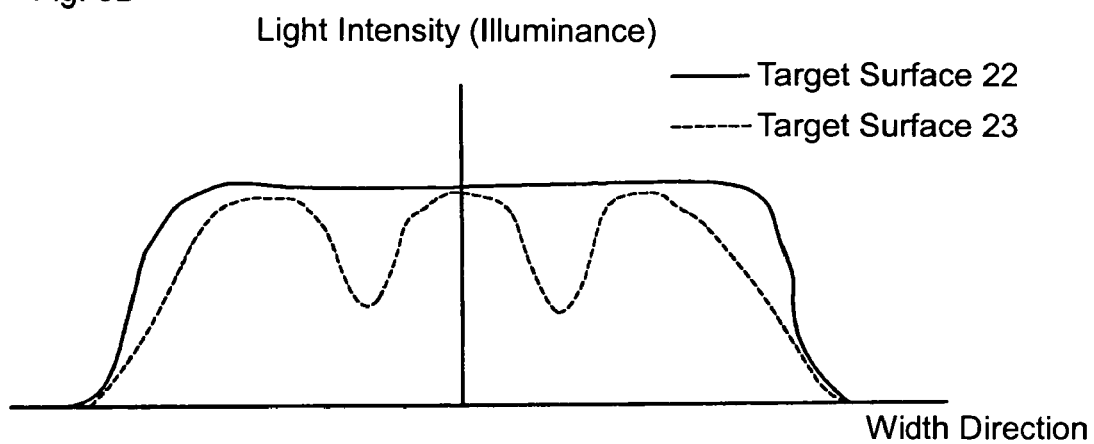
FIG. 8B shows distribution of light intensity on the 2 target surfaces as shown in FIG. 8A.
Figure 8A:
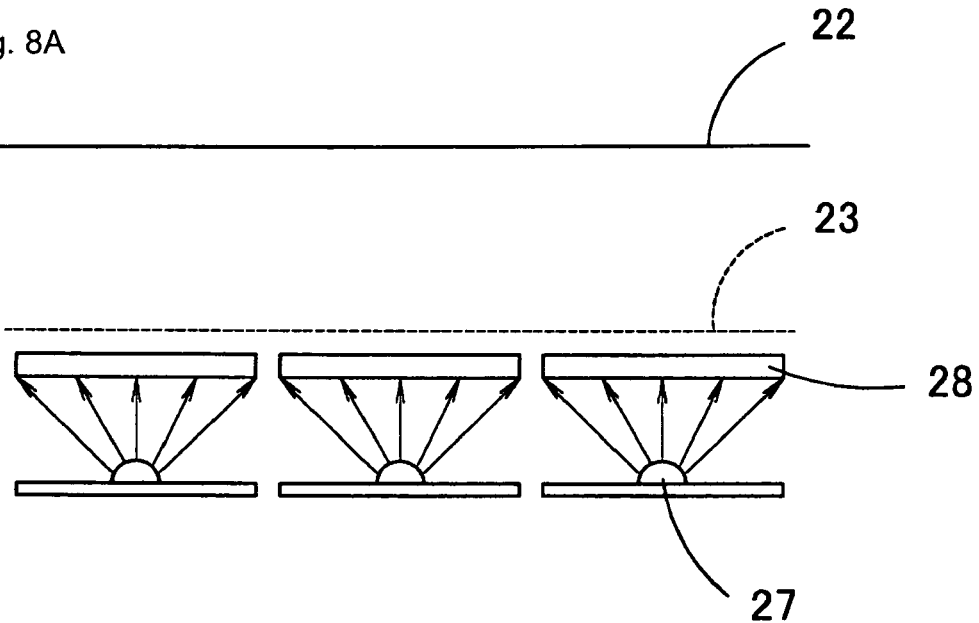
FIG. 8A shows a target surface sufficiently away from LED and a target surface close to LED in the case of the conventional example 3.

In the following, we describe embodiments of the present invention in details, with reference to the drawing. However, the present invention shall not be limited to the following embodiments but designs thereof may be modified, as appropriate, depending on applications, etc.

Embodiment 1

Figure 9:
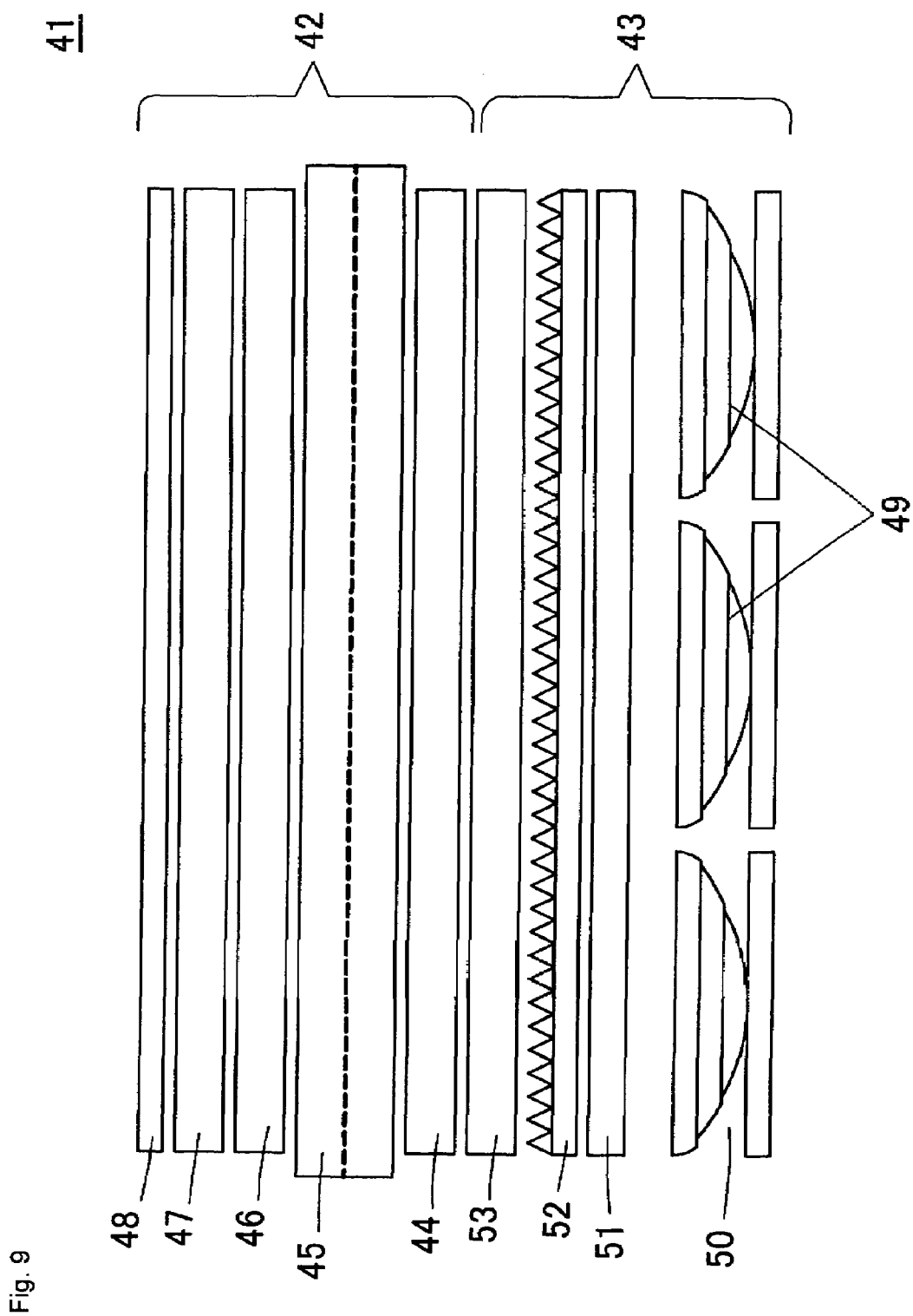
FIG. 9 shows a schematic sectional view illustrating the structure of the liquid crystal display according to Embodiment 1 of the present invention.

FIG. 9 shows the schematic sectional view illustrating the structure of a liquid crystal display (liquid crystal display system) 41 according to Embodiment 1 of the present invention. The liquid crystal display 41 is configured with a backlight 43 positioned on the rear of a liquid crystal panel 42. The liquid crystal panel 42 may be of a general type, and is comprised of a polarizing plate 44, a liquid crystal cell 45, a phase difference plate 46, a polarizing plate 47 and an anti-reflection film 48 that are sequentially laminated from the back face.

The backlight 43 is such configured that a light diffusing film 51, a prism sheet 52, and brightness enhancing film 53 are positioned on the front of light emitting source array 50 on which a plurality of light emitting sources 49 are arranged. As described below, the light emitting sources 49 are formed like a square when viewed from a front view, and the light emitting source array 50 is comprised of the said light emitting sources 49 approximately one hundred of which or several hundreds of which are arranged nearly in a grid. The light diffusing film 51 not only attempts to equalize brightness by diffusing light outputted from the light emitting source array 50, but also serves to uniformly mix light of respective colors outputted from the light emitting source array 50. The prism sheet 52 bends and transmits angularly incident light in the direction perpendicular to the prism sheet 52 by deflecting or internally reflecting it, thereby improving brightness of the front of the backlight 43.

The brightness enhancing film 53 is a film that transmits linear polarized light in a certain plane of polarization, and reflects linear polarized light in a plane of polarization that is orthogonal thereto, and the film serves to increase the usability of the light outputted from the light emitting source array 50. In other words, the brightness enhancing film 53 is arranged such that the plane of polarization of transmitting light matches the plane of polarization of the polarizing plate 44 that are used in the liquid crystal panel 42. Thus, among light outputted from the light emitting source array 50, light for which the polarizing plate 44 matches the plane of polarization transmits through the brightness enhancing film 53 and enters the liquid display panel 42, while the light for which the polarizing plate is orthogonal to the plane of polarization is reflected at the brightness enhancing film 53 and returned, and reflected at the light emitting source array 50 and enters the brightness enhancing film 53 again. A part of the light reflected at the brightness enhancing film 53 and returned transmits the brightness enhancing film 53 since the plane of polarization rotates until that light is reflected at the light emitting source array 50 and enters the brightness enhancing film 53 again. Through repetition of such reactions, most of the light outputted from the light emitting source array 50 is utilized by the liquid crystal panel 42, which improves brightness of the liquid crystal panel 42.

Figure 10:
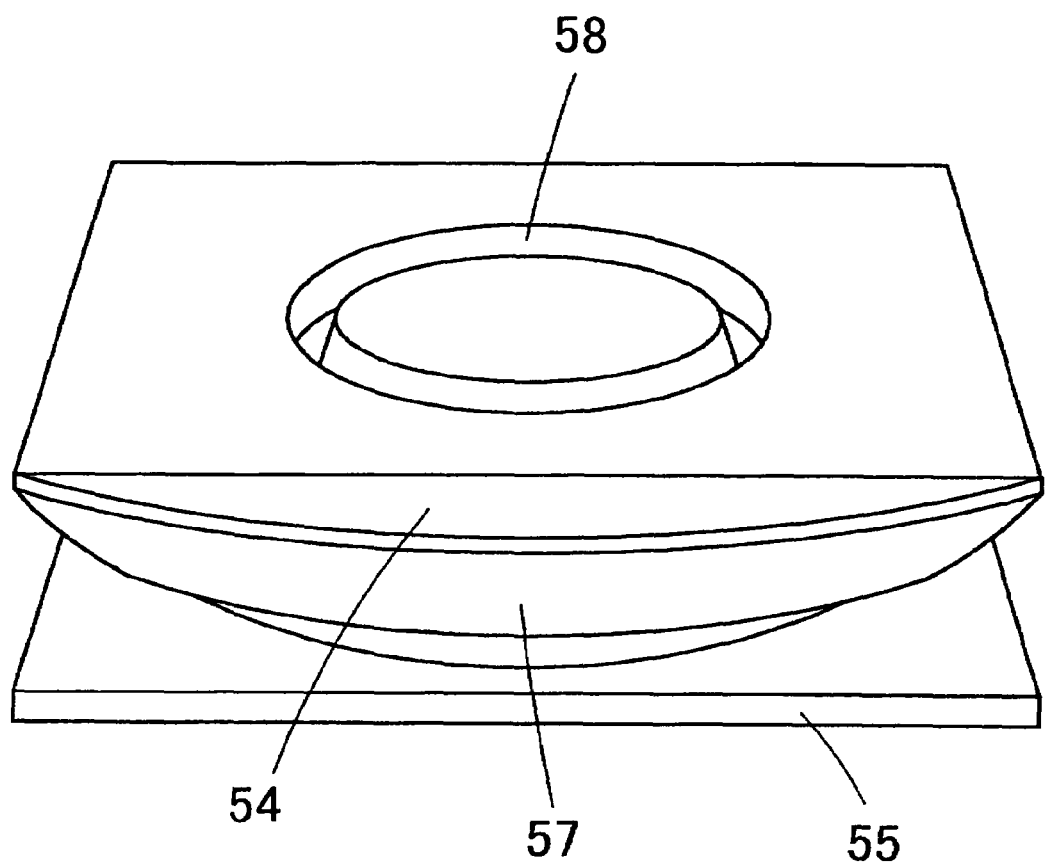
FIG. 10 shows a perspective view of light emitting sources comprising the light emitting source array as shown in FIG. 9.
Figure 11:
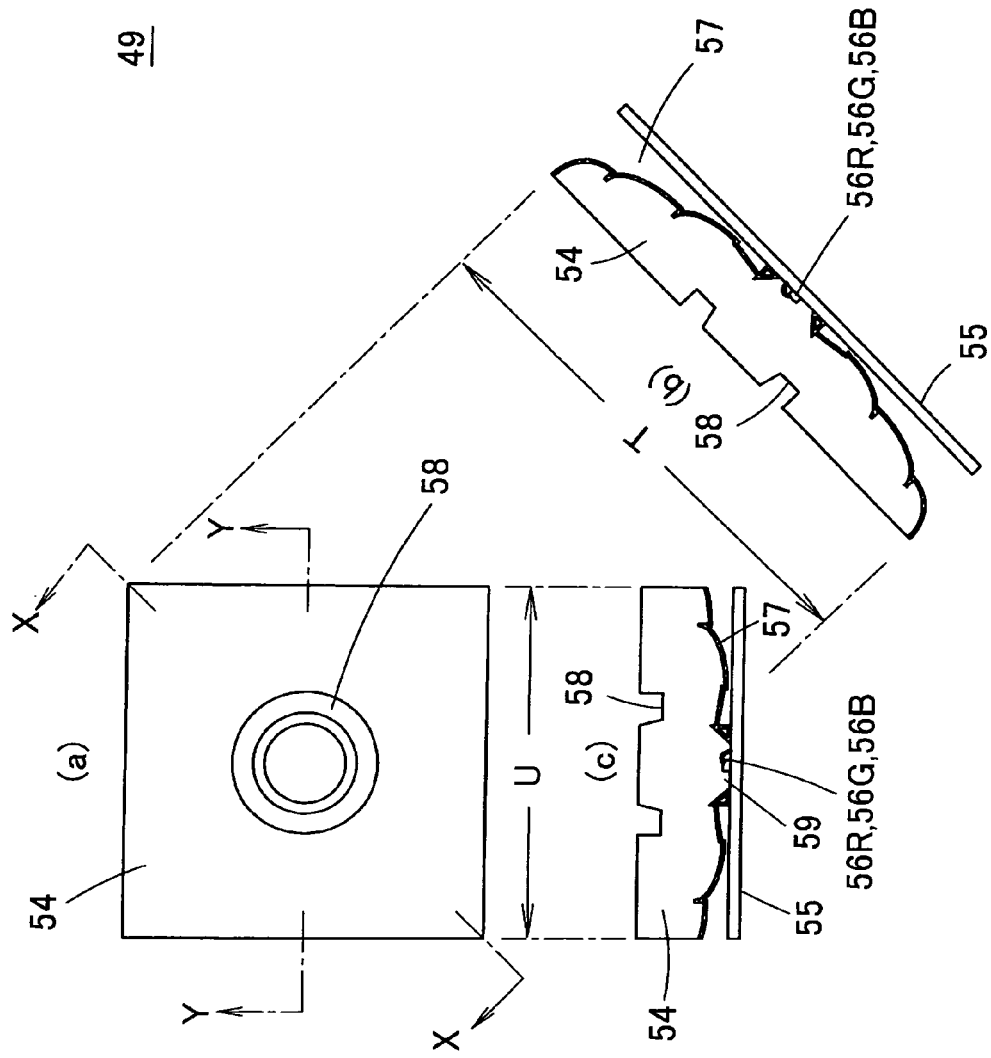
FIG. 11A shows a top view of the light emitting sources as shown in FIG. 10.
FIG. 11B shows a sectional view in the X-X direction (diagonal direction) of FIG. 11A.
FIG. 11C shows a sectional view in the Y-Y direction of FIG. 11A.

FIG. 10 shows a perspective view of the light emitting sources 49 that comprise the light emitting source array 50. FIG. 11A shows a top view of the light emitting sources 49, FIG. 11B shows a sectional view in the X-X direction of FIG. 11A of the light emitting sources 49, and FIG. 11C shows a sectional view in the Y-Y direction of FIG. 11A of the light emitting sources 49. In the light emitting sources 49, an almost dished molded unit (light guiding unit) 54 is formed by light transmissive material having a high refractive index, such as transparent resin. As the light transmissive materials comprising the molded unit 54, light transmissive resin such as epoxy resin or acryl resin, or glass material may be used. On the surface of the wiring board 55 are installed light emitting devices 56R, 56G, and 56B such as three LED chips, etc. having luminous colors of red, green and blue. The light emitting devices 56R, 56G, and 56B are encapsulated in the molded unit 54, and positioned in the central area on the back face in the molded unit 54. Toric channels 58 are provided on the front surface of the molded unit 54.

On the back face of the molded unit 54 are provided the reflecting member 57 shaped like a concave mirror for reflecting light total reflected on the front surface of the molded unit 54. The reflecting member 57 may be a metal coating such as Au, Ag, Al, etc. deposited on the rear of the molded unit 54, or a metal plate of aluminum, for instance, with the surface reflectivity increased by mirror-like finishing the surface, or a curved plate of metal having a surface plated with Au, Ag, AL, etc. or of resin.

Figure 12A:
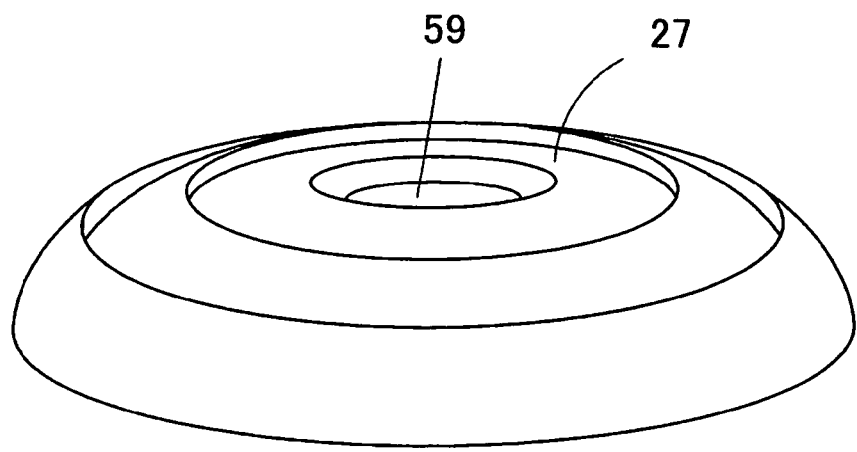
FIG. 12A shows a perspective view of a disk-like reflecting member when viewed from the rear surface.
Figure 12B:
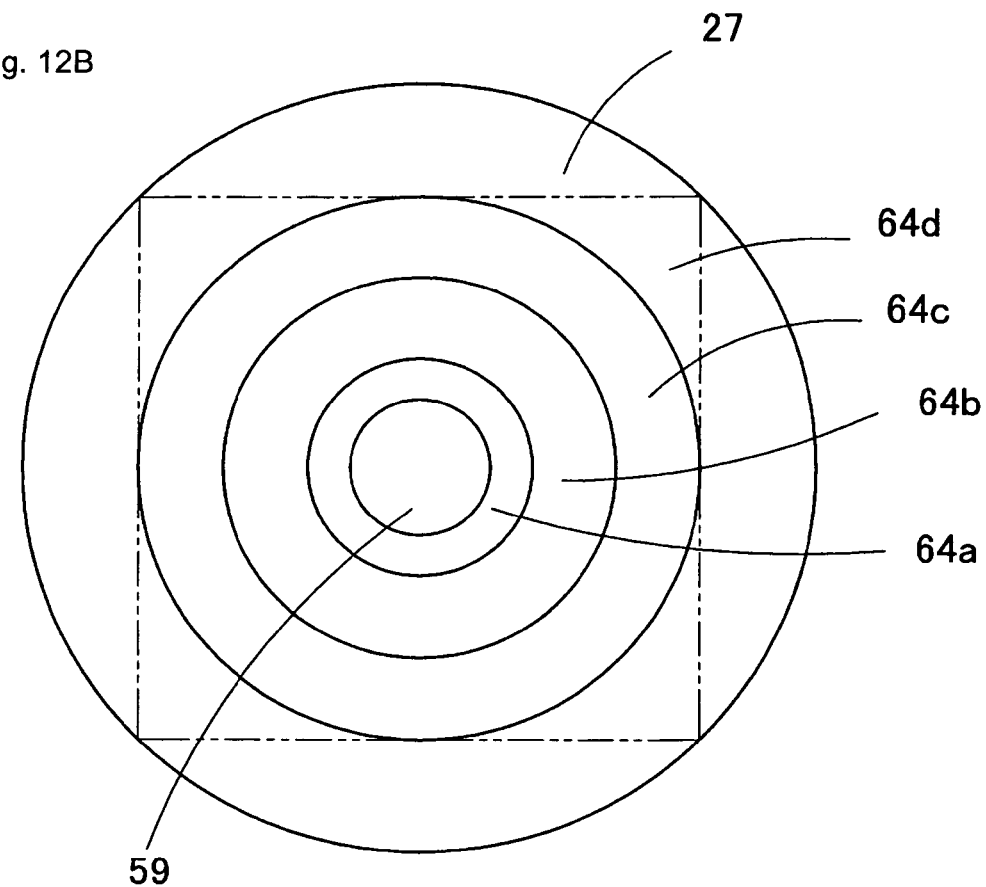
FIG. 12B shows a top view from the rear surface.
Figure 13:
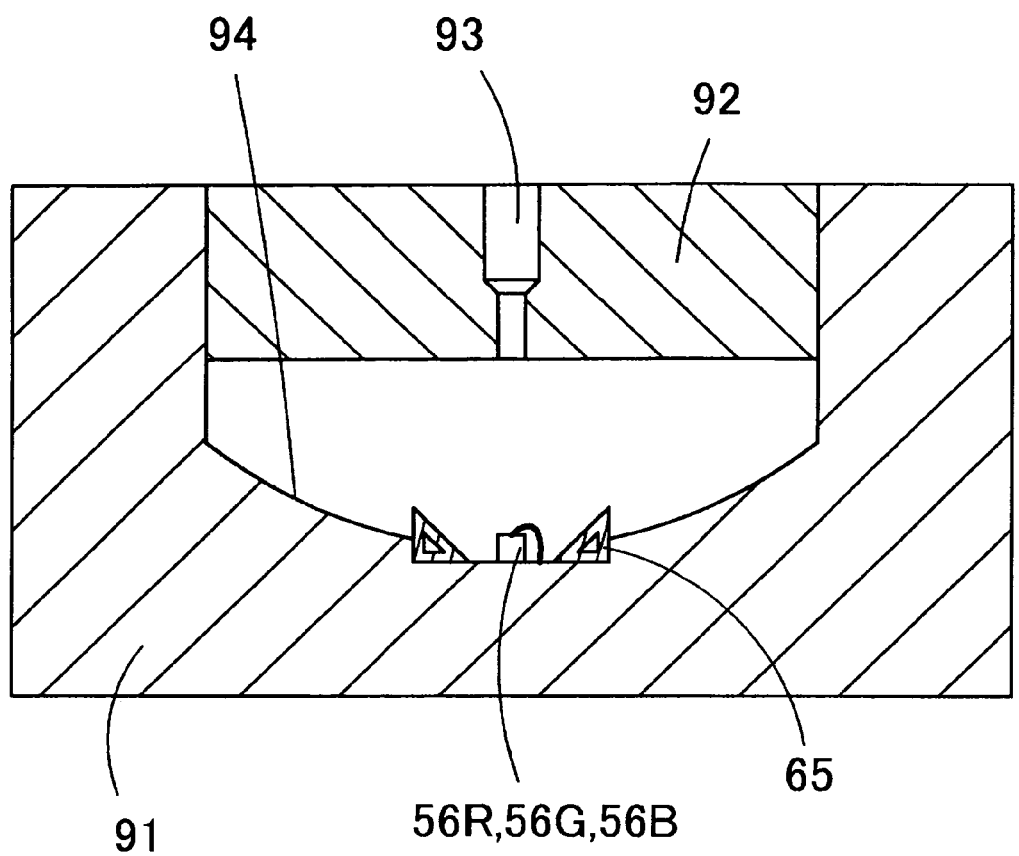
FIG. 13 shows a schematic sectional view illustrating a molded die for molding a molded unit of the light emitting sources.
Figure 14A:
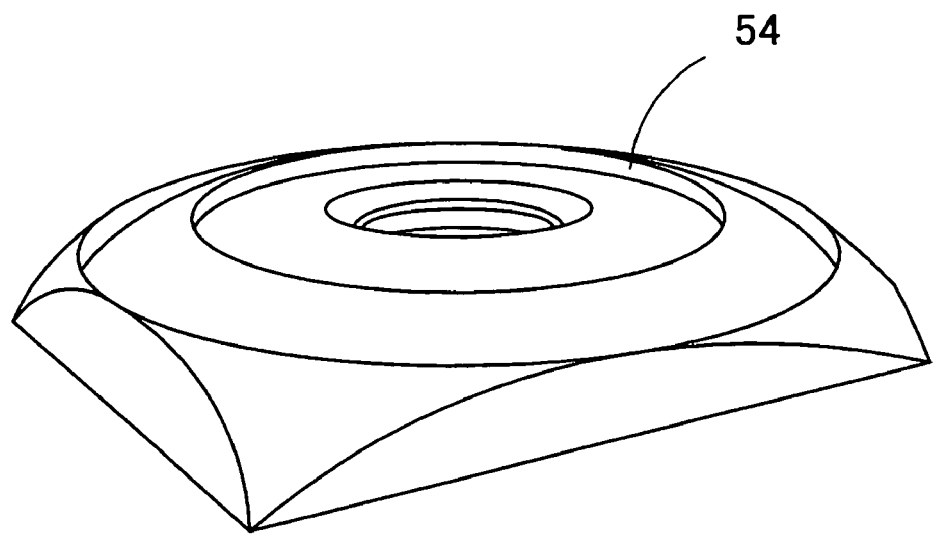
FIG. 14A shows a perspective view of the molded unit when viewed from the rear surface.
Figure 14B:
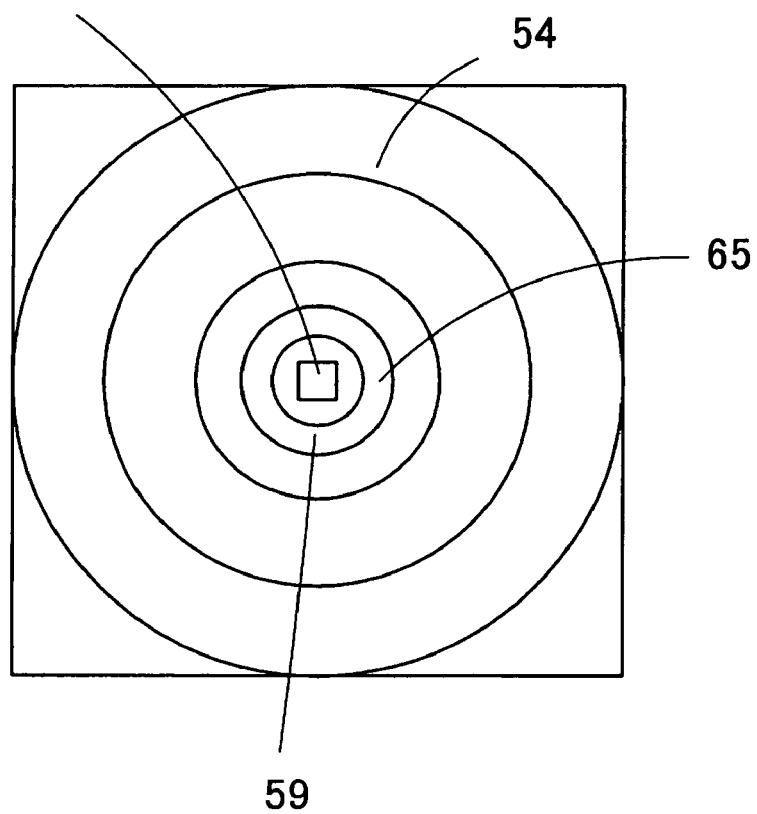
FIG. 14B shows a top view when viewed from the rear surface.

In the following we describe a method of manufacturing the light emitting sources 49. First, as shown in FIG. 12A and (b), a disk-like reflecting member 57 of the light emitting sources 49 is designed. Then, once the disk-like shape of the reflecting member 57 is determined, the square shape of the reflecting member 57 as shown in chain double-dashed line in FIG. 12B is determined as the shape of the reflecting member 57 being a product. When the square shape of the reflecting 57 is determined, then, a lower die 91 and an upper die 92 that have a molded surface 94 being equal to the reflecting member 57 in cavities are made. FIG. 13 schematically shows the molded die. In making the light emitting source 49, the light emitting devices 56R, 56G, and 56B, and a cup part 65 are set in the central part of the bottom of the lower die 91, and not only transparent resin is injected through a resin inlet 93 of the upper die 92 to mold the molded unit 54, but also the light emitting devices 56R, 56G, and 56B and the cut unit 65 are inserted into the molded unit 54. When the molded unit 54 as shown in FIG. 14 is obtained, metal such as Au, Ag, Al, etc. is deposited on the outer surface of the molded unit 54, thus forming the reflecting member 57.

An alternative method is to inject resin into a rectangular cavity of a molded die in which a square shaped reflecting member 57 is fitted, so that a rectangular shaped light emitting source 49 may be directly fabricated. In either the former and latter methods, the cup unit 65 may be formed integrally with the reflecting member 57.

Figure 15:
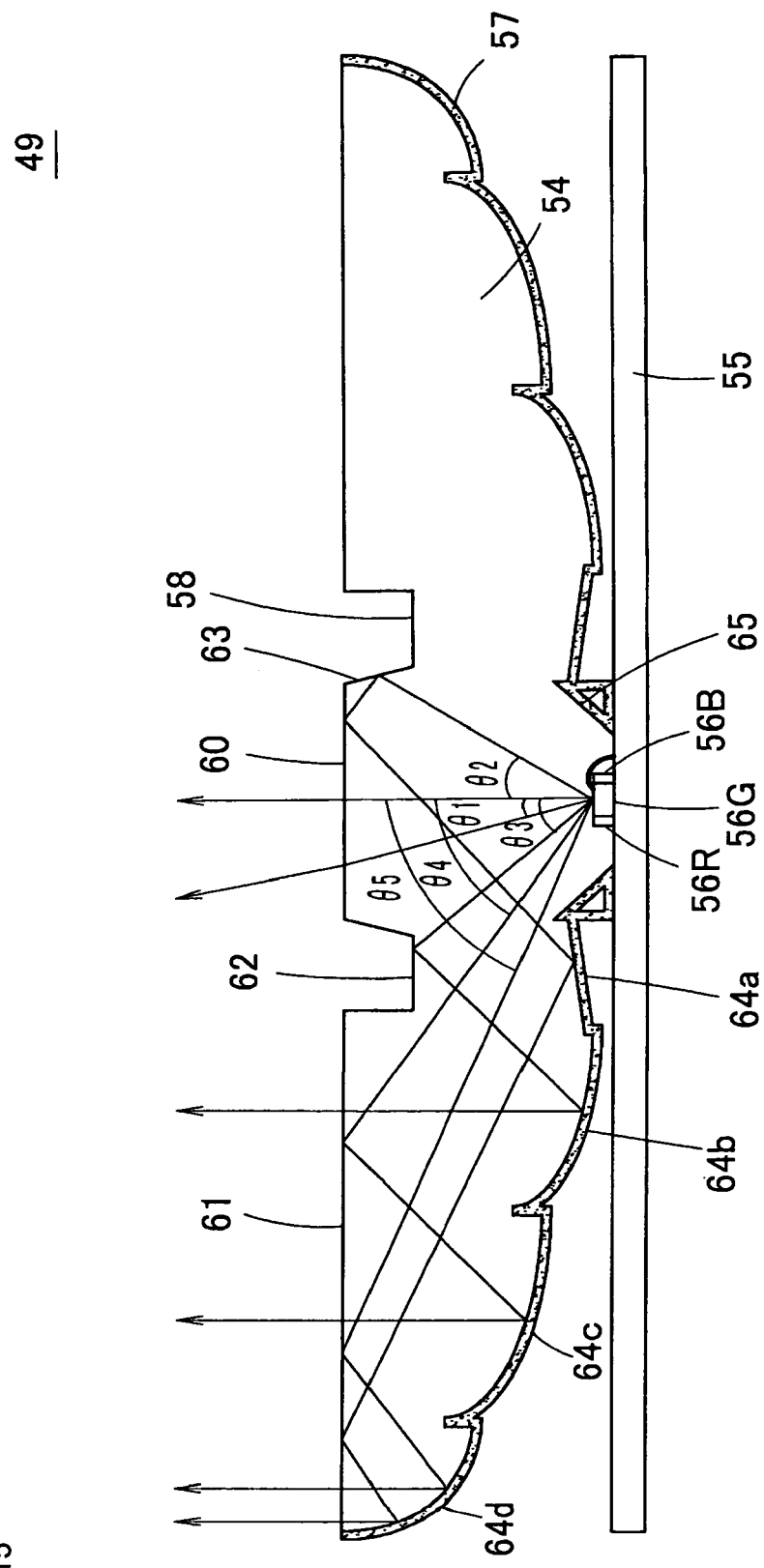
FIG. 15 shows an enlarged sectional view illustrating details of the light emitting sources according to Embodiment 1, which shows a section in the diagonal direction.

FIG. 15 shows an enlarged sectional view illustrating the light emitting sources 49 of the present invention in details, and represents the section in the diagonal direction. In the central front part of the mold 54 is provided a direct output area 60 (a first region) on the outer side of which is provided an annular total reflection area 61 (a second region). The direct output area 60 is a smooth circular area formed of a plane perpendicular to the center axis of the mold unit 54, and the total reflection area 61 is also a smooth annular area formed of a plane perpendicular to the center axis of the mold unit 54. Although in the illustrated example, the direct output area 60 and the total reflection area 61 are formed in the same plane, and the direct output area 60 is on a level with the total reflection area 61, the direct output area 60 may be on a higher level than the total reflection area 61 by protruding the direct output area 60 more than the total reflection area 61 in the channel 58. Although the direct output area 60 is primarily the region that directly outputs light outputted from the light emitting devices 56R, 56G, and 56B to the external, as described below, it also serves to total reflect incident light. Similarly, although the total reflection area 61 primarily serves to total reflect incident light to the side of the reflecting member 57, it also serves to transmit the incident light and output it to the external. From what is said above in relation with FIG. 15, it may be understood that what is called the direct output area 60 is a surface that is a direct output for light coming directly from LEDs 56R B and G. It may be also a total reflection area for light reflected on slope 63. Also, the annular total reflection area 61 is a total reflection area for light coming from LEDs 56R B and G but it may be a passing through area for light reflected from one of annular reflecting areas 64a, 64b, 64c . . . , of the reflecting member 57 as shown in FIG. 15. Said annular reflecting areas 64a, 64b, 64c . . . , will now be discussed.

Toric channels 58 are provided between the direct output area 60 and the total reflection area 61, with the total reflection area 62 being formed on the bottom of the channel 58. In addition, an angularly inclined slope total reflection area 63 (a third region) is formed in the side of the inner circumference of the channel 58, and the slope total reflection area 63 is formed as a tapered truncated cone so that the diameter decreases progressively as it shifts to the front surface of the mold unit 54. Although the total reflection area 62 as well as the slope total reflection area 63 primarily serve to total reflect incident light, a part of the incident light may possibly transmit through the slope total reflection area 63 and be outputted to the external.

The reflecting member 57 is comprised of a plurality of annular reflecting areas 64a, 64b, 64c . . . the innermost reflecting area 64a of which (backward slope area) is formed like a truncated cone and inclined downward to the back face as it moves to the outer circumference side (Such a direction of tip is referred to a backward slope). The reflecting areas 64b, 64c . . . also comprise a Fresnel reflecting surface. As such, if some of the reflecting members 57 are formed like the Fresnel reflecting surface, the light emitting devices 49 can be made further thinner. Designing the plurality of the reflecting areas 64a, 64b, . . . with mutually independent parameters would allow respective areas to be designed optimally, thus enabling more uniform light emission. Also, between the reflecting area 64a and an opening 59 is provided a cup unit 65 with the interior circumferential surface inclined so that the opening 59 can be wider in the front surface side.

Although FIG. 15 shows the four reflecting areas 64a, 74b, 64c and 64d, the reflecting areas may be three, or more than four.

It would be desirable to design a curved shape of the reflecting areas 64b, 64c, and 64d into the shape that allows light to be uniformly outputted from the front of the light emitting devices 49 as far as it is possible. For instance, if the light emitting sources 49 are designed based on the light emitting sources that are circular when viewed from the front, the shape could be a conic surface as represented by the following expression.

[Expression 1]

$$Z = \frac{CV\rho^2}{1 + \sqrt{1 - CV^2(CC+1)\rho^2}} + A\rho^4 + B\rho^6 + C\rho^8 + D\rho^{10} + \ldots \quad (1)$$

wherein, $\rho = \sqrt{X^2 + Y^2}$

Herein, X, Y, and Z are rectangular coordinates with their origin at the center of the reflecting member 57, the Z axis being coincident with the optical axis of the reflecting member 57 and the center axis of molded unit 54. In addition, CV is a curvature of the reflecting member 57, CC a conic coefficient, and A, B, C and D a quartic, sextic, octal and decimal aspheric coefficient, respectively.

Thus, if the centrally positioned light emitting devices of three colors, namely, red, green and blue 56R, 56G, and 56B emit light, among light outputted from the light emitting devices 56R, 56G, and 56B, the light outputted with an output angle θ1 (<θc) that is smaller than the critical angle of total reflection θc on the interface of the molded unit 54 enters the direct output area 60. Then, this light transmits through the direct output area 60 and is directly outputted forward from the light emitting sources 49. In addition, light outputted with an output angle θ3 (>θc) that is greater than the critical angle of total reflection θc enters the total reflection area 62. This light enters the reflecting area 64b by being total reflected at the total reflection area 62, and after being reflected at the reflecting area 64b, it transmits through the total reflection area 61 and is outputted forward. In addition, light outputted with an output angle θ4 (>θ3) that is greater than the critical angle θc of the total reflection enters the total reflection area 61. This light enters the reflecting area 64c by being total reflected at the total reflection area 61, and after being reflected at the reflecting area 64c, it transmits through the total reflection area 61 and is outputted forward. In addition, light outputted with an output angle ƒ5 (>θ4) that is greater than the output angle θ4 enters the reflecting area 64d by being total reflected at the total reflection area 61, and after being reflected at the reflecting area 64d, it transmits through the total reflection area 61 and is outputted forward. In addition, the light outputted from the light emitting devices 56R, 56G, and 56B with an output angle θ2 (θ1<θ2<θ3) between the output angle θ1 to the direct output area 60 and that θ3 to the total reflection area 62 enters the slope total reflection area 63. Then, after being total reflected twice in the slope total reflection area 63 and the direct output area 60, it is reflected at the reflecting area 64a. Furthermore, it is not only total reflected in the total reflection area 61 but also reflected in the reflecting area 64d, and is outputted forward from the corner parts of the light emitting source 49. Consequently, this allows uniform brightness to be obtained in the front surface of the light emitting sources 49, thus, in particular, preventing the corner parts of the light emitting sources 49 from being darkening.

The light entering the slope total reflection area 63 may be any light with an output angle greater or smaller than a critical angle of total reflection. However, it is desirable that the light entering the corner parts of the light emitting sources 49 would be light having strong intensity. Thus, desirably, the output angle θ2 that enters the slope total reflection area 63 would be smaller than the critical angle θc of total reflection. In other words, the following would be desirable:

θ2<arc sin(n2/n1)=θc wherein n1 is a refractive index of the molded unit 54, and n2 is a refractive index of medium (such as air) that contacts the front surface of the molded unit 54.

As seen from behavior of the light described above, a gradient of a tangent in the reflecting area 64c is greater than that of a tangent in the reflecting area 64b, and a gradient of a tangent in the reflecting area 64d is greater than that of a tangent in the reflecting area 64c.

Figure 16:
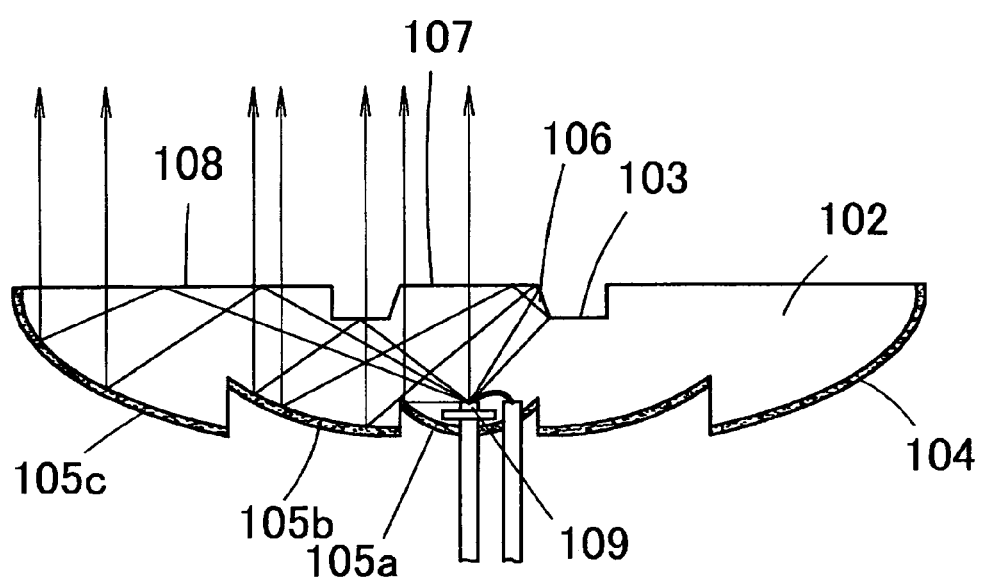
FIG. 16 shows a sectional view of the light emitting sources disclosed in the Japan Unexamined Patent Publication No. 2004-189092.

Incidentally, the applicant of the present invention also applies for a patent of a light emitting source that is similar to the light emitting source 49, the former of which is disclosed Japan Unexamined Patent Publication No. 2004-189092. FIG. 16 shows a sectional view of the light emitting source 101 disclosed in the Japan Unexamined Patent Publication No. 2004-189092. For this light emitting source 101, a channel 103 is also provided on the front surface of a molded unit 102, and a plurality of annular reflecting areas 105a, 105b, and 105c are also provided on a reflecting member 104 on the back face. However, in this light emitting source 101, either the reflecting area 105a or 105b is inclined downward to the back side as it shifts to the inner circumference side, and the light total reflected twice in the slope total reflection area 106 in the inner circumference of the channel 103 and the direct output area 107 enters the reflecting area 105b, is reflected at the reflected area 105b, and outputted forward from an intermediate area between the direct output area 107 and the total reflection area 108 or from the vicinity thereof.

Figure 17:
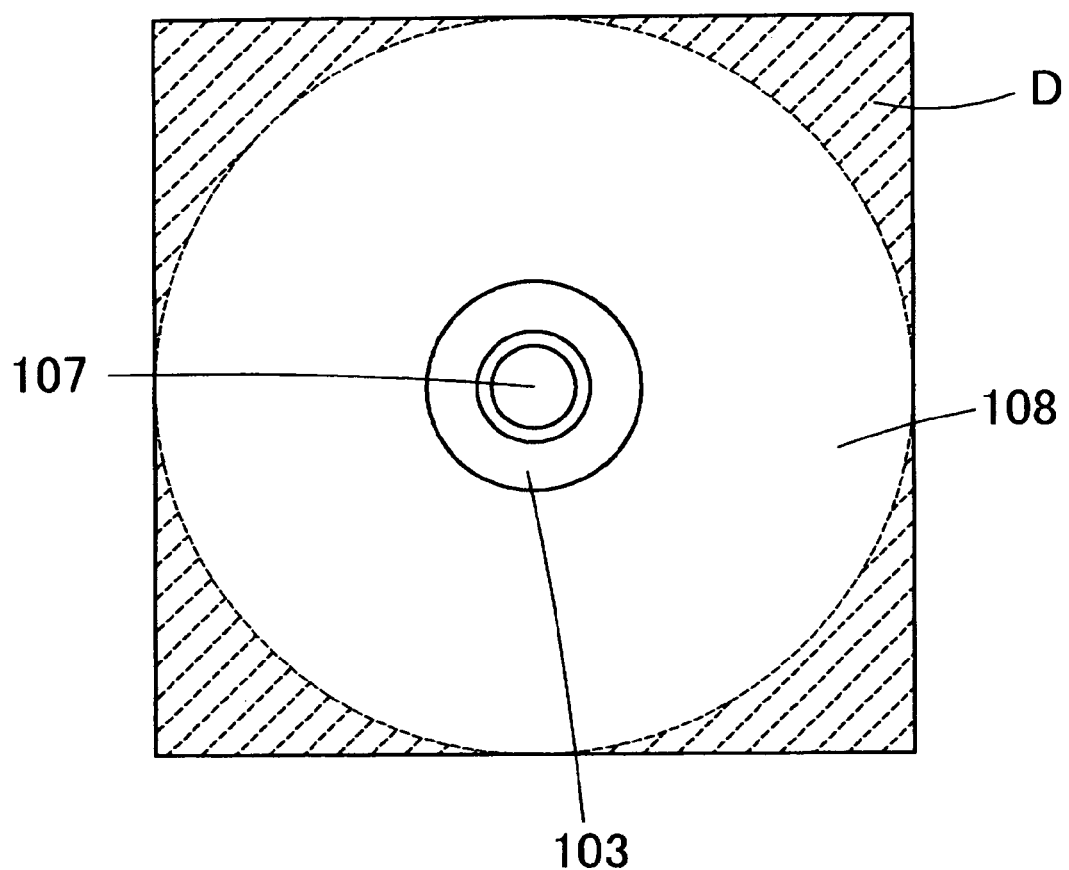
FIG. 17 shows how corner parts darken in the light emitting sources as shown in FIG. 16.
Figure 18:
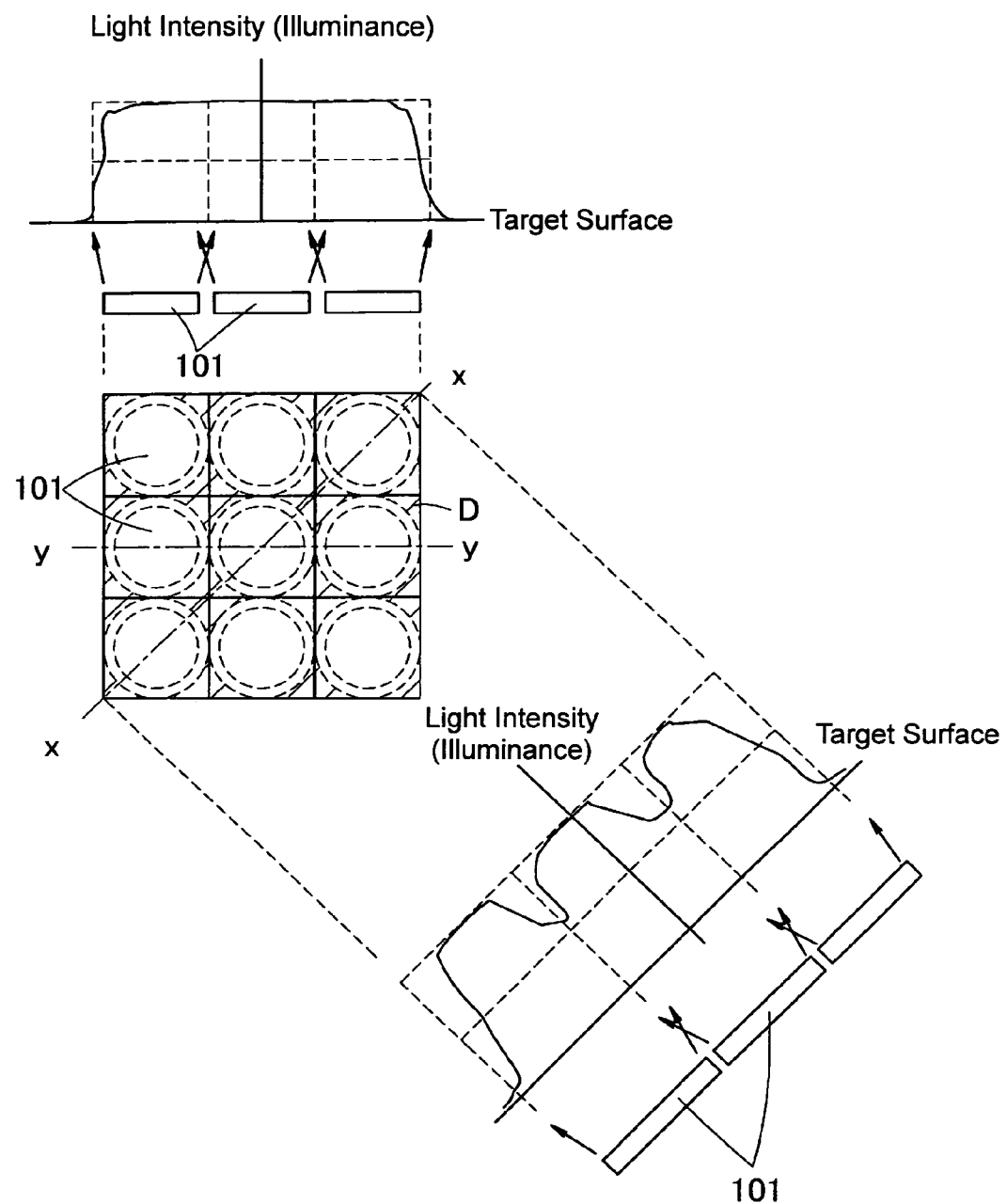
FIG. 18 shows the light emitting source array in which a plurality of the light emitting sources as shown in FIG. 16 are arranged, distribution of light intensity in a target surface in a direction parallel to the side, and distribution of light intensity in a target surface in the diagonal direction.

As seen from FIG. 16, this light emitting source 101 is such configured that only the light outputted with a large output angle from the light emitting device 109 (the light with the output angle of θ5 in FIG. 15) is outputted forward from the corner parts of the light emitting source 101. However, intensity of the light outputted from the light emitting device 109 is high in the front and decreases as the output angle increases. For this reason, in the light emitting source 101, a sufficient amount of light is not outputted from the corner parts. Hence, there is a problem that as brightness or illuminance degrades in the shaded corner part D of the light emitting source 101 as shown in FIG. 17, it becomes dark. In particular, if an array is made by arranging a plurality of the light emitting sources 101, as shown in FIG. 18, uniform light intensity (illuminance) could be obtained on the line y-y running through the center of the light emitting source 101 and being parallel to the array direction. However, in the diagonal direction on line x-x, it is very dark at a junction of the corner parts, and thus uniform illuminance could not be achieved. In particular, darkness at the corner part D stood out when a target surface came closer to the light emitting source 101.

At the same time, in the light emitting source of the present invention, backward sloping the reflecting area 64a so that it is inclined downward to the back face side as it moves to the outer circumference outputs forward from the corner part the light with small output angle of θ2 that is total reflected twice in the slope total reflection area 63 and the direct output area 60, by reflecting it in the reflecting area 64a and the total reflection area 61. As a result, in addition to the light with a large output angle, it has become possible to feed the light with a small output angle and having strong light intensity (light of the output angle of θ2) into the corner part and output it forward, thereby making it possible to uniformly output to the entire light emitting source 49. In particular, when the light emitting sources are made an array, not only uniform brightness could be achieved in the entire light emitting source array 50 but also uniform illuminance could be obtained in the target surface.

In addition, in the light emitting source of the present invention, as the light emitting sources 49 in which LED chips of three colors, red, green and blue are built in is used, color reproducibility of the liquid crystal display 41 can be better, making three primary colors look vivid.

Figure 19:
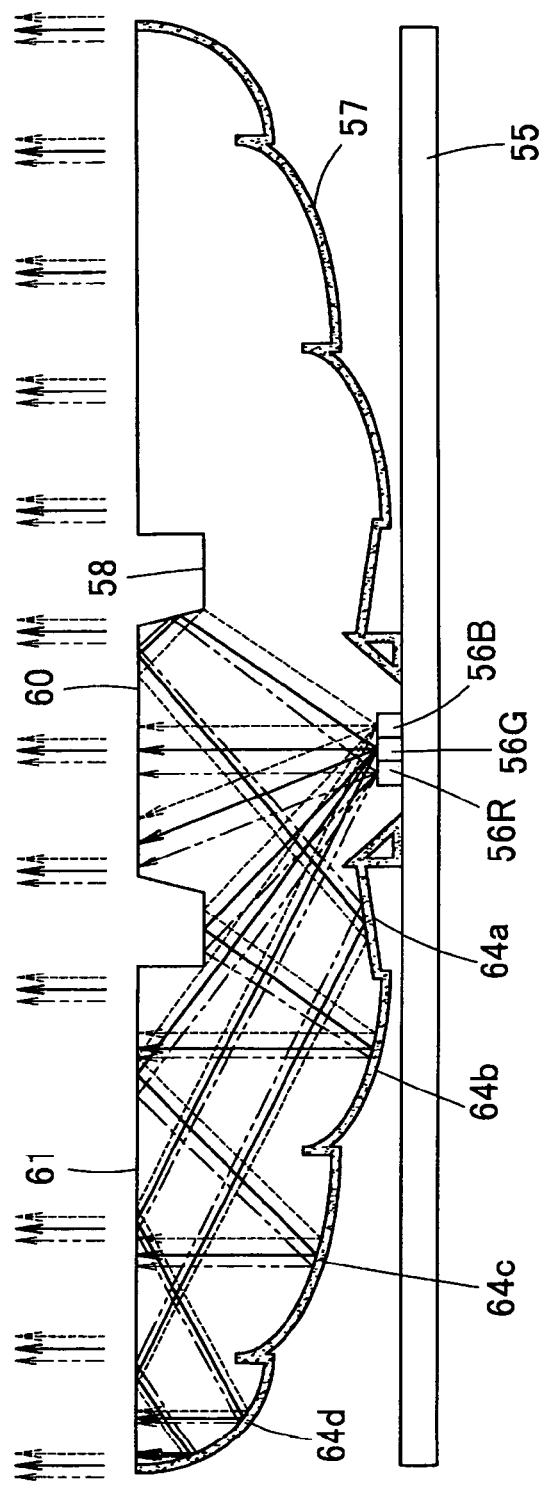
FIG. 19 shows an illustration describing effect of the light emitting sources according to Embodiment 1.

As luminance in the diagonal direction increases in the light emitting sources of the present invention, illuminance of light on a target surface closer to the light emitting sources 49 can be equalized, thereby making a backlight 43 thinner. Furthermore, as shown in FIG. 19, because of a long optical path length that light outputted from the light emitting device follows till it is outputted from the front face of the light emitting source as shown in FIG. 19, light of respective colors outputted from the light emitting devices 56R, 56G and 56B is mixed sufficiently in the molded unit 54 before it is outputted from the light emitting source, and uniformly outputted from the front face. Thus, this light emitting source could reduce the equalizing space that is needed in front of the light emitting source array, namely, thickness of the space for equalizing light intensity distribution or light mixing state can be reduced, and thus the backlight 43 can be made thinner.

For instance, if we manufacture a light emitting source array of equivalent brightness or uniformity, thickness of a backlight of 30 mm, which is equivalent to that of a conventional backlight using cold cathode tubes, can be achieved with the light emitting source array 50 of the present invention, and good color reproducibility comparable with the conventional example utilizing the three-color LEDs can be achieved.

Furthermore, with the light emitting source of the present invention, as we can fabricate a backlight that is a square, about 30 mm on a side and has adequately uniform brightness distribution, the arrangement of necessary light emitting sources could be less dense, thereby achieving more power saving than the conventional example 2.

In addition, the light emitting source array 50 of the present invention is such configured that surface light sources 49 are arranged. Thus, to change size or fitness ratio of the light emitting source array 50, the design can be easily changed simply by increasing or decreasing the light emitting sources 49, which enables the light emitting source array 50 or the backlight 43 that has high degree of freedom.

Figure 20:
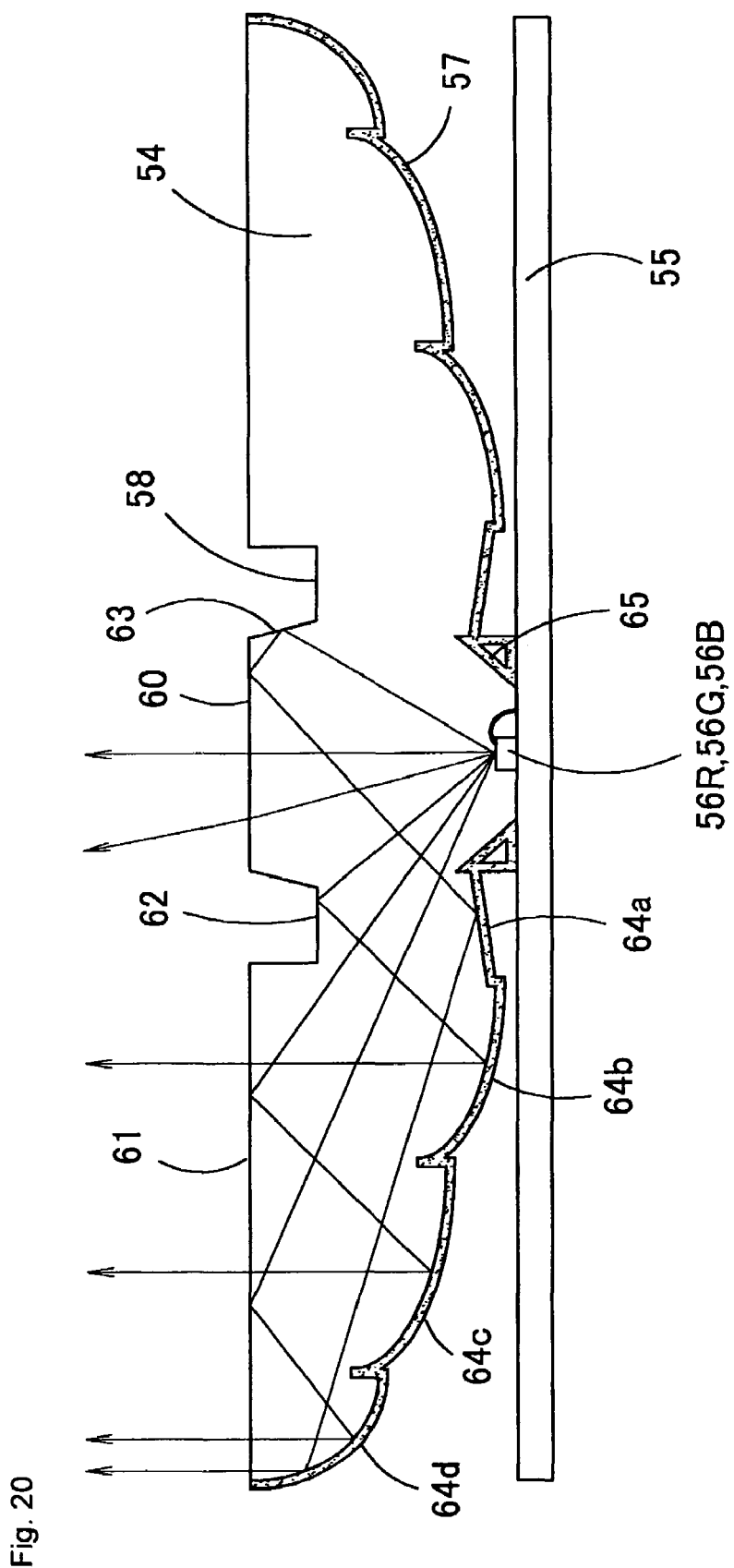
FIG. 20 shows a sectional view of a variant example of Embodiment 1.

FIG. 20 shows a sectional view of a variant example of Embodiment 1. The variant example is such configured that light reflected at the reflecting area 64a directly enters the reflecting area 64d of the corner part, is reflected at the reflecting area 64d, and outputted forward. Even in such the variant example, the effect similar to the Embodiment 1 can be achieved.

In addition, the reflecting area 64a, although not shown, may slope backward only in the diagonal direction, in the middle of which it may be angularly inclined forward (which is referred to as positive inclination) as it moves to the outer circumference. Thus, light reflected at the positive inclination part of the reflecting area 64a may be outputted forward from intermediate between the direct output area 60 and the total reflection area 61.

Embodiment 2

Figure 21:
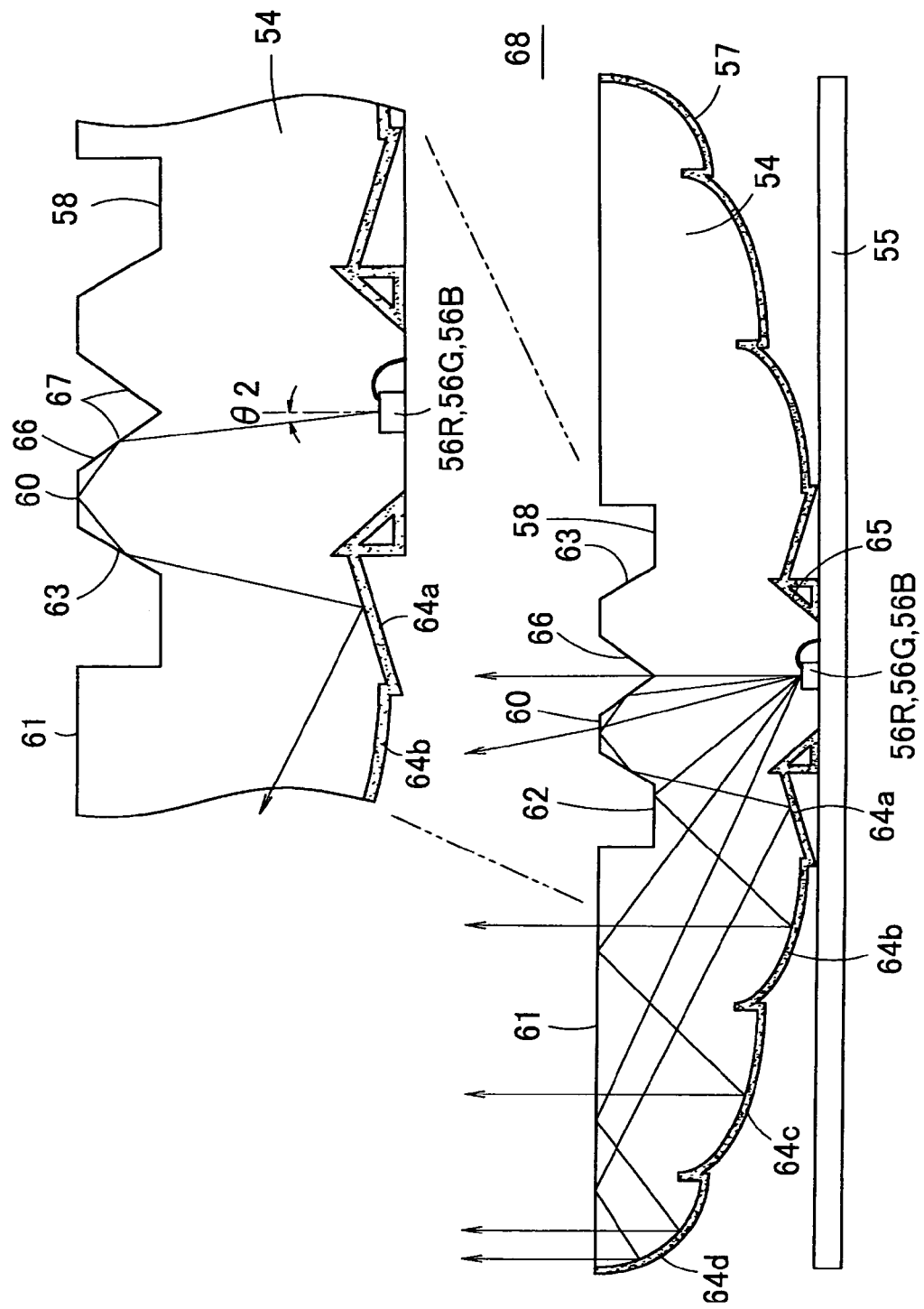
FIG. 21 shows a section of the light emitting sources of Embodiment 2 of the present invention in the diagonal direction and a partial enlarged section thereof.
Figure 22:
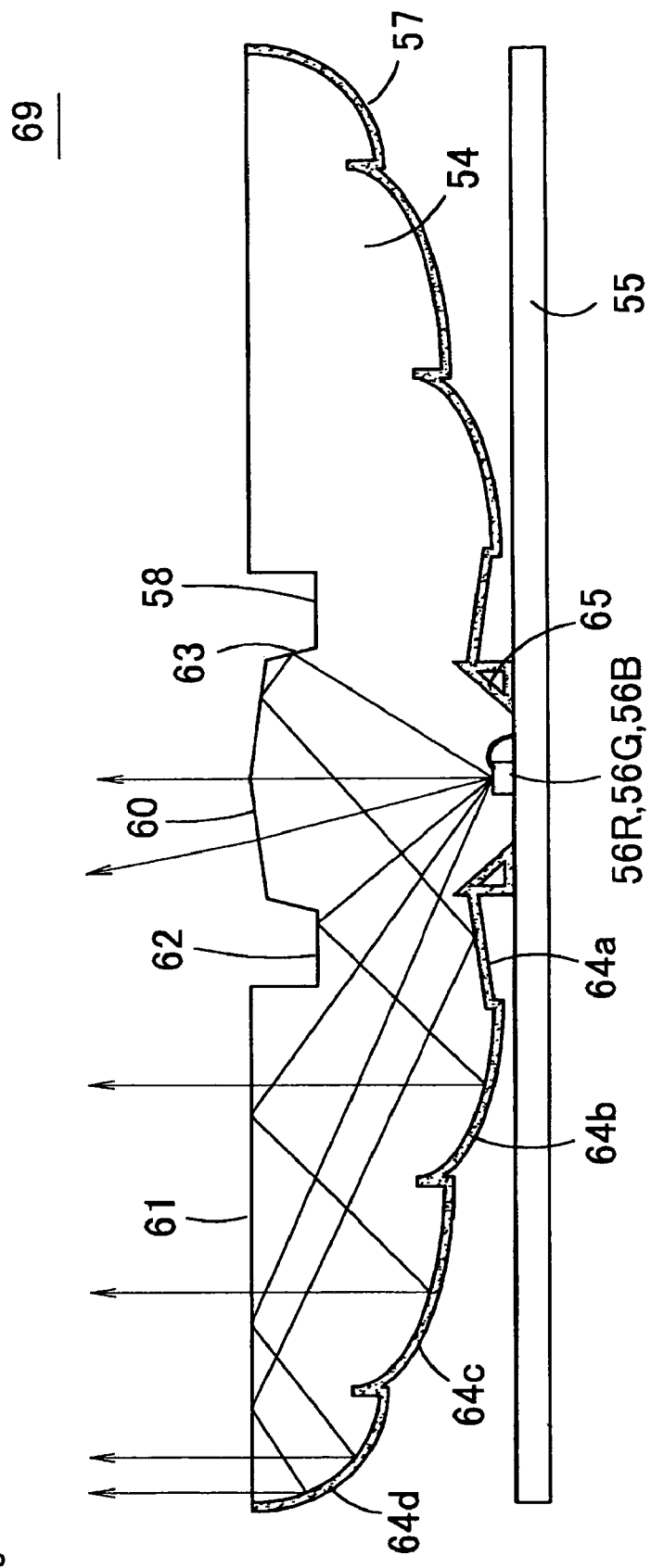
FIG. 22 shows a sectional view of the light emitting source of Embodiment 3 of the present invention in the diagonal direction.

FIG. 21 shows a sectional view of a light emitting source 68 according to Embodiment 2 of the present invention and a partial enlarged view thereof. In the light emitting source 68, toric channel 58 is depressed and installed between the direct output area 60 and the total reflection area 61, thus forming a slope total reflection area 63 along the sides of the inner circumference of the channel 58. In addition, a conically shaped depression 66 is depressed and installed in the central part of the direct output area 60, forming a slope total reflection area 67 on the outer circumference of the depression 66.

Thus, in the Embodiment 2, among light outputted from the light emitting devices 56R, 56G, and 56B, light entering the inner slope total reflection area 67 is total reflected sequentially at 3 points of the slope total reflection area 67, the direct output area 60, and the outer slope total reflection area 63. Then, the light total reflected at the slope total reflection area 63 enters the backward sloping reflecting area 64a. Then, the light entering the reflecting area 64a after being total reflected at the total reflection area 61, or directly, enters the reflecting area 64d, is reflected at the reflecting area 64d and outputted forward from the total reflection area 61.

According to the Embodiment 2, the output angle θ2 of the light to be guided to the reflecting area 64d of the corner part will be the output angle of the light to be outputted to the inner slope total reflection area 67 from the light emitting devices 56R, 56G, and 56B. Thus, as light having a smaller output angle θ2 than that of the Embodiment 1 will be outputted from the corner part, brightness of the corner part of the light emitting source 68 and illuminance of the periphery on the target surface can be improved.

Embodiment 3

Fit. 22 shows a sectional view of a light emitting source 69 in the diagonal direction according to Embodiment 3 of the present invention. Although the light emitting source 69 has almost similar structure to Embodiment 1, a direct output area 60 is gently inclined, thus being conically shaped. In the light emitting source 69, similar to Embodiment 1, light outputted from the light emitting devices 56R, 56G, and 56B to the slope total reflection area 63 is total reflected at the slope total reflection area 63, entering the direct output area 60. Then, after being total reflected in the direct output area 60 and reflected at the direct output area 60, the light enters the reflecting area 64d either by being total reflected at the total reflection area 61 or directly, is reflected at the reflecting area 64d, and outputted from the corner part of the light emitting source 69.

Figure 23:
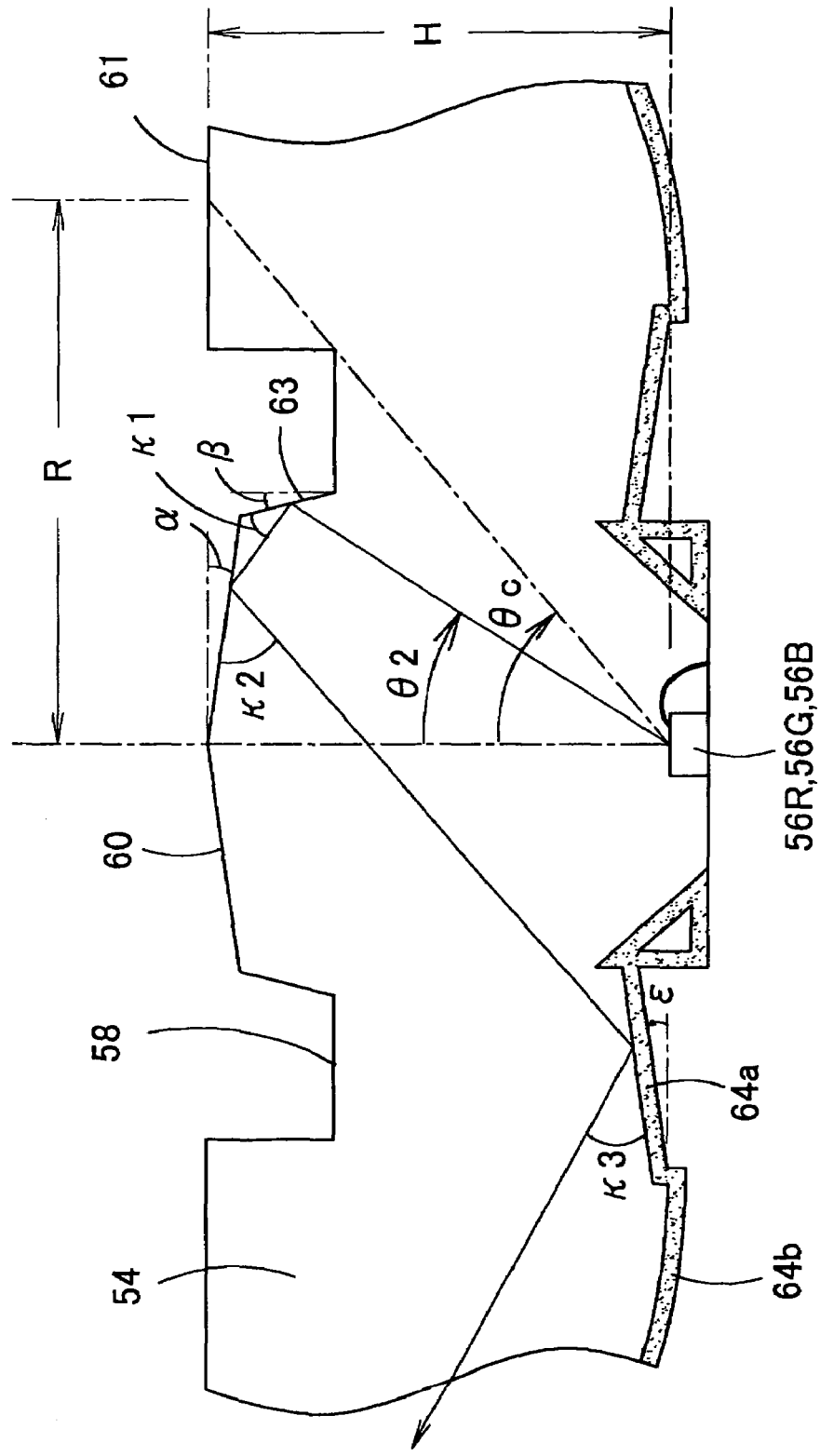
FIG. 23 shows an illustration for describing the design conditions of a slope angle α of a direct output area and inclination β of a slope total reflection area.

Thus, even in such the embodiment, distribution of intensity of the light outputted from the light emitting source 69 (brightness, illuminance) can be equalized across the screen. Yet, in Embodiment 3, as the direct output area 60 is inclined in the section of the light emitting source 69, a direction of reflection of the light reflected in the direct outputted area 60 can be adjusted by adjusting a slope angle (slope angle α as shown in FIG. 23) of the direct output area 60. Hence, degree of freedom in designing the light emitting source 69 will be higher and enables optimum designing for increasing the light intensity at the corner part.

Although we have now described the Embodiments 1 to 3 and the variants thereof, other shapes of the light irradiation surface of the light guiding unit or of the reflecting member, such as those disclosed in the Japan Unexamined Patent Publication No. 2004-189092, can be adopted. Even in such a case, however, it is needless to say that a backward sloping reflecting area (backward slope area) is provided in the vicinity of the central part of the reflecting member, and after being total reflected at the light irradiation surface of the light guiding unit, light outputted with a relatively small output angle from the light emitting devices enters the backward sloping reflecting area, and the light reflected at the backward sloping reflecting area is outputted from the corner part of the light emitting source.

DESIGN EXAMPLES

In the following, taking the Embodiment 3 as an example, we describe specific design examples in the light emitting source of the present invention, following FIG. 23 to FIG. 28. First we describe designing of a reflecting area 64a.

Figure 25:
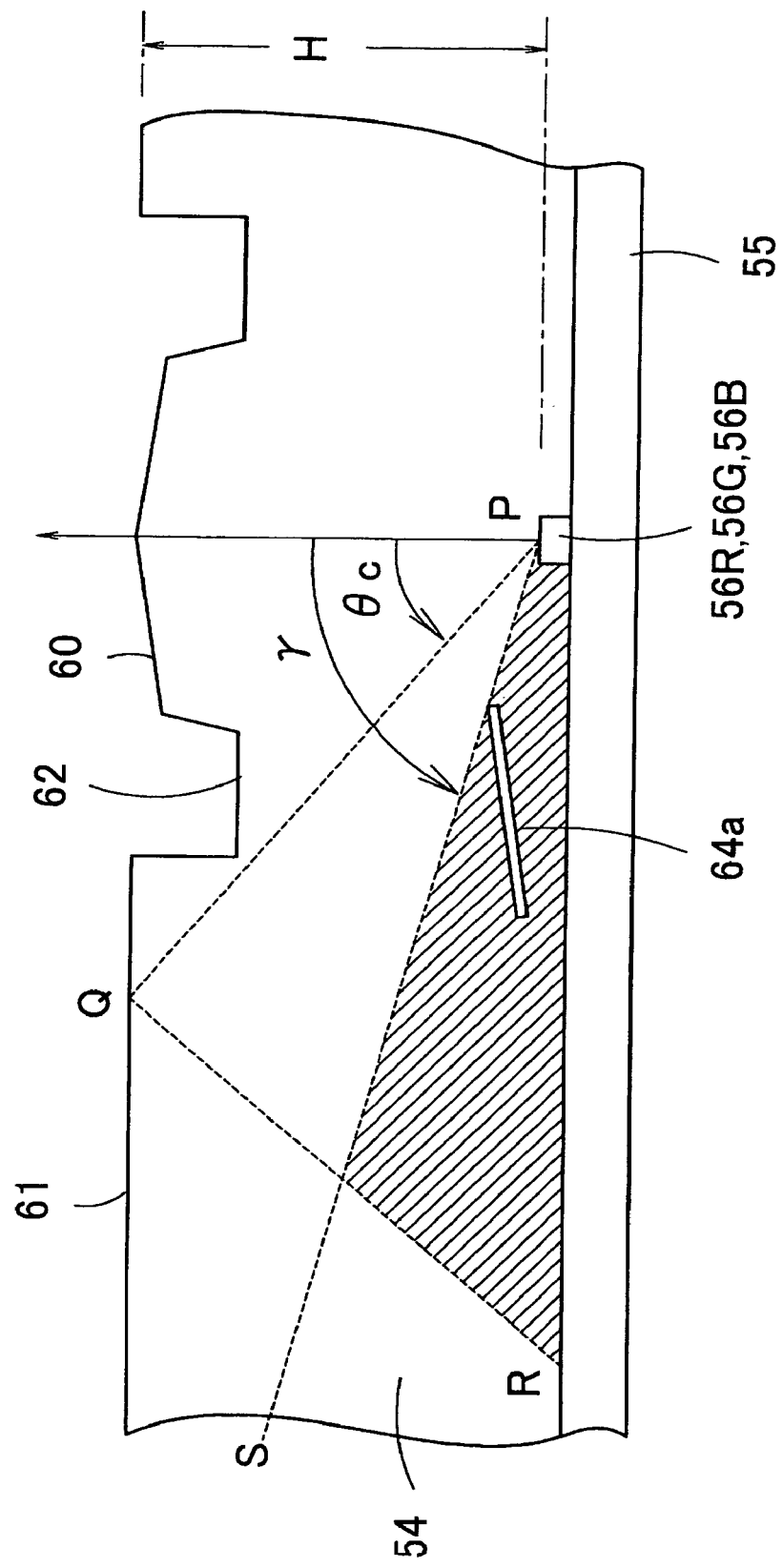
FIG. 25 shows the area in which a backward sloping reflecting area can be arranged.

FIG. 25 shows an area in which a backward sloping reflecting area 64a can be arranged. Assuming that a light emitting point of the light emitting devices 56R, 56G, and 56B is P, that the point where the light outputted with an output angle equal to the critical angle θc from the light emitting point P enters the total reflection area 61 or the total reflection area 62 in the channel 58 is Q, and that the point where the optical axis of the light total reflected at the point Q intersects with the surface of the wiring board 55 is R, the reflecting area 64a must be within the area surrounded by PQR so that the light outputted from the light emitting devices 56R, 56G, and 56B is not blocked from entering the reflecting area 64b after being reflected in the total reflection area 61. In addition, to prevent 64a from shielding light to be fed to the corner part of the light emitting source, when assuming that a distance between the light irradiation surface of the light emitting devices 56R, 56G, and 56B and the front face of the molded unit 54 is H, and that length of a side of the light emitting source (length of a diagonal line) is U, from the light emitting point P of the light emitting devices 56R, 56G, and 56B, $$\gamma = arc\tan(U/2H) \quad (2)$$

the reflecting area 64a should be arranged in the area of the wiring board 55 side rather than the line segment PS drawn to the output angle direction. In addition, if the line segment PS is extended to the side S, it will reach a center of the outer sides of the front face of the light emitting source. Now we consider a line segment PS that connects the light emitting point P with a center of a side of the light emitting source. Although light that directly reaches the corner part of the light emitting source might be shielded by 64a, such light has a large output angle and less intensity, there would be no material influence even if it is blocked in the reflecting area 64a. In effect, the reflecting area 64a should be placed in the shaded area of FIG. 25.

Next, with reference to FIG. 23, we describe the angle range of the slope angle ε of the reflecting area 64a. First, if we measure the slope angle ε from a horizontal direction, to the direction shown in FIG. 23, the reflecting area 64a will be:

$$\epsilon > 0° \quad (3)$$

as it is backward sloping.

Then, we describe specified tolerance of the slope angle ε of the reflecting area 64a. As shown in FIG. 23, we measure the slope angle α of the direct output area 60 ($\geq 0°$) and an inclination β of the slope total reflection area 63 ($\geq 0°$). Then, we assume that the angle that the direction of reflection of the light reflected at the slope total reflection area 63 makes with the slope total reflection area 63 is κ1, the angle that the direction of reflection of the light reflected at the direct output area 60 makes with the direct output area 60 is κ2, and the angle that the direction of reflection of the light reflected at the reflecting area 64a makes with the reflecting area 64a is κ3. Then, as we can see from the ray diagram of FIG. 23, the angle κ3 can be expressed in the following expression.

$$\kappa 3 = 90° - \theta 2 - 2\beta - 2\alpha - \epsilon$$

wherein κ3>0°, and thus, the above expression shall be:

$$\epsilon < 90° - \theta 2 - 2\beta - 2\alpha \quad (4)$$

Thus, from the expressions (3) and (4), we can obtain the angle range of the slope angle ε of the backward sloping reflecting area 64a:

$$0° < \epsilon < 90° - \theta 2 - 2\beta - 2\alpha \quad (5)$$

The above conditions for designing of positions and angles of the reflecting area 64a are also applicable to the Embodiment 1.

Figure 26:
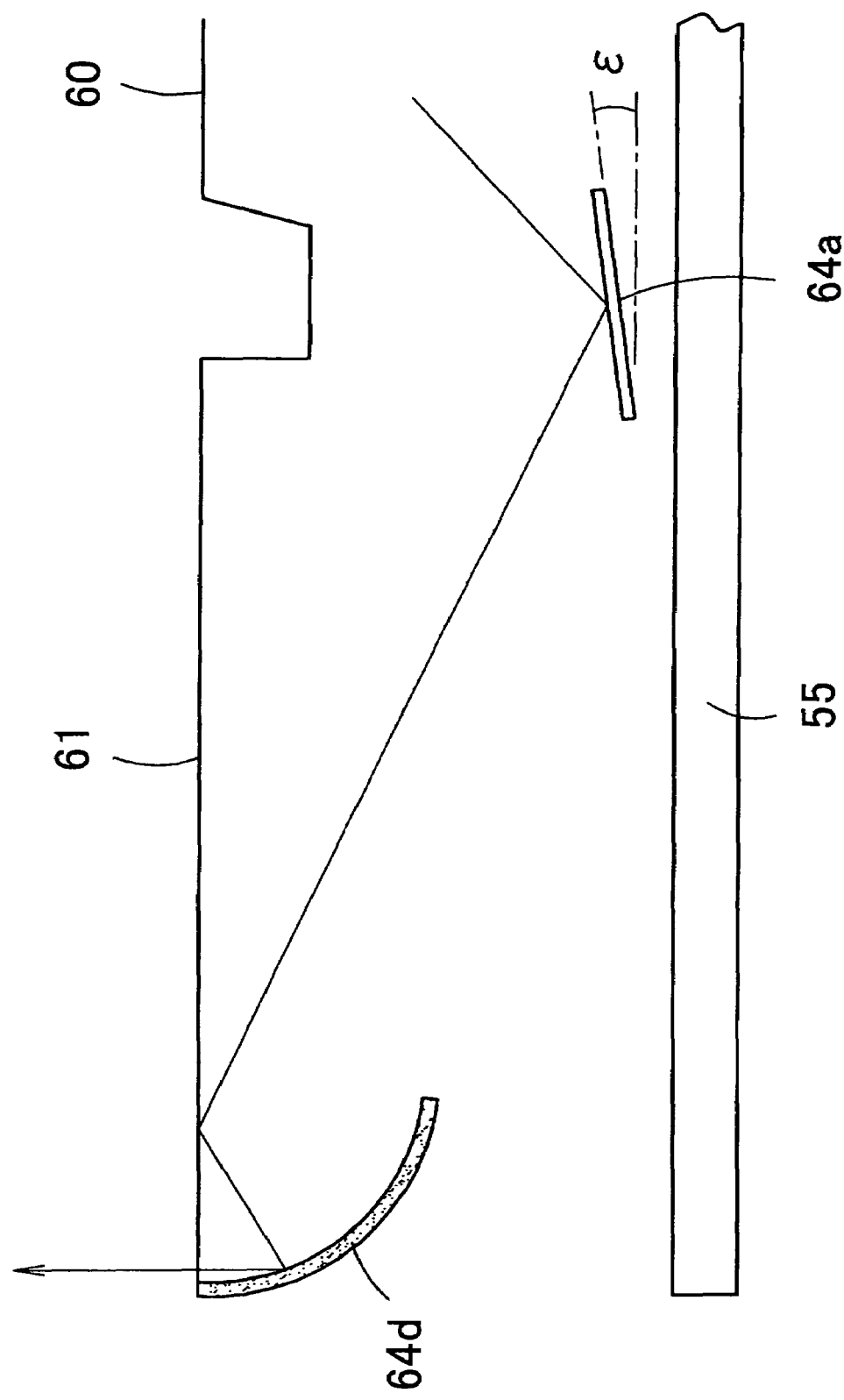
FIG. 26 shows an illustration describing how the direction of light oriented to the corner part from the total reflection area is adjusted by adjusting the slope angle ε of the backward sloping reflection area.
Figure 27:
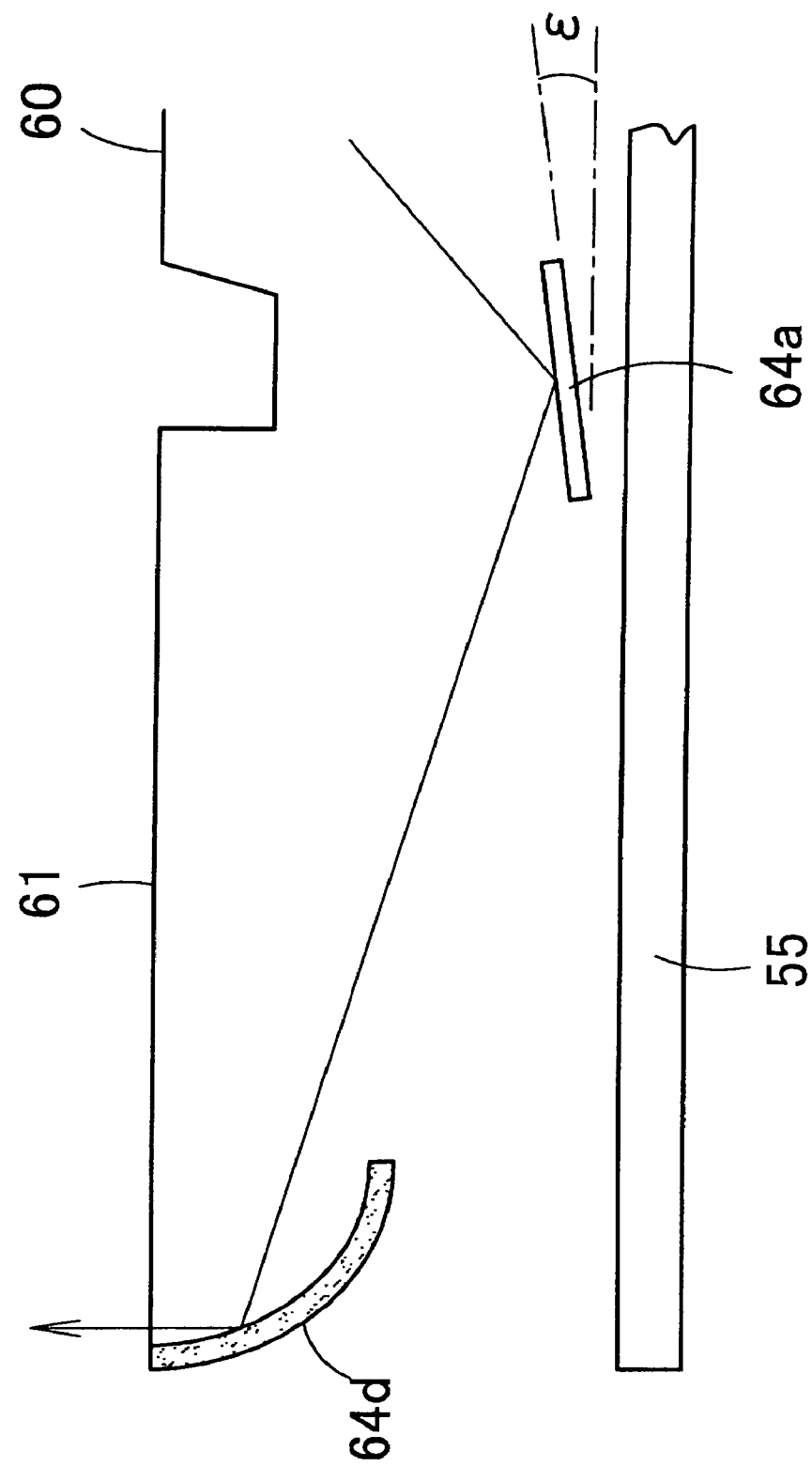
FIG. 27 shows an illustration describing how the direction of light oriented to the corner part is adjusted by adjusting the slope angle ε of the backward sloping reflection area.

The reflecting area 64a may be configured such that, as shown in FIG. 26, after being total reflected in the total reflection area 61, the light that was total reflected in the front face of the molded unit 54 and entered the reflecting area 64a is outputted forward from the corner part by being total reflected in the reflecting area 64d at the corner part or directly fed to the reflecting area 64d at the corner part, as shown in FIG. 27. To this end, as shown in FIG. 26 or FIG. 27, the slope angle ε of the reflecting area 64a shall be an optimal value. This point is similar both in the Embodiments 1 and 2. In addition, the reflecting areas 64b, 64c, and 64d may be a conically shaped surface as described in Embodiment 1.

Next we describe the conditions to be satisfied by the slope angle α of the direct output area 60 and the inclination β of the slope total reflection area 63. Now, we assume that the direct output area 60 and slope total reflection area 63 lie in the area of light flux that is outputted from the light emitting devices 56R, 56G, and 56B with a smaller output angle than the critical angle θc of total reflection. When we express this condition with the mathematical expression, and assume that a distance between the light irradiation surface of the light emitting devices 56R, 56G, and 56G and the surface of the molded unit 54 is H, it follows that the direct output area 60 and the slope total reflection area 63 may be contained in the area in which on the surface of the molded unit 54, a radius from the center of the direct output area 60 is r=H tan θc. However, when we assume that refractive index of the molded unit 54 is n1 and that of the medium (such as air) contacting the front face of the mold 54 is n2, it shall be:

$$\theta c = arc\sin(n2/n1)$$

Next, the condition for the light outputted from the light emitting devices 56R, 56G, and 56B with an output angle θ2 (≦θc) to be total reflected in the slope total reflection area 63 is:

$$90°-\kappa1 \geq \theta c$$

Also, as seen from FIG. 23, as $$\kappa1 = \theta2+\beta$$

we can obtain the following from the above 2 expressions:

$$\beta \leq 90°-\theta2-\theta c \quad (6A)$$

In addition, the condition for the light total reflected in the slope total reflection area 63 to be total reflected also in the direct output area 60 shall be:

$$90°-\kappa2 \geq \theta c$$

Also, as seen from FIG. 23, as $$\kappa2 = 90°-\theta2-2\beta-\alpha$$

we can obtain the following from the above 2 expressions:

$$\beta \geq (-\alpha+\theta c-\theta2)/2 \quad (6B)$$

Furthermore, according to the above expression (5), since $$0° < 90°-\theta2-2\beta-\alpha$$

$$\beta < -\alpha+(90°-\theta2)/2 \quad (6C)$$

Figure 24:
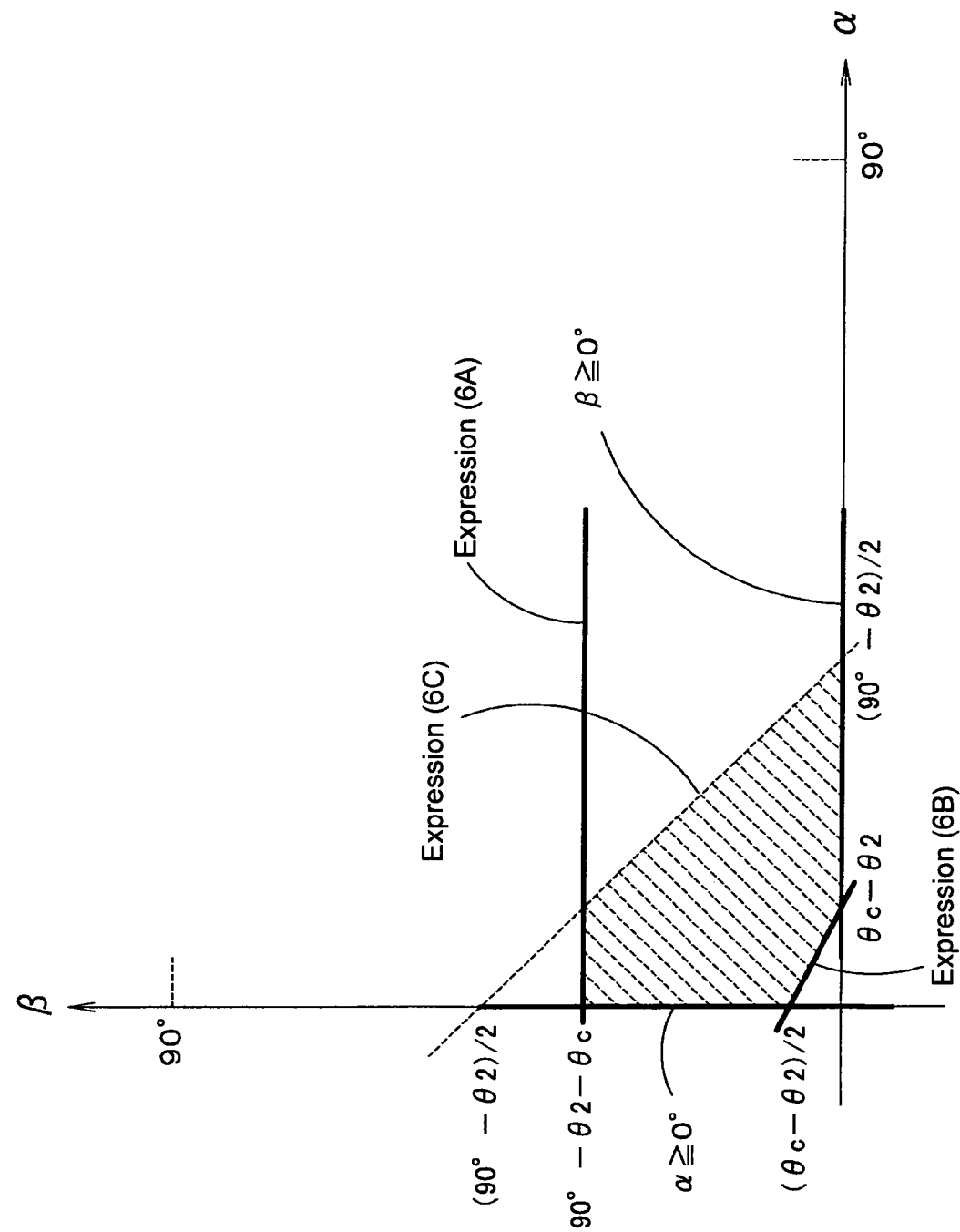
FIG. 24 shows the range on the α-β plane that satisfies the conditions of the expressions (6A), (6B) and (6C).

FIG. 24 shows the range that satisfies these 3 expressions (6A), (6B) and (6C) and the condition of α≧0° and β≧0° in terms of α–β plane. In FIG. 24, the range that satisfies the condition is hatched. Although a positional relationship of lines representative of the expressions (6A), (6B) and (6C) may vary depending on the magnitude of θ2 and θc, FIG. 24 shows as an example the positional relationship of when the design was made assuming θ2=27° to 37°, compared to θc=42.2° to 40.5° when resin having the refractive index of 1.49 to 1.54 is used. Then, $$(\theta c-\theta2)/2 < 90°-\theta2-\theta c < (90°-\theta2)/2$$

Also, in FIG. 24, a border line contained in the range that satisfies the condition is expressed in thick solid line, while a border line not contained in the range that satisfies the condition is expressed in broken line. If we assume α=0° in FIG. 24, it would also be applicable to the Embodiment 1.

Figure 28:
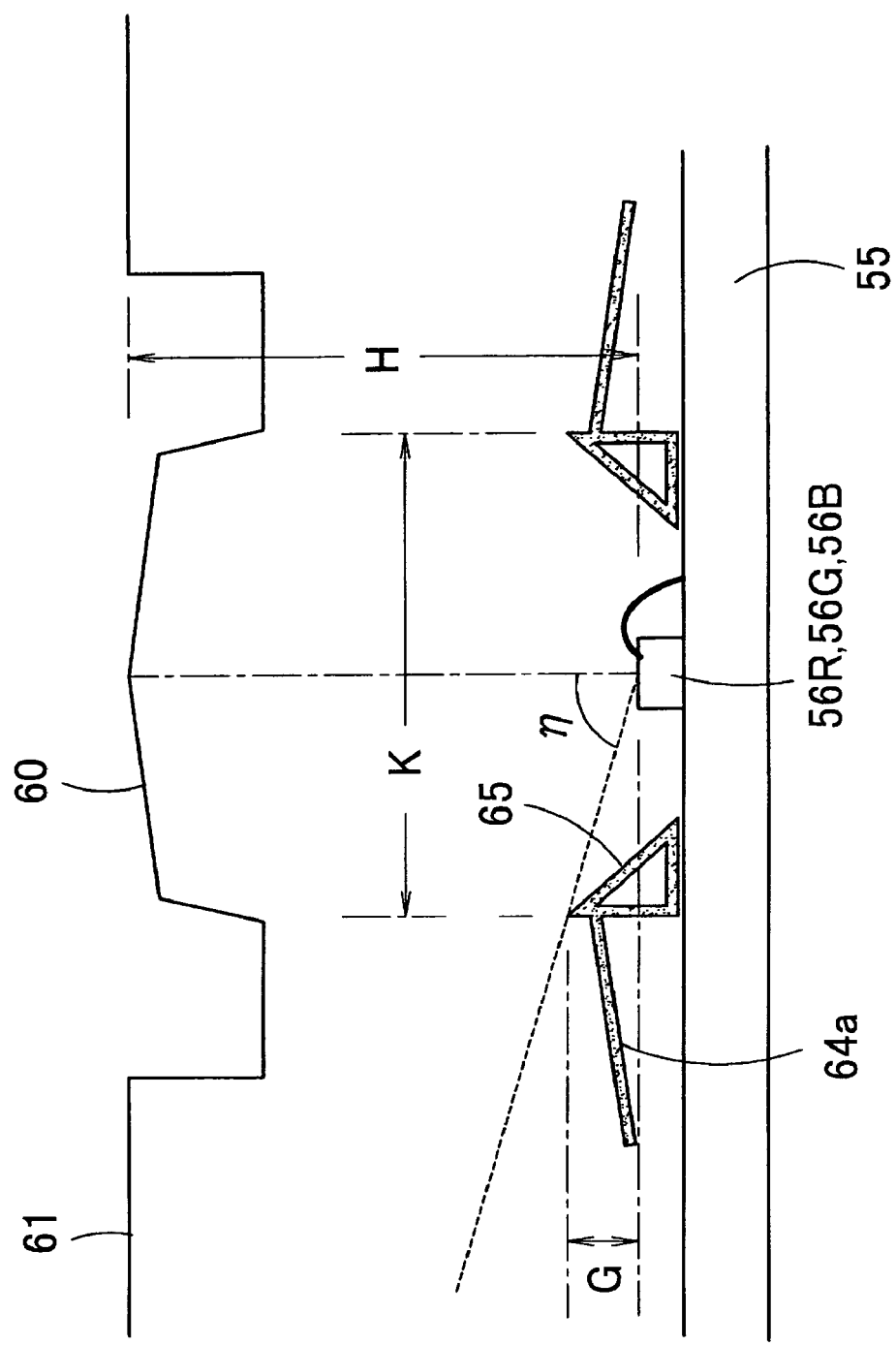
FIG. 28 shows an illustration describing the design conditions of a height of a cup unit.

A cup unit 65 is not only provided to stabilize the reflecting member 57 on the wiring board 55, but also serves to limit the range of the output light. As shown in FIG. 28, we assume that an output angle of the output light passing through the tip of the cup unit 65 is η. Then, if we assume that a diameter of the cup unit 65 is K, and a height difference between the light irradiation surface of the light emitting devices 56R, 56G, and 56B and the tip of the cup unit 65 is G, the above mentioned output angle η shall be:

$$\tan \eta = K/(2G) \quad (7)$$

When the expression (7) is satisfied, light with an output angle greater than η will be shielded at the cup unit 65. Setting the height of the cup unit 65 so that the light that directly reaches an end of the corner part of the light emitting source from the light emitting devices 56R, 56G, and 56B will not be shielded could improve brightness of the corner part of the light emitting source. However, since there is a clearance between the front face of the light emitting source and the reflecting member 57 in the sides of the light emitting source (see FIG. 10), light leaking therefrom into the contiguous light emitting source will increase. As the light leaking into the contiguous light emitting source becomes stray light and degrades the quality of the light emitting source, it would be desirable to reduce such light. At the same time, as the light passing through the vicinity of the tip of the cup unit 65 is light having a large output angle and a small intensity, there would be in fact little material influence on brightness of the corner part even though such the light were shielded. Therefore, it would be desirable to set the height of the cup unit 65 so that it will not shield the light of the output angle that reaches the center of the side among outer circumferential edges of the front face of the light emitting source, while it will shield the light with the output angle that reaches the corner of the corner part of the light emitting source.

For light not to directly reach the corner of the corner part although light directly reaches the center of the side of the outer circumference of the front face of the light emitting source, the following condition should be satisfied:

$$arc\tan(U/2H) \leq \eta \leq arc\tan(T/2H) \quad (8)$$

wherein T is length in the diagonal direction (length of the diagonal line) of the light emitting source when viewed from the front, and U is length of one side of the light emitting source when viewed from the front. This condition applies to the Embodiments 1 and 2.

Variant Examples of Embodiments 1 to 3

In the above Embodiments 1 to 3, a light emitting source array is comprised of planar-like closely arranged square light emitting sources. To closely arrange the light emitting sources, the light emitting source may not be limited to a square, but may be a regular hexagon as shown in FIG. 29A or a regular triangle as shown in FIG. 29B or a rectangle as shown in FIG. 29C. Although, similar to a square light emitting source, a light emitting source in the form of a regular hexagon or a regular triangle may be designed based on a circular light emitting source, it would be desirable that a rectangle light emitting source be designed based on an oval light emitting source.

If the inner circumference of the reflecting area 64d of the corner part is made to be inscribed in the edge of the light emitting source as shown in FIGS. 29A, B and C, light reflected at the reflecting areas 64a and 64d will be outputted only from the corner part. It would be desirable, however, to set a relation of magnitude of inner perimeter of the reflecting area 64d and the contour of the light emitting source through simulations, etc., so that illuminance in a predetermined target surface can be most uniform.

Figure 30A:
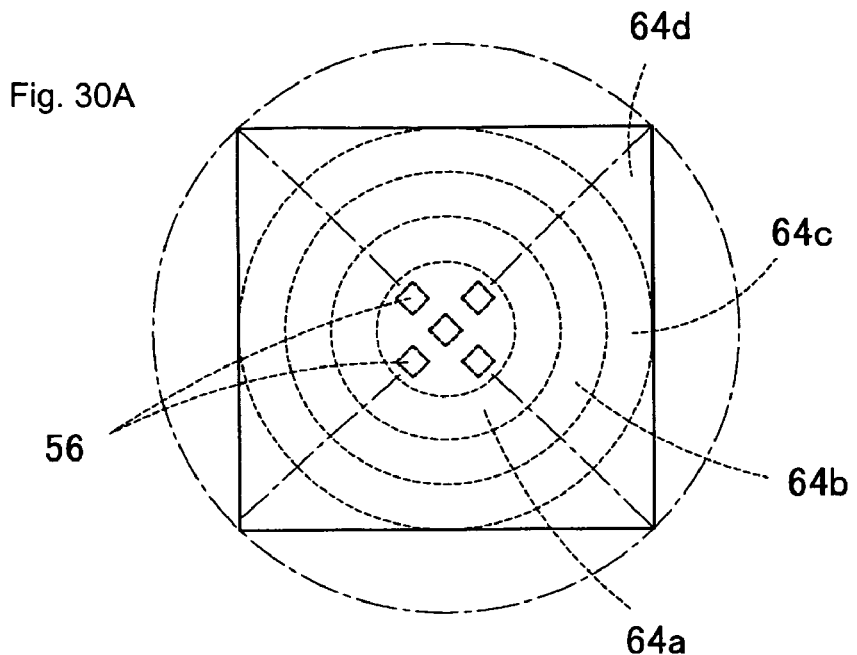
FIGS. 30A, B and C show different variant examples of the light emitting sources.
Figure 30B:
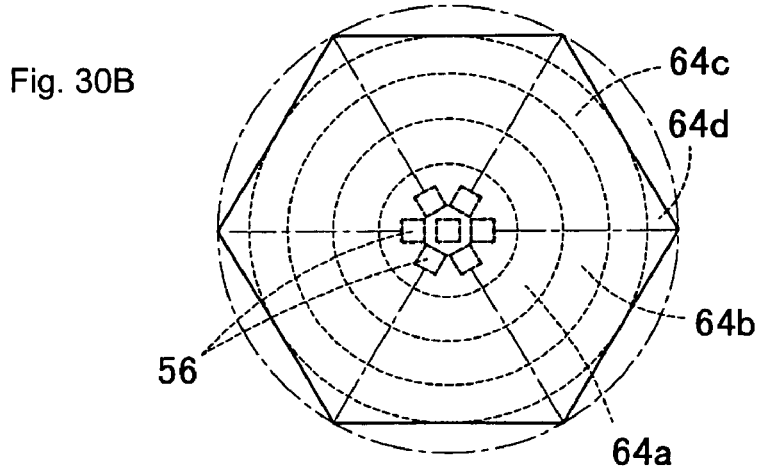
Figure 30C:
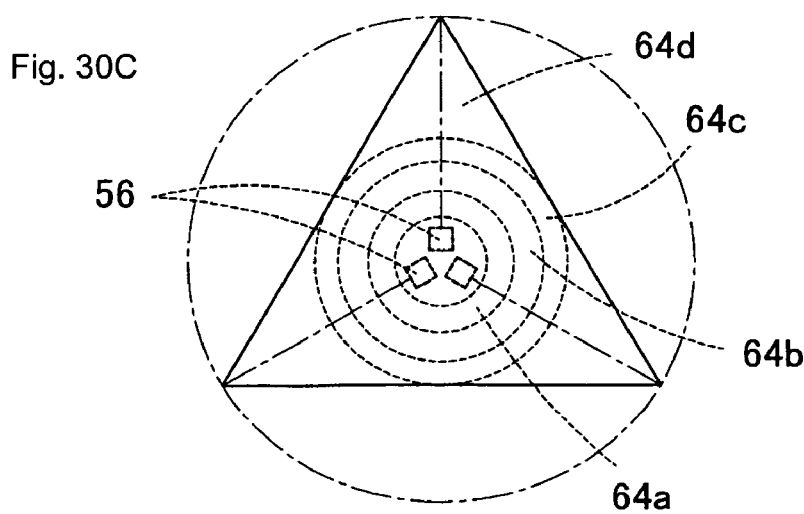

FIGS. 30A, B and C show another variant example of a light emitting source. The variant example is a light emitting source that uses a plurality of light emitting devices 56 wherein respective light emitting devices 56 are arranged in the central area of the light emitting source in its diagonal direction. Although in FIG. 30, the light emitting devices 56 are also arranged in the center of the light emitting source, there may be no light emitting device 56 in the center. The ends of the light emitting source in the diagonal direction are remote from the center and thus light do not reach easily. However, arrangement of the light emitting devices 56 in the diagonal direction of the light emitting source would bring the light emitting devices 56 closer to the end of the light emitting source in the diagonal direction and thus facilitate light to reach easily. Thus, with such the variant example, distribution of intensity of the light emitting source can be more uniform.

In addition, each of the light emitting devices 56 as shown in FIGS. 30A, B and C may be a triplet of red, green and blue LED chips or an individual LED chip of red, green or blue.

In addition, a light reflecting layer or light absorption layer may be formed in the outer circumference face of the light emitting source so that no light will leak from the side to contiguous light emitting source.

Figure 31:
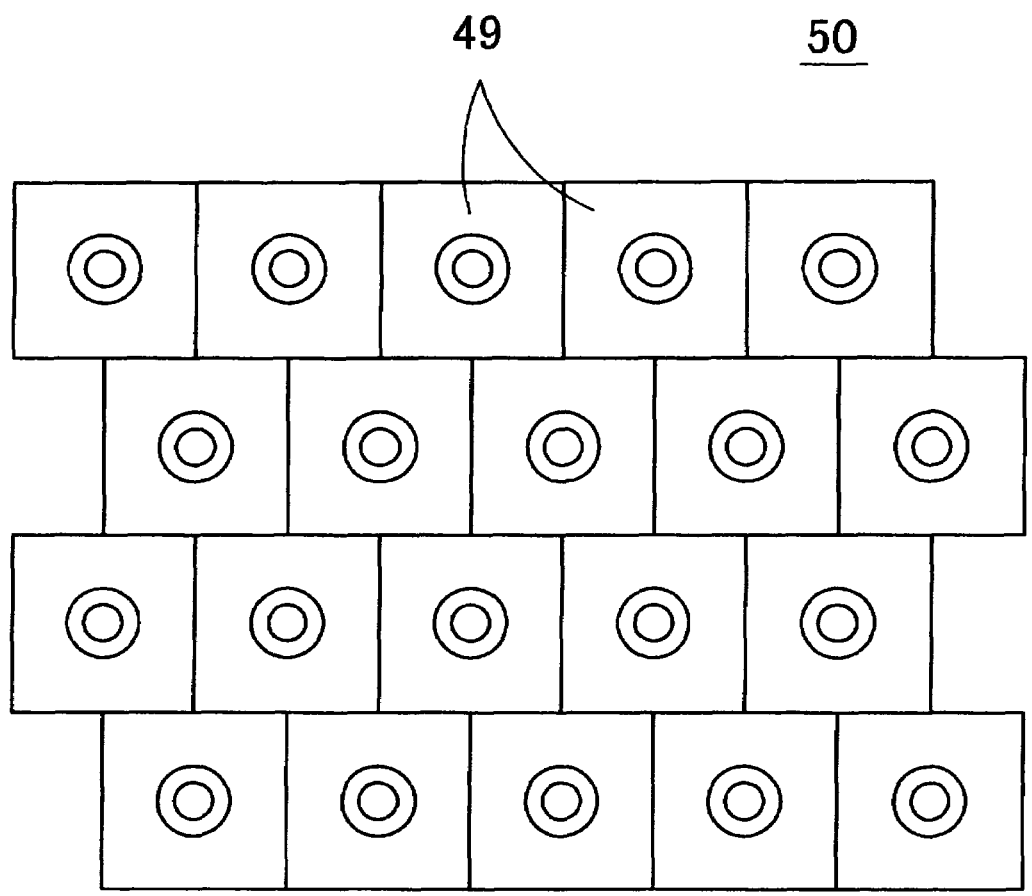
FIG. 31 shows a front view of the variant example of the light emitting source array.

In addition, if square or rectangle light emitting sources are arranged, the light emitting sources 49 may be arranged by displacing each row by a half pitch, such as the light emitting source array 50 shown in FIG. 31.

Embodiment 4

Figure 32:
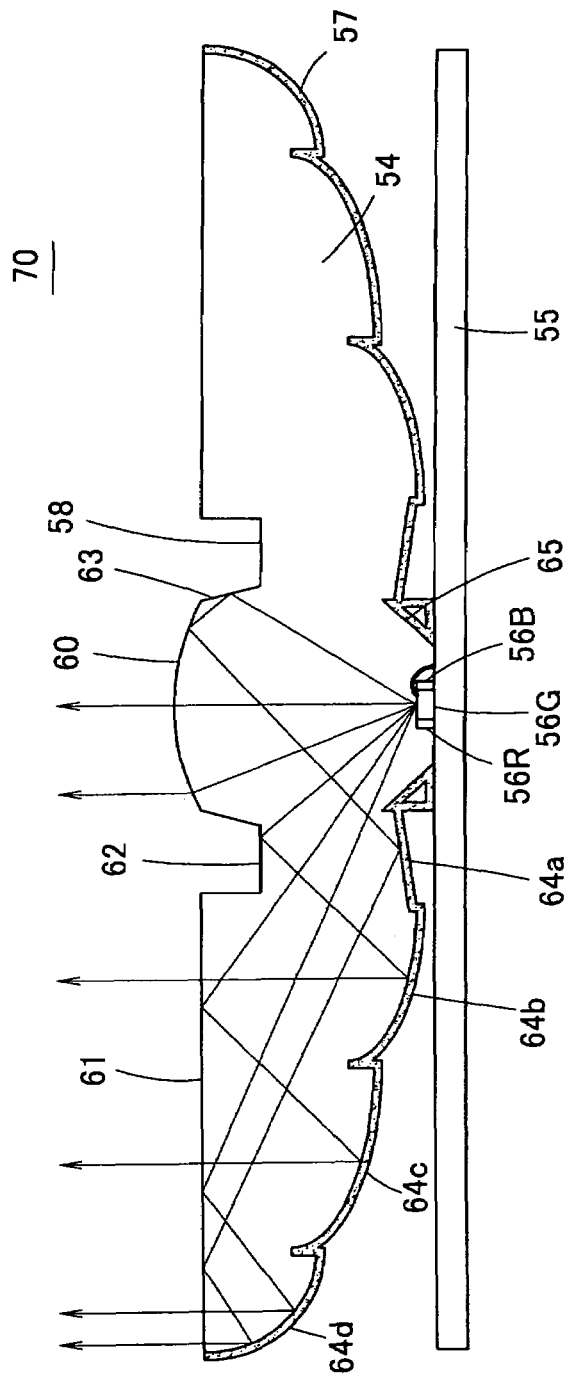
FIG. 32 shows a sectional view illustrating the structure of light emitting sources according to Embodiment 4 of the present invention.

FIG. 32 shows a sectional view of a light emitting source 70 according to Embodiment 4 of the present invention. In this light emitting source 70, the direct output area 60 is curved spherically. If the direct output area 60 is planar as with the Embodiment 1, and if the direct output area 60 is relatively wide, light to be outputted from the edge of the direct output area 60 will be outputted diagonally forward with a large output angle. Thus, in the case of Embodiment 1, even if brightness on the surface of the light emitting source is uniform, uniformity of illuminance on the target surface might degrade since illuminance is lowered at the part opposing to the outer circumference of the direct output area 60 on the predetermined target surface.

Figure 33A:
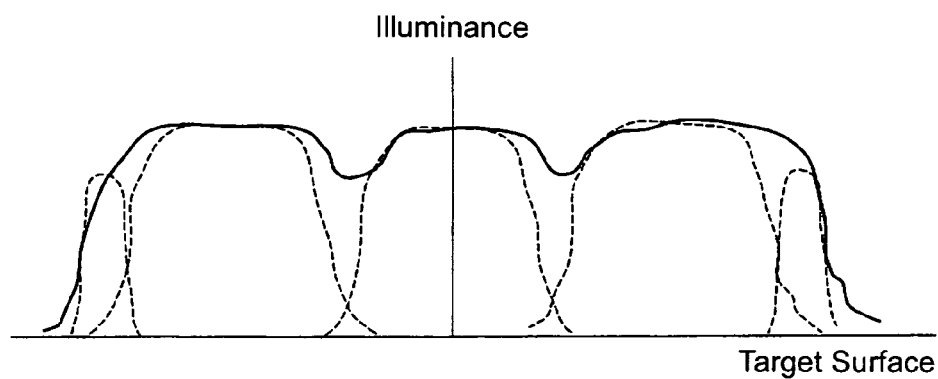
FIG. 33A shows distribution of illuminance on a predetermined target surface in the light emitting sources according to Embodiment 4.
Figure 33B:
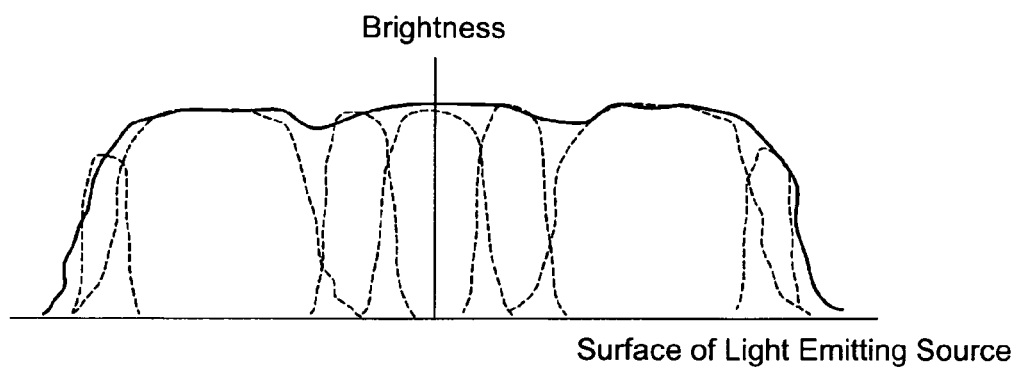
FIG. 33B shows distribution of brightness on the surface of the light emitting sources according to Embodiment 4.

At the same time, in the light emitting source 70 of Embodiment 4, as the direct output area 60 is curved, light to be outputted from the entire direct output area 60 focuses forward due to the lens action of the curved direct output area 60, which consequently alleviates degradation of uniformity of the illuminance. FIG. 33B shows distribution of brightness on the surface of the light emitting source 70, and FIG. 33A shows distribution of illuminance in the predetermined target surface (i.e., the target surface located 30 mm from the surface of the light emitting source). The uniformity of brightness and illuminance has been improved, and in particular, uniformity of illuminance has been improved substantially.

Figure 34:
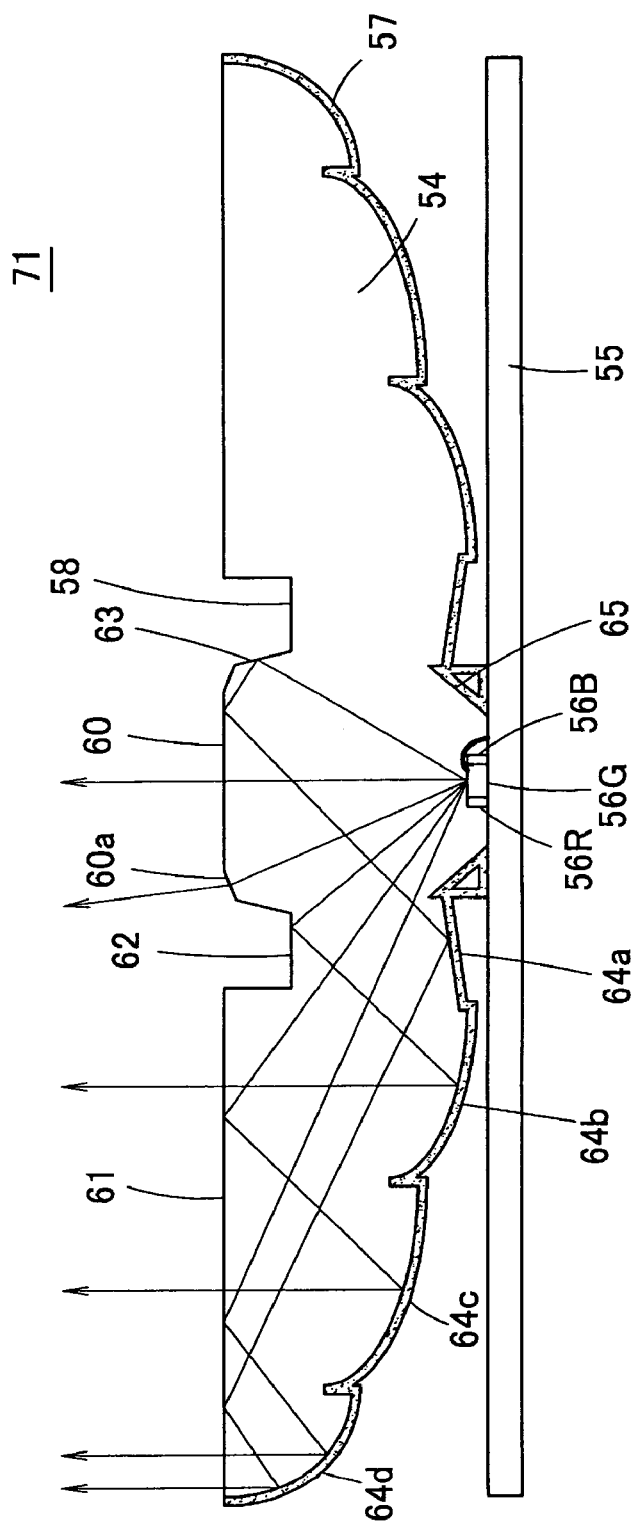
FIG. 34 shows a sectional view illustrating the structure of light emitting sources according to the variant example of Embodiment 4 of the present invention.

FIG. 34 shows a sectional view of the light emitting source 71 according to the variant example of Embodiment 4. In this light emitting source 71, rather than curving the direct output area 60, the outer circumference edge of the direct output area 60 is chamfered, and the inclined, chamfered unit 60a is provided. Provision of the chamfered unit 60a in the outer circumference edge of the direct output area 60 would collect light outputted from the outer circumference edge of the direct output area 60 forward, thus improving uniformity of brightness and illuminance, similar to the light emitting source 70 of Embodiment 4.

Embodiment 5

Figure 35:
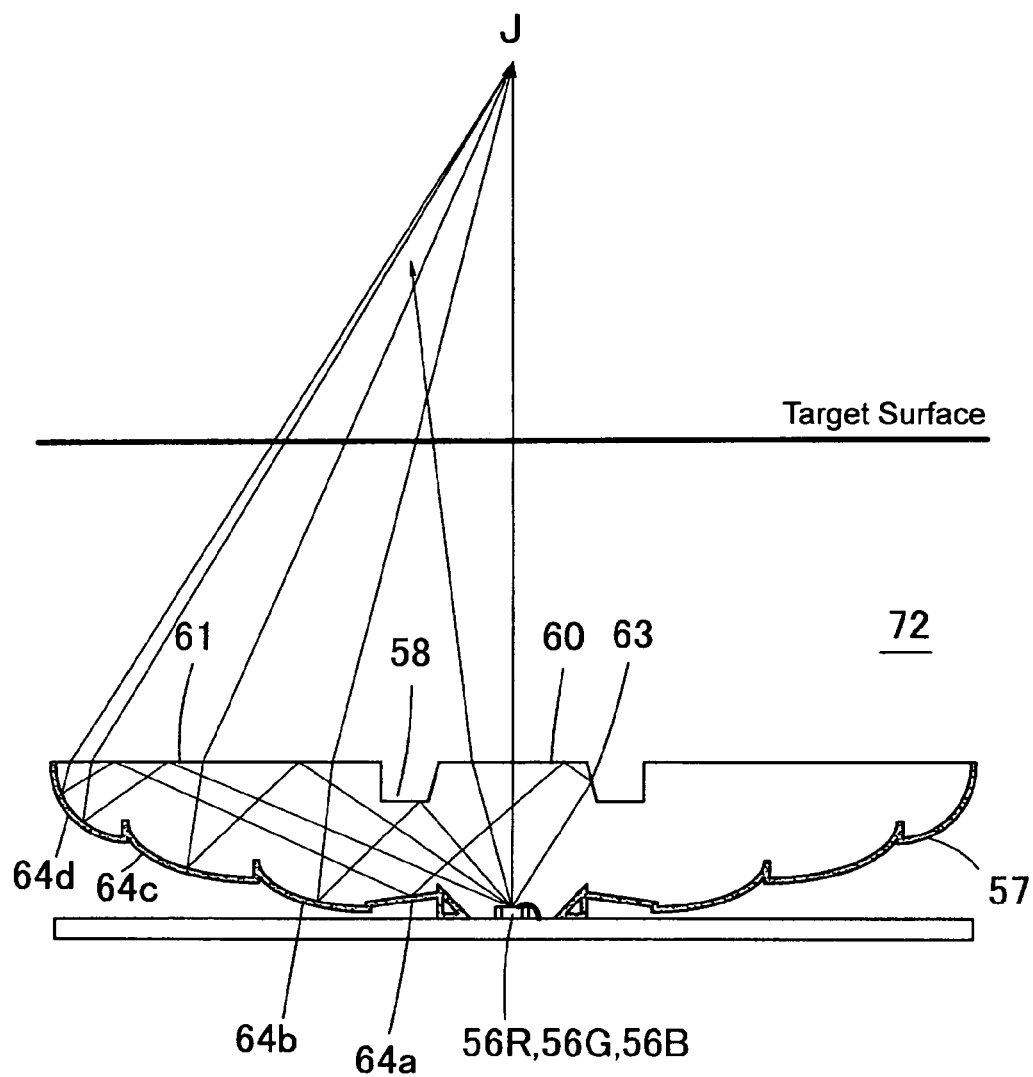
FIG. 35 shows a sectional view illustrating the structure of light emitting sources according to Embodiment 5 of the present invention.

FIG. 35 shows a sectional view of the light emitting source 72 according to Embodiment 5 of the present invention. Although uniformity of brightness and illuminance could be improved with the light emitting sources 70, 71 according to Embodiment 4 or the variant example thereof, the uniformity has limits as seen from FIGS. 33A and B.

In the light emitting source 72 according to Embodiment 5, the reflecting areas 64b to 64d of the reflecting member 57 have light-harvesting feature, and after being reflected at the reflecting areas 64b to 64d, light outputted from the light emitting source 72 is caused to converge at a point J set more remote than the predetermined target surface.

Figure 36A:
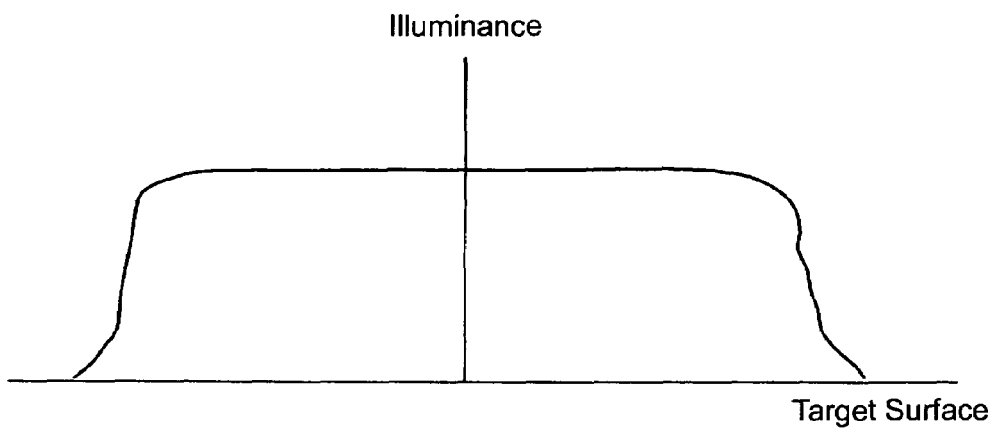
FIG. 36A shows distribution of illuminance on a predetermined target surface in the light emitting sources according to Embodiment 5.
Figure 36B:
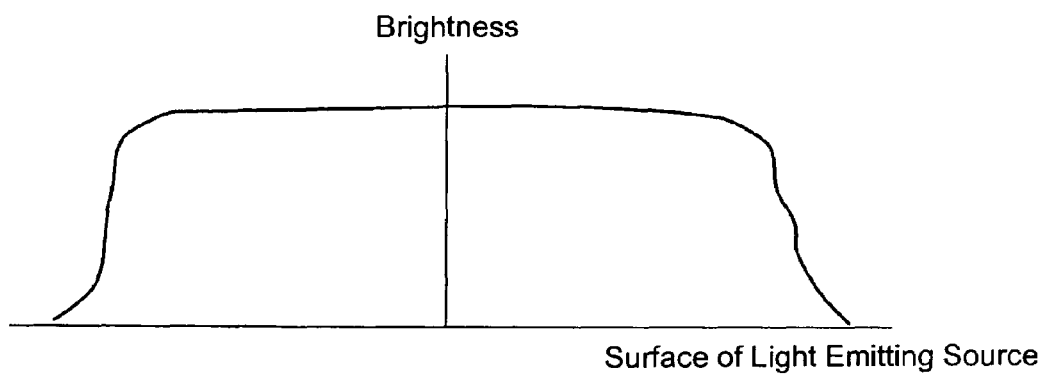
FIG. 36B shows distribution of brightness on the surface of the light emitting sources according to Embodiment 5.

FIG. 36B shows distribution of brightness on the surface of the light emitting source 72, and FIG. 36A shows distribution of illuminance on the predetermined target surface (i.e., the target surface located 30 mm from the surface of the light emitting source). As can be seen by comparing this with FIG. 33, with the light emitting source 72 of Embodiment 5, uniformity of brightness and illuminance has dramatically improved, and distribution of brightness and illuminance has almost flattened.

Embodiment 6

Figure 37:
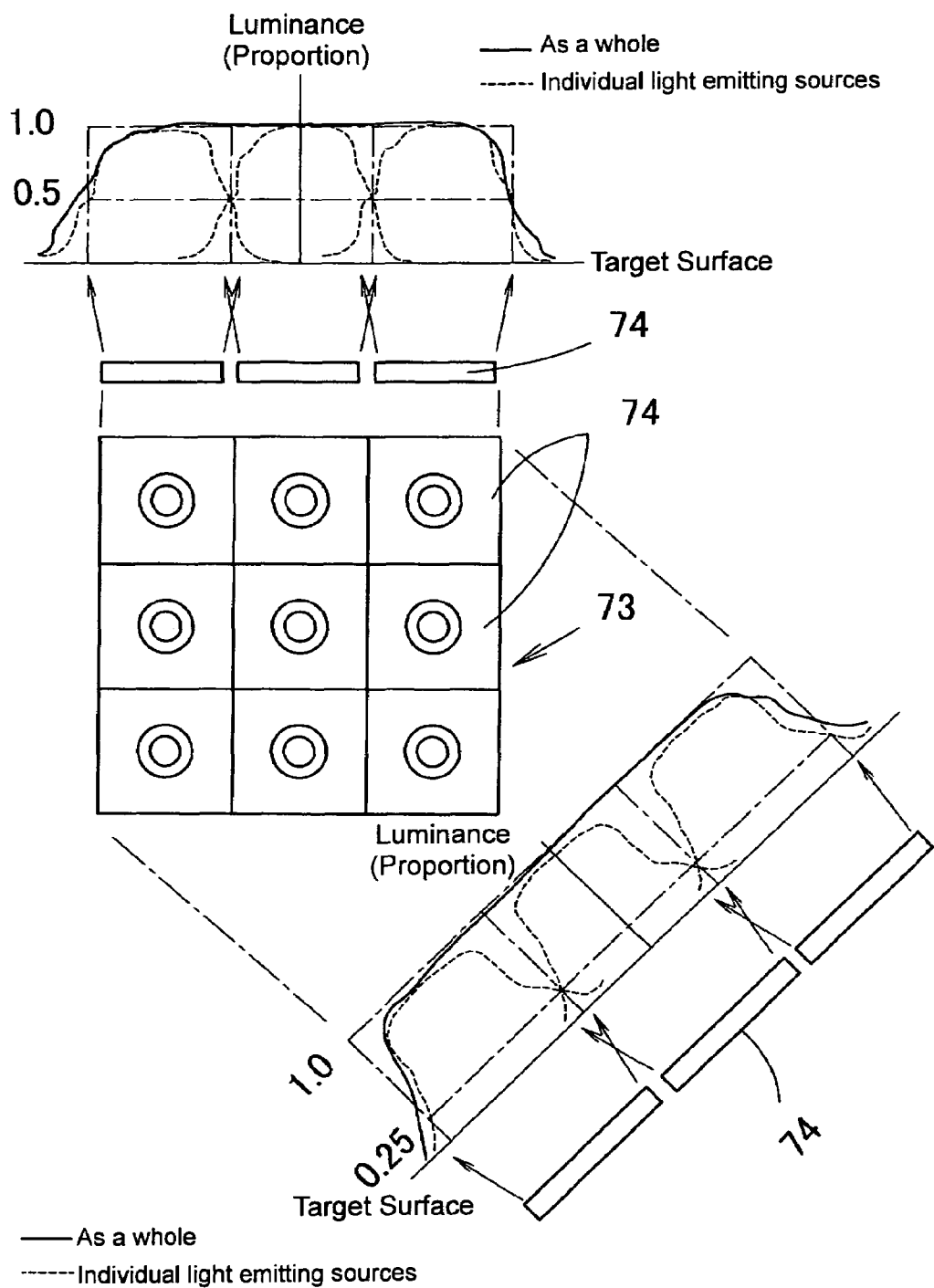
FIG. 37 shows a light emitting source array according to Embodiment 6 of the present invention, distribution of luminance on a target surface in a direction parallel to the side, and distribution of luminance on a target surface in a diagonal direction.

FIG. 37 shows a top view illustrating a light emitting source array 73 according to Embodiment 6 of the present invention, wherein distribution of luminance (illuminance on a predetermined target surface) in a direction parallel to the side and distribution of luminance (illuminance on a predetermined target surface) in a diagonal direction are represented. In the single light emitting source 74 used in this light emitting source array 73, a proportion of luminance (illuminance) Wa at a position opposed to the central area of the light emitting source 74 on the predetermined target surface, luminance Wb at a position opposed to the center of each side, and luminance Wc at a position opposed to the corner in the diagonal direction shall be:

$$Wa:Wb:Wc=1.0:0.5:0.25 \quad (9)$$

Respective light emitting sources 74 are arranged closely with no space therebetween. In other words, in a direction parallel to the side of the light emitting source 74, as shown in FIG. 37, distribution curve of luminance of the light emitting source 74 on the target surface overlaps at a position where the proportion of luminance is 0.5, and as a result, in the direction parallel to the side, uniform luminance is achieved for the light emitting source array 73 as a whole. Similarly, in the diagonal direction of the light emitting source 74, distribution curve of luminance of the light emitting source 74 on the target surface overlaps at a position where the proportion of luminance is 0.25, as shown in FIG. 37, and as a result, even in the diagonal direction, uniform luminance is achieved for the light emitting source array 73 as a whole. Hence, in designing a square light emitting source 74, it would be desirable to design so that the proportion of luminance on the target surface will be a value of the expression (9) above.

In addition, in the case f a light emitting source array wherein regular hexagonal light emitting sources are closely arranged, a proportion of luminance (illuminance) Wa of the target surface at a position opposed to the central area of the light emitting source, a proportion of luminance Wb at a position opposed to the center of each side and luminance Wc at a position opposed to the corner in the diagonal direction shall be:

$$Wa:Wb:Wc=1.0:0.5:0.33$$

Then, a light emitting source array having uniform luminance on the target surface can be fabricated.

In addition, in the case of a light emitting source array wherein regular triangle light emitting sources are closely arranged, a proportion of luminance (illuminance) Wa of the target surface at a position opposed to the central area of the light emitting source, luminance Wb at a position opposed to the center of each side, and luminance Wc at a position opposed to the corner in the diagonal direction shall be:

$$Wa:Wb:Wc=1.0:0.5:0.17$$

Thus, a light emitting source array having uniform luminance on the target surface can be fabricated.

In addition, if uniformity of luminance of the light emitting source array of ±20% can be allowed, the proportion of luminance in the square light emitting source may be:

Wa:Wb:Wc=1.0:0.4 to 0.6:0.2 to 0.3

Under the same condition, the proportion of luminance of the regular hexagonal light emitting source may be:

Wa:Wb:Wc=1.0:0.4 to 0.6:0.26 to 0.4

And that of the regular triangle light emitting source may be:

Wa:Wb:Wc=1.0:0.4 to 0.6:0.13 to 0.2

Embodiment 7

Figure 38:
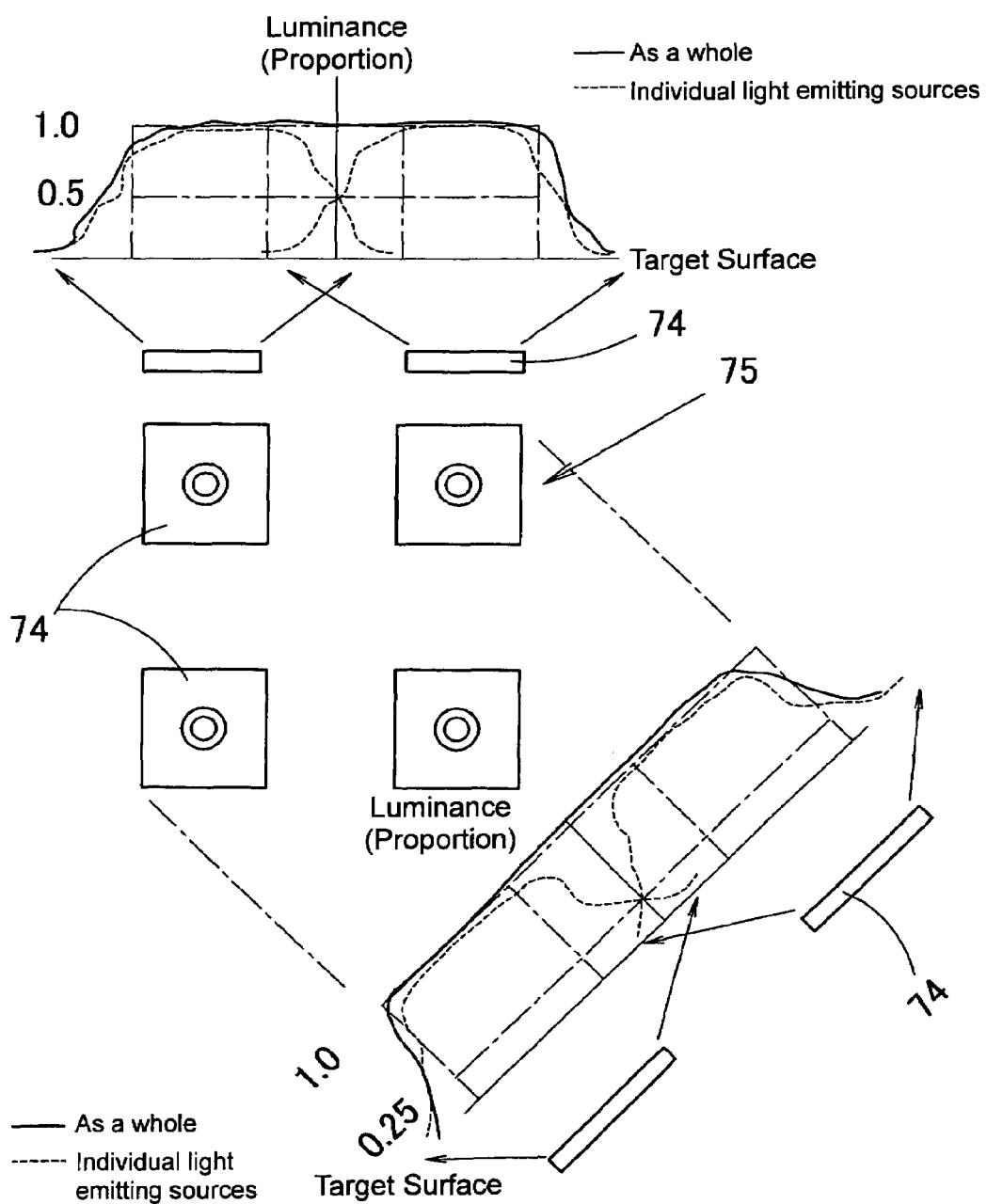
FIG. 38 shows a light emitting source array according to Embodiment 7 of the present invention, distribution of luminance on a target surface in a direction parallel to the side, and distribution of luminance on a target surface in a diagonal direction.

FIG. 38 shows a top view illustrating a light emitting source array 75 according to Embodiment 7 of the present invention, wherein distribution of light intensity in a direction parallel to the side and distribution of light intensity in a diagonal direction are represented. As shown in FIG. 38, although light emitting sources 74 may be arranged with a space between each other, in which case a light emitting source having wide spread of outputted light (angle of beam spread) is used. And, as shown in FIG. 38, in a direction parallel to the side of the light emitting source 74, respective light emitting sources 74 are arranged so that the position whose luminance is 0.5 times as much as the luminance Wa at the central part of the light emitting source 74 is located in the middle of a clearance between adjacent light emitting sources 74. In addition, in the diagonal direction of the light emitting source 74, respective light emitting sources 74 are arranged so that the position whose luminance is 0.25 times as much as the luminance Wa at the central part of the light emitting source 74 is located in the middle of a clearance between adjacent light emitting sources 74 in the diagonal direction. Arrangement of the light emitting sources 74 in this manner allows overall luminance of the light emitting source array 75 in which the light emitting sources 74 are arranged with a space therebetween to be equalized.

In addition, in the case of the light emitting source array in which regular hexagonal light emitting sources are arranged with a space therebetween, in the direction parallel to the side of the light emitting source, respective light emitting sources may be arranged so that the position whose luminance is 0.5 times as much as luminance Wa at the central part of the light emitting source is located in the middle of a clearance between adjacent light emitting sources. In addition, in the diagonal direction of the light emitting sources, respective light emitting sources may be arranged so that the position whose luminance is 0.33 times as much as luminance Wa at the central part of the light emitting sources is located in the middle of a clearance between adjacent light emitting sources in the diagonal direction.

Similarly, in the case of the light emitting source array in which regular triangle light emitting sources are arranged with a space therebetween, in the direction parallel to the side of the light emitting source, respective light emitting sources may be arranged so that the position whose luminance is 0.5 times as much as luminance Wa at the center of the light emitting source is located in the middle of a clearance between the adjacent light emitting sources. In addition, in the diagonal direction of the light emitting sources, respective light emitting sources may be arranged so that the position whose luminance is 0.17 times as much as luminance Wa at the central part of the light emitting sources is located in the middle of a clearance between adjacent light emitting sources in the diagonal direction.

In addition, if uniformity of luminance of the light emitting source array can be allowed up to ±20%, the proportion of luminance (illuminance) Wa at the central part of the square light emitting source, luminance Wb' of individual light emitting sources in the middle of a clearance between the light emitting sources in the direction parallel to the side of the light emitting sources, and luminance Wc' in the middle of a clearance between the light emitting sources in the diagonal direction may be:

Wa:Wb':Wc'=1.0:0.4 to 0.6:0.2 to 0.3

Under the same condition, the proportion of luminance of the regular hexagonal light emitting source may be:

Wa:Wb':Wc'=1.0:0.4 to 0.6:0.26 to 0.4

And that of the regular triangle light emitting source may be:

Wa:Wb':Wc'=1.0:0.4 to 0.6:0.13 to 0.2

In addition, although circular, elliptical, regular octagonal light emitting sources may be used when the light emitting sources are arranged in spaced manner as with the embodiment, it would be desirable to arrange with a space therebetween using the light emitting sources that can be closely arranged, such as square, rectangle, regular hexagon, etc. in order to make the luminance of the light emitting source arrange uniform.

Embodiment 8

Figure 39:
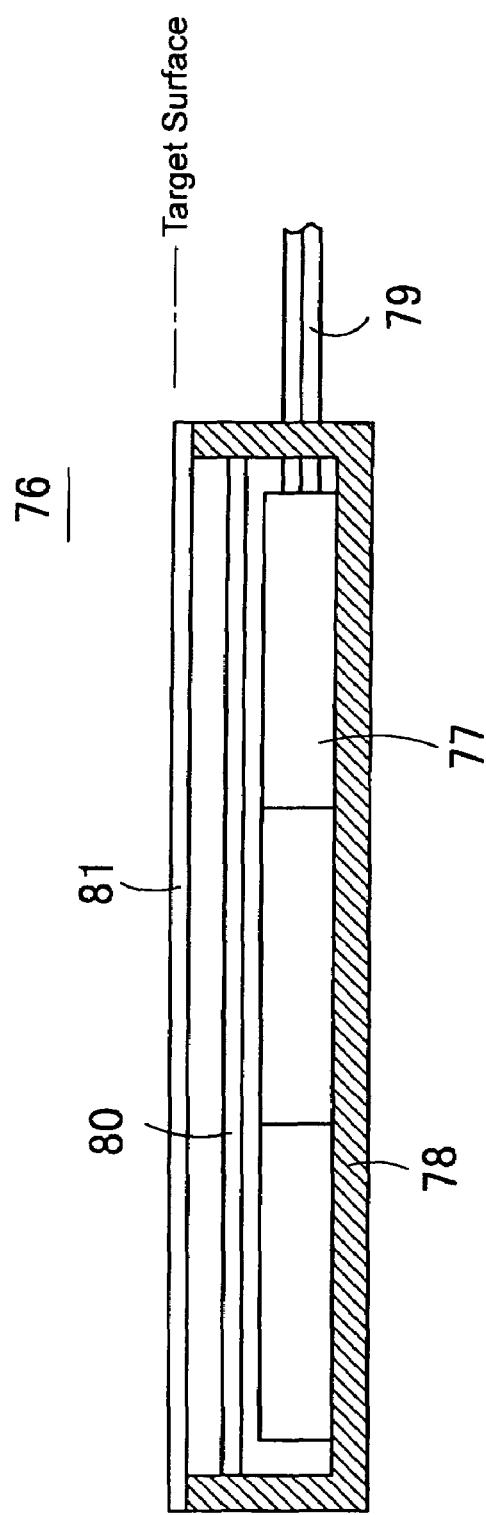
FIG. 39 shows a sectional view of a backlight according to Embodiment 8 of the present invention.

FIG. 39 shows a sectional view of a backlight 76 (illumination system) that uses the light emitting source array of the present invention. This backlight 76 is comprised of the light emitting source array 77 of the invention contained in a casing 78, the light emitting source array 77 being mechanically secured to the inside of the casing 78 by means of screws, etc. To improve light usability, a reflecting member or reflection sheet having good reflectivity may be affixed to the inner surface of the casing 78. Such components for radiating heat as a heat sink or radiating fin may be attached to the rear surface of the casing 78. Direct current is supplied to the light emitting source array 77 through wiring parts 79 such as a lead, a connector, a wiring board, etc. In addition, as many optical components 80, 81 as necessary, such as a transparent plate, a diffusing plate, a prism sheet, a brightness enhancing film, etc. are installed in the interior or top surface of the casing 78.

In addition, in this backlight 76, height of the sidewall of the casing 78 and thickness of the optical component 81 are designed so that the target surface assumed in designing the light emitting source array 77 can match the outer surface of the outmost optical component 81. Thus, in this backlight 76, brightness or illuminance on the outer surface of the optical component 81 is uniform, and in the case of color (display), light of respective colors outputted from red, green and blue LEDs are uniformly mixed. Thus, this backlight 76 can be incorporated in equipment, with the outer surface of the optical component 83 matching the target surface of the equipment, which facilitates incorporation into various types of equipment.

Embodiment 9

Figure 40:
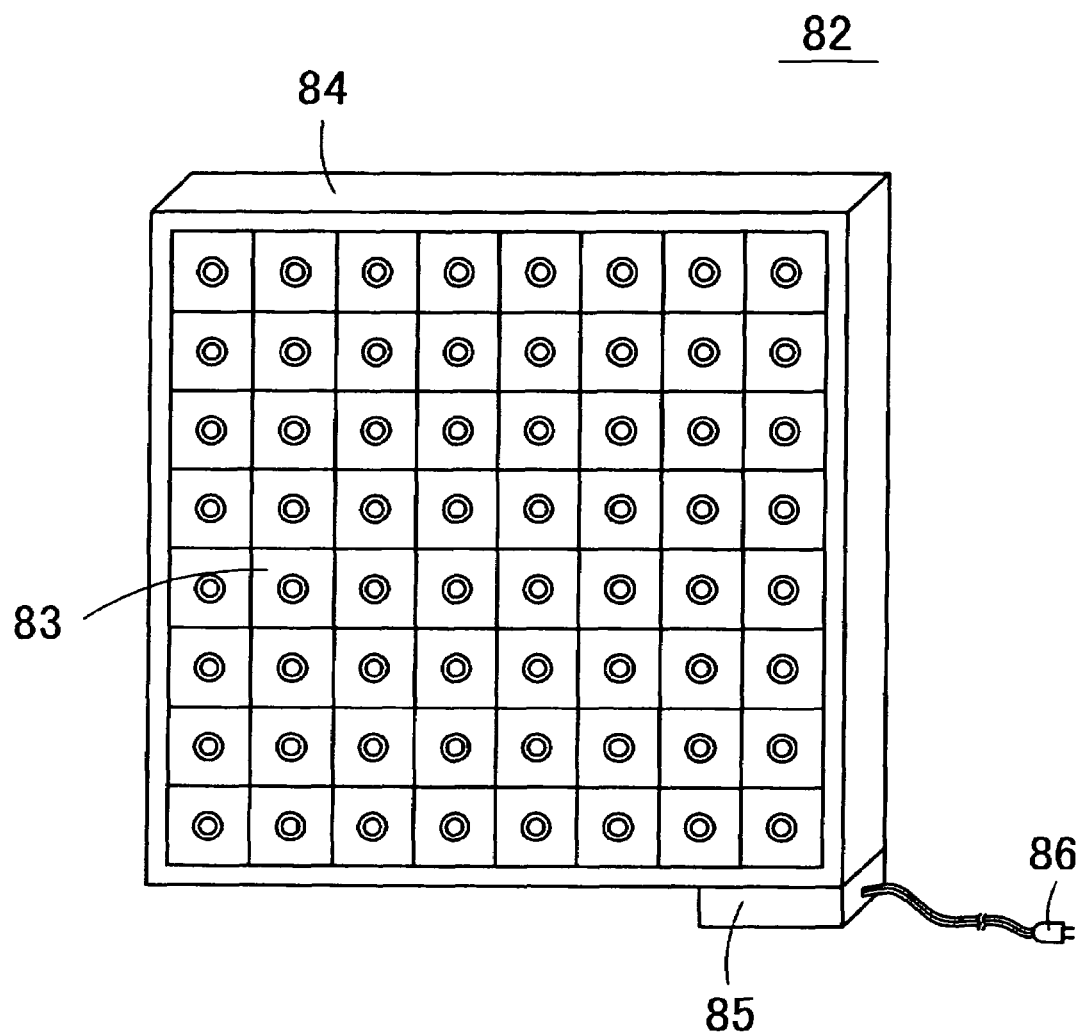
FIG. 40 shows a perspective view of an illumination system for indoor lighting according to Embodiment 9 of the present invention.
Figure 1:
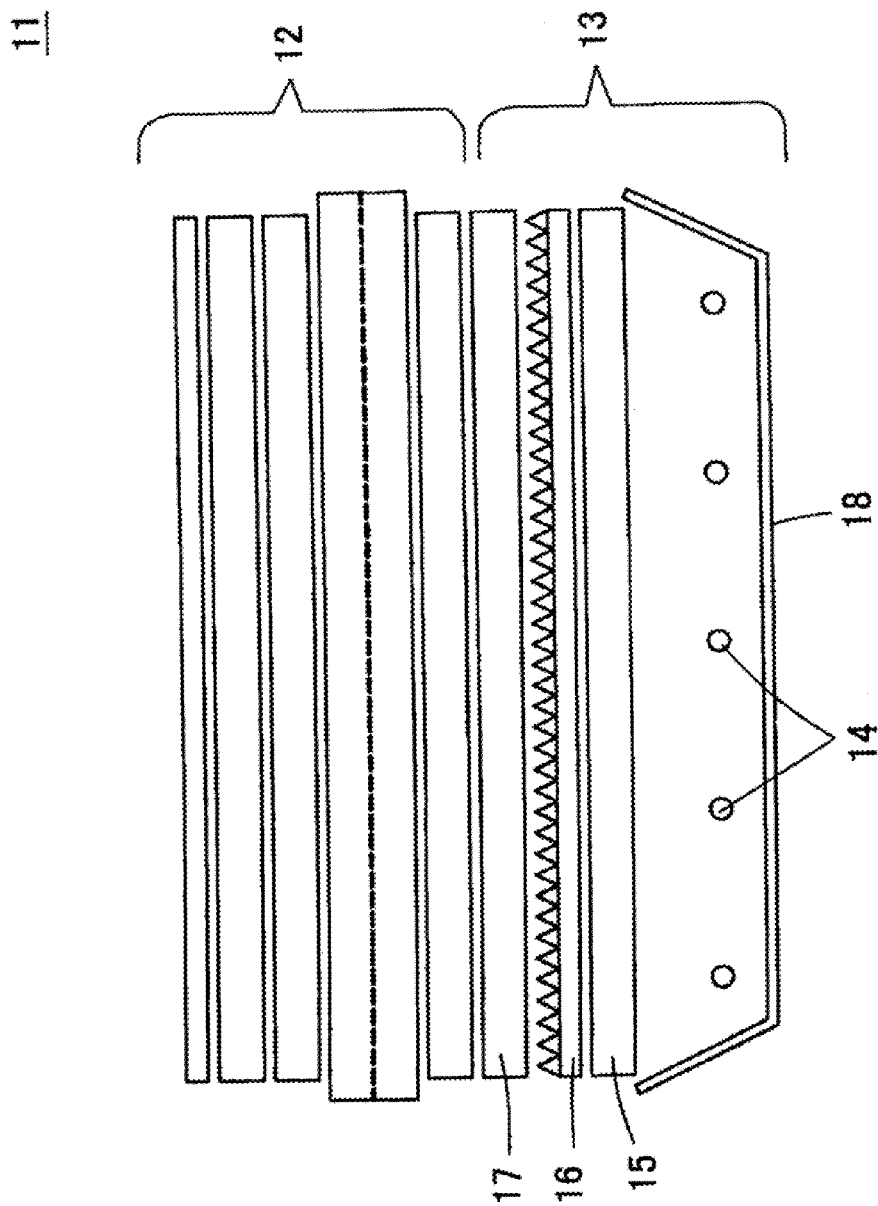

FIG. 40 shows a perspective view of an illumination system 82 for indoor lighting that utilizes the light emitting source array of the present invention. The illumination system 82 is comprised of the light emitting source array 83 of the present invention contained in the housing 84 to which a power supply unit 85 is attached. When the system is switched on by inserting a plug 86 from the power supply unit 85 into the outlet such as commercial power, alternating power supplied from the commercial power is converted into direct current, by which the light emitting source array 83 emits light. Thus, the illumination system 82 can be used for indoor illumination system of wall mount type, for instance.

What is claimed is:

1. A light emitting source, comprising:
    a reflecting member having an optical axis and a surface for reflecting light and outputting the light forward,
    a light guiding unit arranged on said reflecting surface of the reflecting member, and
    light emitting devices for outputting tight to the light guiding unit, wherein
        the light emitting devices are arranged on an optical axis of the reflecting member,
        the light guiding unit has a light irradiation surface configured to output to the external the light from the light emitting devices and the light from the light emitting device reflected by the reflecting member,
        a part of the light irradiation surface of the light guiding unit makes a predetermined angle with the optical axis, and is configured to reflect the light from the light emitting devices, and is configured to form the light into a shape that can be oriented in a direction of the reflecting member, and
        the reflecting member comprises a backward slope area which is inclined downward in a direction from the light emitting devices toward an outer circumference of the reflecting member that is configured to reflect the light reflected at a part of the light irradiation surface of the light guiding unit in a direction gradually having a larger angle away from the optical axis and orients the light to a periphery of the light guiding unit remote from the optical axis.

2. A light emitting source according to claim 1, wherein the backward slope area of the reflecting member is inclined so as to edge away from the light irradiation surface of the light guiding unit as moving away from the light emitting devices.

3. A light emitting source according to claim 1, wherein the light reflected at the backward slope area is guided to the periphery of the reflecting member by reflection at the light irradiation surface of the light guiding unit.

4. A light emitting source according to claim 1, wherein the light reflected at the backward slope area is guided to the periphery of the reflecting member.

5. A light emitting source according to claim 1, wherein the light emitting devices comprise more than one light emitting diodes having different luminous colors.

6. A light emitting source according to claim 1, wherein an outline of the reflecting member viewed from the light irradiation direction is a square, rectangle, regular hexagon or regular triangle.

7. A light emitting source according to claim 1, wherein an outline of the reflecting member viewed from the light irradiation direction is a circle or ellipse.

8. A light emitting source, comprising:
    a reflecting member having an optical axis and surface for reflecting light and outputting the light forward,
    a light guiding unit arranged on said reflecting surface of the reflecting member, and
    light emitting devices for outputting light to the light guiding unit, wherein
        the light emitting devices are arranged on an optical axis of the reflecting member,
        the reflecting member comprises a backward slope area which is inclined downward in a direction from the light emitting devices toward an outer circumference of the reflecting member
        the light guiding unit has a light irradiation surface configured to output to the external the light from the light emitting devices and the light from the light emitting device reflected by the reflecting member, and
        the light irradiation surface has
            a first region configured to transmit the light from the light emitting devices and output the light externally from the light guiding unit,
            a second region configured to reflect the light from the light emitting device, orient the light in a direction of the reflecting member, and transmit the light reflected at the reflecting member and output the light externally from the light guiding unit, and
            a third region having a shape configured to reflect with the first region the light that made a predetermined angle with the optical axis and was outputted from the light emitting device, orient the light to the reflecting member, and output the light reflected at the reflecting member externally from the light guiding unit.

9. A light emitting source according to claim 8, wherein in the light irradiation surface of the light guiding unit, the channel is provided between the first region and the second region, the third region is formed on the inclined side on the inner circumferential side of the channel, and the light outputted from the light emitting devices is reflected in the third region and then guided to the reflecting member by being reflected in the first region.

10. A light emitting source according to claim 8, wherein in the light irradiation surface of the light guiding unit, not only the channel is provided between the first region and the second region, but also a conically-shaped depression is formed in the first region, the third region is formed in the inclined side on the inner circumferential side of the channel and the side of the depression, and the light outputted from the light emitting devices is reflected in the third region on the depression and then reflected in the first region, and then guided to the reflecting member by being further reflected in the third region on the side of the channel.

11. A light emitting source according to claim 8, wherein the third region is such arranged that the light outputted from the light emitting devices with a smaller output angle than a critical angle of total reflection on the interface of the light guiding unit is reflected at the third region and then guided to the reflecting member.

12. A light emitting source according to claim 8, wherein the first region protrudes more into the light irradiation side than the surrounding region thereof, and the outer perimeter of the first region is chamfered.

13. A light emitting source according to claim 8, wherein the first region is comprised of a curved surface.

14. A light emitting source according to claim 1, wherein the shape of the reflecting member is configured such that the light outputted from the light irradiation surface after being reflected at the reflecting member converges.

15. A light emitting source according to claim 1, wherein around the light emitting devices is provided a member for limiting an output angle of light to be outputted from the light emitting device.

16. A light emitting source array in which a plurality of light emitting sources are arranged:
    the light emitting source, comprising:
    a reflecting member for reflecting light and outputting the light forward,
    a light guiding unit arranged on a light reflecting surface of the reflecting member, and
    light emitting devices for outputting light to the light guiding unit,
    wherein the light irradiation surface of the light guiding unit has a first region that transmits the light emanating from the light emitting devices and outputs the light externally from the light guiding unit, a second region that reflects the light emanating from the light emitting device, orients the light in a direction to the reflecting member, and transmits the light reflected at the reflecting member and outputs the light externally from the light guiding unit, and a third region whose shape is defined so as to reflect with the first region the light that made a predetermined angle with the optical axis and was outputted from the light emitting device, orient the light to the reflecting member, and output the light reflected at the reflecting member externally from the light guiding unit.

17. A light emitting source array according to claim 16, wherein the light emitting sources are closely arranged.

18. A light emitting source array according to claim 16, wherein the light emitting sources are arranged with a space therebetween.

19. A method of setting an optical path of light to be outputted from a light emitting source comprising a reflecting member for reflecting light, a light guiding unit arranged on a light reflecting surface of the reflecting member, and light emitting devices for outputting light to the light guiding unit, comprising:

arranging the light emitting devices on the optical axis of the reflecting member, configuring the surface of the light guiding unit to output to the external the light outputted from the light emitting devices and light from the light emitting devices reflected at the reflecting member, configuring the light emitting source such that a first part of the surface of the light guiding unit total reflects the light outputted from the light emitting devices, and a second part of the surface of the light guiding unit total reflects the light and orients the light towards the reflecting member, and defining shapes and a positional relation of the reflecting member, the light guiding unit, and the light emitting devices such that a part of the reflecting member is configured to reflect the light total reflected at the second part of the light irradiation surface of the light guiding unit in a direction gradually away from the optical axis, and orient the light to the periphery of the light guiding unit remote from the optical axis.

20. A method of outputting light to be outputted from a light emitting source comprising a reflecting member for reflecting light, a light guiding unit arranged on the light reflecting surface of the reflecting member, and light emitting devices for outputting light to the light guiding unit, comprising:

arranging the light emitting devices on the optical axis of the reflecting member, configuring a first part of the surface of the light guiding unit to output to the external light outputted from the light emitting devices, configuring the light emitting source such that a second part of the surface of the light guiding unit reflects the light outputted from the light emitting devices, a third part of the surface of the light guiding unit reflects the light from the second part of the surface of the light guiding unit and orients the light towards the reflecting member, and a first part of the reflecting member reflects the light total reflected at the third part of the light irradiation surface of the light guiding unit in a direction gradually having a larger angle away from the optical axis, and orients the light to a periphery of the light guiding unit remote from the optical axis, and defining shapes and a positional relation of the reflecting member, the light guiding unit and the light emitting devices such that a second part of the reflection plate further reflects the light reflected at the third part of the optical waveguide surface and outputs the light externally from the surface of the optical waveguide.

21. An illumination system, comprising:
a light emitting source array in which a plurality of light emitting sources are arranged, and
a power supply unit for supplying power to the light emitting source array, the light emitting source comprising:
  a reflecting member for reflecting light and outputting the light forward,
  a light guiding unit arranged on the side of a light reflecting surface of the reflecting member, and
  light emitting devices for outputting light to the light guiding unit,
  wherein the light irradiation surface of the light guiding unit has a first region that transmits the light emanating from the light emitting devices and outputs the light externally from the light guiding unit, a second region that reflects the light emanating from the light emitting device, orients the light in a direction to the reflecting member, and transmits the light reflected at the reflecting member and outputs the light externally from the light guiding unit, and a third region whose shape is defined so as to reflect with the first region the light that made a predetermined angle with the optical axis and was outputted from the light emitting device, orient the light to the reflecting member, and output the light reflected at the reflecting member to the external of the light guiding unit.

22. A liquid crystal display system, comprising:
a light emitting source array in which a plurality of light emitting sources are arranged, and
a liquid crystal display panel arranged opposite to the light emitting source array, the light emitting source comprising:
  a reflecting member for reflecting light and outputting the light forward,
  a light guiding unit arranged on the side of a light reflecting surface of the reflecting member, and
  light emitting devices for outputting light to the light guiding unit,
  wherein the light irradiation surface of the light guiding unit has a first region that transmits the light emanating from the light emitting devices and outputs the light externally from the light guiding unit, a second region that reflects the light emanating from the light emitting device, orients the light in a direction to the reflecting member, and transmits the light reflected at the reflecting member and outputs the light externally from the light guiding unit, and a third region whose shape is defined so as to reflect with the first region the light that made a predetermined angle with the optical axis and was outputted from the light emitting device, orient the light to the reflecting member, and output the light reflected at the reflecting member externally from the light guiding unit.

* * * * *

UNITED STATES PATENT AND TRADEMARK OFFICE
CERTIFICATE OF CORRECTION

PATENT NO. : 7,399,108 B2
APPLICATION NO. : 11/252518
DATED : July 15, 2008
INVENTOR(S) : Takahiro Ayabe et al.

It is certified that error appears in the above-identified patent and that said Letters Patent is hereby corrected as shown below:

Title Pg, Item (75) Inventors, the third inventor, Kenji Homma's city of residence, "Kyoto" should be --Soraku--.

In the Drawings:

In the Drawings, sheet 1 of 40, figure 1, is incomplete. Please replace the drawing with drawing sheet 1, consisting of Figure 1.

In the Claims:

In Claim 1, column 25, line 13, "tight" should be --light--.

Signed and Sealed this

Twenty-third Day of September, 2008

JON W. DUDAS
*Director of the United States Patent and Trademark Office*